United States Patent
Li et al.

(10) Patent No.: US 10,989,745 B2
(45) Date of Patent: Apr. 27, 2021

(54) POWER METER WITH FIXED SEGMENT INTERACTIVE MENU

(71) Applicant: Honeywell International Inc., Morris Plains, NJ (US)

(72) Inventors: Peilin Li, Morris Plains, NJ (US); Wenbin Zhou, Shanghai (CN); Sven Suetterlin, Mannheim (DE)

(73) Assignee: Honeywell International Inc., Charlotte, NC (US)

( * ) Notice: Subject to any disclaimer, the term of this patent is extended or adjusted under 35 U.S.C. 154(b) by 34 days.

(21) Appl. No.: 16/299,131

(22) Filed: Mar. 11, 2019

(65) Prior Publication Data
US 2020/0292598 A1    Sep. 17, 2020

(51) Int. Cl.
*G01R 22/06* (2006.01)
*G06F 3/0481* (2013.01)
(Continued)

(52) U.S. Cl.
CPC .......... *G01R 22/061* (2013.01); *G01R 1/206* (2013.01); *G01R 1/28* (2013.01); *G01R 21/06* (2013.01);
(Continued)

(58) Field of Classification Search
CPC ...... G01R 35/005; G01R 21/06; G01R 35/04; G01R 1/206; G01R 1/28; G01R 22/061; G06F 3/04817
(Continued)

(56) References Cited

U.S. PATENT DOCUMENTS

| 4,482,862 A | * | 11/1984 | Leehey | G01R 15/185 |
| | | | | 324/117 R |
| 4,796,148 A | * | 1/1989 | Ruta | H02H 3/093 |
| | | | | 361/97 |

(Continued)

FOREIGN PATENT DOCUMENTS

| CN | 206096427 | * | 4/2017 | ............. G01R 35/04 |
| CN | 206096429 U | | 4/2017 | |

OTHER PUBLICATIONS

Yue Tong et al, An accurate continuous calibration system for high voltage current transformer, American Institute Physics, Feb. 23, 2011, 10 pages (Year: 2011).*

(Continued)

*Primary Examiner* — Clayton E. LaBalle
*Assistant Examiner* — Kevin C Butler
(74) *Attorney, Agent, or Firm* — Seager, Tufte & Wickhem, LLP

(57) ABSTRACT

A power meter includes a plurality of terminals for receiving a measure of power consumption of each of one or more phases of power that is delivered to a load and a controller that is operatively coupled to the plurality of terminals. The controller is configured to determine a number of power monitor parameters based on the measure of power consumption of each of one or more phases of power that is delivered to the load. The controller is further configured to operate an interactive menu. The power meter includes a user interface that is configured to display the number of power monitor parameters based on the measure of power consumption of each of one or more phases of power that is delivered to the load and to enable a user to navigate the interactive menu using via one or more screens displayed on the user interface.

20 Claims, 55 Drawing Sheets

(51) Int. Cl.
*G06F 3/0482* (2013.01)
*G01R 35/00* (2006.01)
*G01R 35/04* (2006.01)
*G01R 21/06* (2006.01)
*G01R 1/20* (2006.01)
*G01R 21/133* (2006.01)
*G01R 1/28* (2006.01)

(52) U.S. Cl.
CPC ......... *G01R 21/133* (2013.01); *G01R 35/005* (2013.01); *G01R 35/04* (2013.01); *G06F 3/0482* (2013.01); *G06F 3/04817* (2013.01)

(58) Field of Classification Search
USPC .......................................................... 324/758
See application file for complete search history.

(56) References Cited

U.S. PATENT DOCUMENTS

| | | | | |
|---|---|---|---|---|
| 5,008,525 | A * | 4/1991 | Petronio | G01R 15/247 |
| | | | | 250/205 |
| 5,064,192 | A | 11/1991 | Smith | |
| 6,064,192 | A * | 5/2000 | Redmyer | G01R 15/186 |
| | | | | 324/117 H |
| 7,917,314 | B2 * | 3/2011 | Gilbert | G01D 4/004 |
| | | | | 702/61 |
| 8,260,695 | B1 * | 9/2012 | Rosenberg | G01R 21/133 |
| | | | | 323/220 |
| 8,405,383 | B2 * | 3/2013 | Agrawal | H01R 9/2433 |
| | | | | 324/142 |
| 10,067,168 | B2 * | 9/2018 | Suchoff | G01R 21/133 |
| 2010/0207604 | A1 * | 8/2010 | Bitsch | G01R 21/133 |
| | | | | 324/140 R |
| 2010/0301837 | A1 * | 12/2010 | Higuma | G01R 21/133 |
| | | | | 324/140 R |
| 2011/0267032 | A1 * | 11/2011 | Zhang | G01R 21/133 |
| | | | | 324/107 |
| 2016/0061870 | A1 * | 3/2016 | Vaculik | G01R 21/06 |
| | | | | 702/106 |
| 2017/0090004 | A1 * | 3/2017 | Marshall | G01R 21/133 |
| 2017/0184641 | A1 * | 6/2017 | Cook | G01R 21/133 |
| 2017/0184697 | A1 * | 6/2017 | Kostrba | G01R 21/06 |
| 2017/0187836 | A1 * | 6/2017 | Kostrba | H04L 47/25 |
| 2018/0136258 | A1 * | 5/2018 | Cook | G01R 15/142 |

OTHER PUBLICATIONS

Zhang Zhi et al., An accurate system for onsite calibration of electronic transformers with digital output, American Institute Physics, Jun. 29, 2012, 8 pages (Year: 2012).*
Han-miao Cheng et al, An improved calibration system with phase correction for electronic transformers with digital output, American Institute of Physics, Aug. 27, 2015, 4 pages (Year: 2015).*
Xianyong Xu et al., The field calibration method of electronic current transformer in intelligent substation, 2014 China International Conference on Electricity Distribution, 23-26 2014, 4 pages (Year: 2014).*
Power Indicator PCE-ND30: User's Manual, PCE Instruments 64 pages, https://www.pce-instruments.com/, pages been saved 487 times since between Jul. 4, 2010 and May 13, 2020. (Year: 2010).*
PCE Instruments PCE Instruments, Three Phase Power Meter PCE-ND30 PCE Instruments Specification, pages been saved 487 times since between Jul. 4, 2010 and May 13, 2020, 4 pages (Year: 2010).*
"Acuvim II Series Power Meter: User's Manual," AccuEnergy, 2(3): 305 pages, 2015.
Csanyi, "Basic three-phase power measurements explained," IAEI News Magazine, 9 pages, May 16, 2017.
"3-Phase-Power Meter," PCE Instruments, pp. 216-218, downloaded Feb. 20, 2019.
"Power Indicator PCE-ND30: User's Manual," PCE Instruments, 64 pages, downloaded Feb. 20, 2019.
"Meter of Network Parameters ND10 Type: User's Manual," PCE Instruments, 51 pages, downloaded Feb. 20, 2019.
"Extremely powerful 3-phase energy meter," Quibino, 18 pages, downloaded Feb. 20, 2019.
"Near-field communication," Wikipedia, 15 pages, last edited Feb. 11, 2019.

* cited by examiner

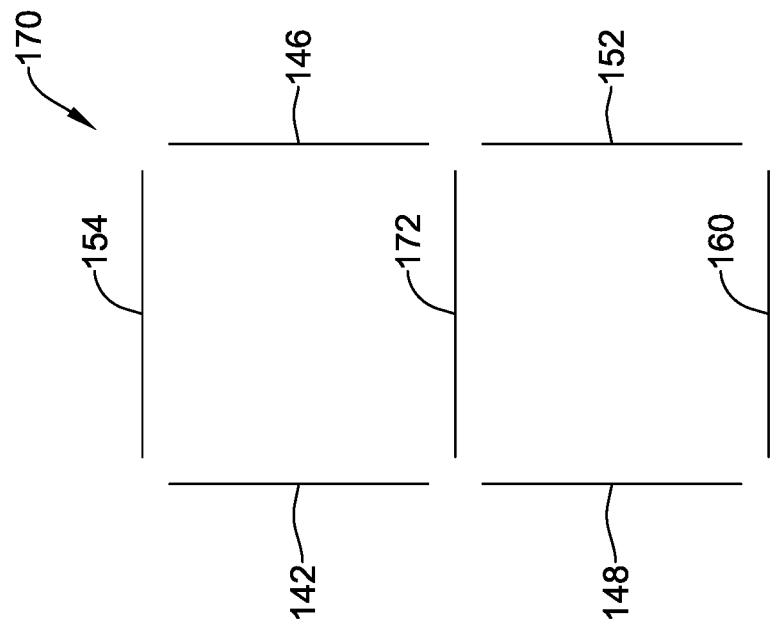
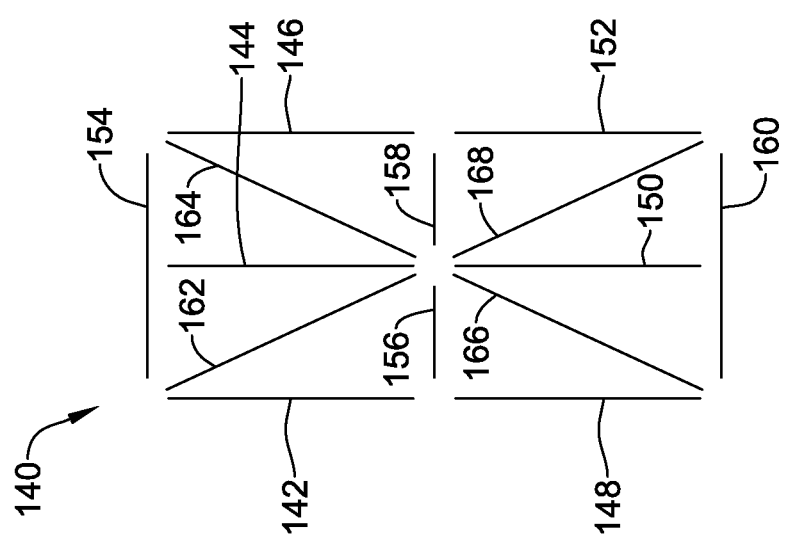

940 ↘

| < | Power Quality | ✱ ⋮ |
|---|---|---|
| Power Failures | | ✓ |
| | No Alarm | |
| Voltage SAG | | ✓ |
| | No Alarm | |
| Voltage SWELL | | ⓘ |
| | 2 Events | ◯ ← 916 |
| Voltage CUT | | ✓ |
| | No Alarm | |
| Voltage Phase 1 | | ✓ |
| MIN 200V | 233.2 V | MAX 245V |
| Voltage Phase 2 | | ⓘ |
| MIN 200V | 250.4 V | MAX 245V |
| Voltage Phase 3 | | ✓ |
| MIN 200V | 230.7 V | MAX 245V |
| Frequency | | ✓ |
| | 60.0 Hz | |

942 points to Voltage SWELL row

FIG. 44

POWER METER WITH FIXED SEGMENT INTERACTIVE MENU

TECHNICAL FIELD

The present disclosure relates generally to power systems and more particularly to power meters used for monitoring power systems.

BACKGROUND

Power systems are used to provide necessary power to a wide variety of building systems such as but not limited to lighting systems, security systems, HVAC systems and general power requirements. In some cases, power meters are used to monitor a power system in order to detect potential problems with the power system. Power meters are also used to measure power consumption for billing purposes. A variety of power meters are known. Improvements in the use and functionality of power meters would be desirable.

SUMMARY

The present disclosure relates generally to power systems and more particularly to power meters used for monitoring power systems. A particular example of the present disclosure may be found in a power meter that includes a plurality of first terminals for receiving a measure of current of each of one or more phases of power that is delivered to a load and a plurality of second terminals for receiving a measure of voltage of each of one or more phases of power that is delivered to the load. The power meter includes a user interface that includes a first region of a display including three or more lines of alphanumeric information, where each of the three or more lines of alphanumeric information of the first region include two or more alphanumeric characters with "M" elongated display segments allocated to each of the two or more alphanumeric characters, a second region of the display including three or more lines of alphanumeric information, where each of the three or more lines of alphanumeric information of the second region include two or more alphanumeric characters with "N" elongated display segments allocated to each of the two or more alphanumeric characters, and wherein M is greater than N, and two or more buttons. A controller is operatively coupled to the plurality of first terminals, the plurality of second terminals, and the user interface and is configured to determine a number of power monitor parameters based on the measure of current of each of one or more phases of power that is delivered to the load and/or the measure of voltage of each of one or more phases of power that is delivered to the load. The controller is further configured to provide an interactive menu including two or more menu screens displayed on the display of the user interface, wherein one or more of the buttons is used to navigate between the two or more menu screens of the interactive menu.

Another example of the present disclosure is a power meter that includes a plurality of terminals for receiving a measure of power consumption of each of one or more phases of power that is delivered to a load and a controller that is operatively coupled to the plurality of terminals. The controller is configured to determine a number of power monitor parameters based on the measure of power consumption of each of one or more phases of power that is delivered to the load. The controller is further configured to operate an interactive menu. The power meter includes a user interface that is configured to display the number of power monitor parameters based on the measure of power consumption of each of one or more phases of power that is delivered to the load and to enable a user to navigate the interactive menu using via one or more screens displayed on the user interface.

Another example of the present disclosure is a non-transient computer readable medium that stores instructions that when executed by a processor of a power meter, causes the power meter to display an interactive menu on a fixed segment display of the power meter, wherein the interactive menu includes two or more menu screens, wherein one of the two or more menu screens provides information on energy usage sensed by the power meter, and another of the two or more menu screens is used to change settings of the power meter. The power meter accepts input from a user via two or more buttons of the power meter to navigate the two or more menu screens of the interactive menu.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which:

FIGS. 8A and 8B show enlarged schematic views of illustrative segmented displays for displaying characters within FIG. 8;

FIGS. 27 through 47 are illustrative screen shots showing screens that may be displayed by a mobile device when using the mobile device to commission one or more power meters.

Figure 1:
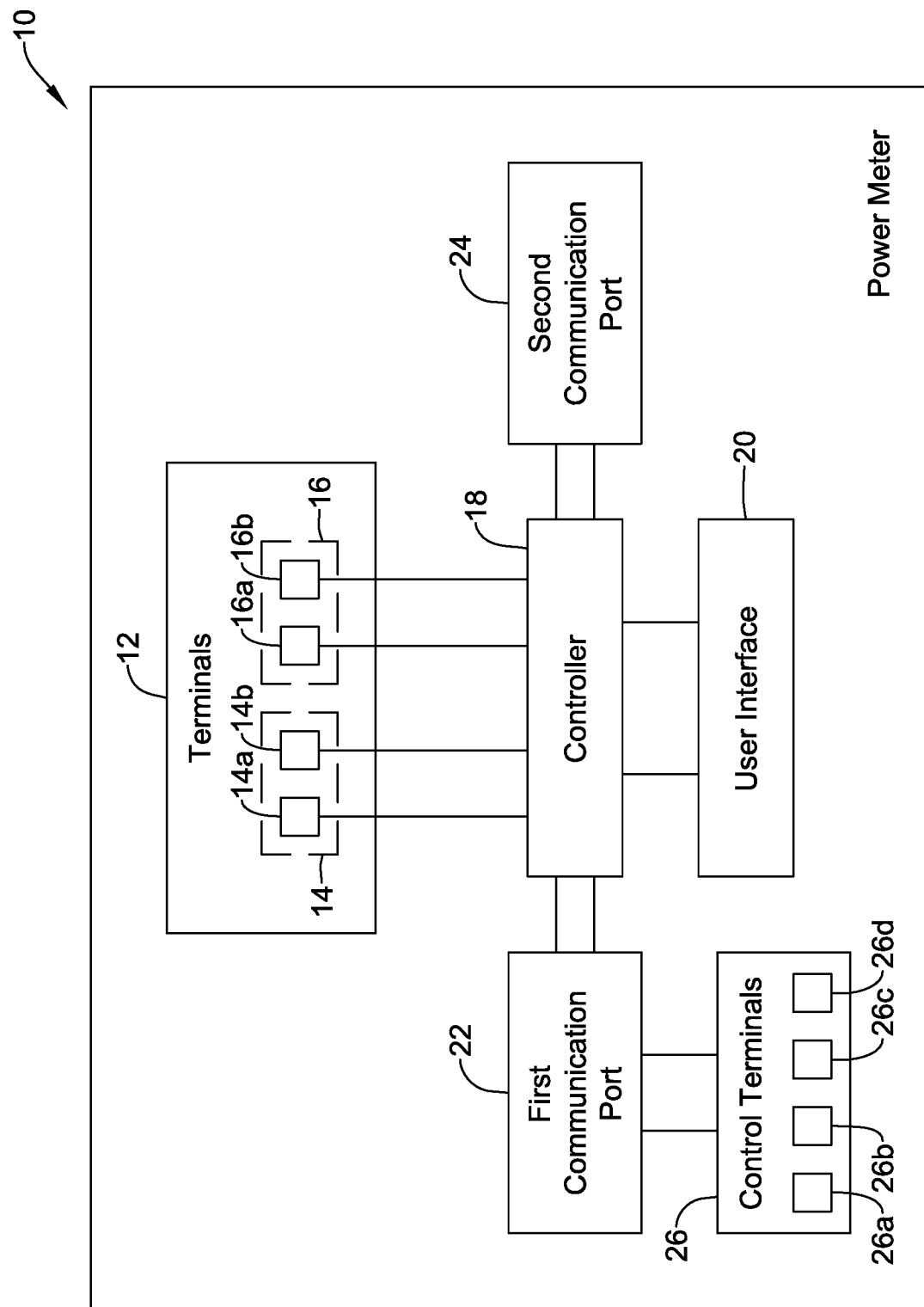
FIG. 1 is a schematic block diagram of an illustrative power meter.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic is described in connection with an embodiment, it is contemplated that the feature, structure, or characteristic may be applied to other embodiments whether or not explicitly described unless clearly stated to the contrary.

The disclosure generally pertains to power meters. Power meters are used to measure and monitor power that is delivered to any number of different power consumption devices, or loads. A power meter may be configured to determine the quantity and quality of the power being delivered to the load, for example. A power meter may be configured to measure the current and voltage being delivered to a load such that a power utility can then bill a customer for the power they have used. In some cases, a power meter may be considered as being a direct power meter, meaning that the power meter is directly spliced into a conductor providing power to the load. In some instances, a power meter may be considered as being an indirect power meter or a CT (current transformer) power meter in which a CT is used to provide an indication of current flowing to a load and a line voltage tap is used to provide an indication of the voltage. It will be appreciated that many of the features discussed herein are equally applicable to direct power meters and to indirect or CT power meters. In some cases, the power meter may provide a measure of power in each of the three phases in a three-phase power line.

FIG. 1 is a schematic block diagram of an illustrative power meter 10. The power meter 10 may represent a direct power meter or an indirect or CT power meter. The illustrative power meter 10 includes a plurality of terminals 12 that may be configured for receiving a measure of power consumption for each of one or more phases of power that is delivered to a load. If the power meter 10 is a direct meter, the plurality of terminals 12 may be configured to accommodate a LINE IN conductor and a LINE out conductor, with the power meter 10 disposed therebetween. If the power meter 10 is an indirect meter, the plurality of terminals 12 may be configured to accommodate a wire or cable providing a measure of voltage as well as wires or cables extending from a current transformer (CT) or the like that provides a measure of current passing to the load.

In some cases, as will be discussed, the plurality of terminals 12 may be considered as being divided into a one or more first terminals 14 and a one or more second terminals 16. While the one or more first terminals 14 is shown as including a terminal 14a and a terminal 14b, and the one or more second terminals 16 is shown as including a terminal 16a and a terminal 16b, it will be appreciated that this is merely illustrative. In some cases, the one or more first terminals 14 may only include one terminal, or may include three, four or more terminals. Similarly, the one or more second terminals 16 may include only one terminal, or may include three, four or more terminals. In some cases, when the power meter 10 is an indirect or CT power meter, the plurality of first terminals 14 may be configured for receiving a measure of current of each of one or more phases of power that is delivered to the load and the plurality of second terminals 16 may be configured for receiving a measure of voltage of each of the one or more phases of power that is delivered to the load.

A controller 18 may be operably coupled to the plurality of terminals 12 and may for example be configured to determine a number of power monitor parameters based on the measure of power consumption for each of one or more phases of power that is delivered to the load. A user interface 20 is operably coupled to the controller 18 and is configured to display at least some of the number of power monitor parameters that may be determined by the controller 18. The illustrative power meter 10 also includes a first communication port 22 that is operably coupled to the controller 18 and is configured to communication with an external device (not seen in FIG. 10) and a second communication port 24 that is operably coupled to the controller 18 and is configured to communicate with one or more other power meters.

In some cases, the first communication port 22 may be operably coupled with a plurality of control terminals 26. While a total of four control terminals 26a, 26b, 26c and 26d are shown, it will be appreciated that there may be only two or three control terminals 26. In some instances, there may be five, six, seven, eight or more control terminals 26. The control terminals 26 are configured to accommodate a plurality of control wires that allow the controller 18 to communicate with an external device (shown in FIG. 3). In some cases, the control terminals 26 may accommodate an Ethernet connection. In some instances, the control terminals 26 may instead be accomplished using a wireless protocol. In some instances, the second communication port 24 includes a wireless communication protocol for communicating with other power meters. For example, the wireless communication protocol may be Bluetooth Low Energy (BLE), Zigbee, and/or WiFi, although other wireless protocols are also contemplated.

As will be discussed in greater detail with respect to FIG. 3, the power meter 10 may be configured to be selectively used as a master power meter or as a slave power meter. In some cases, the terms master and slave may simply refer to how each power meter communicates with each other, rather than a leader and subordinate situation. For example, when the power meter 10 is selected to function as a master power meter, the controller 18 may be configured to use the first communication port 22 and the second communication port 24. When the power meter 10 is selected to function as a slave power meter, the controller 18 may be configured to use the second communication port 24 but not use the first communication port 22. As another example, when the power meter 10 is selected to function as a master power meter, the controller 18 may be configured to use the first communication port 22 to communicate with the external device and to use the second communication port 24 to communicate with one or more slave power meters. When the power meter 10 is selected to function as a slave power meter, the controller 18 may be configured to use the second communication port 24 to communicate with another power meter that is selected to function as a master power meter.

Figure 2:
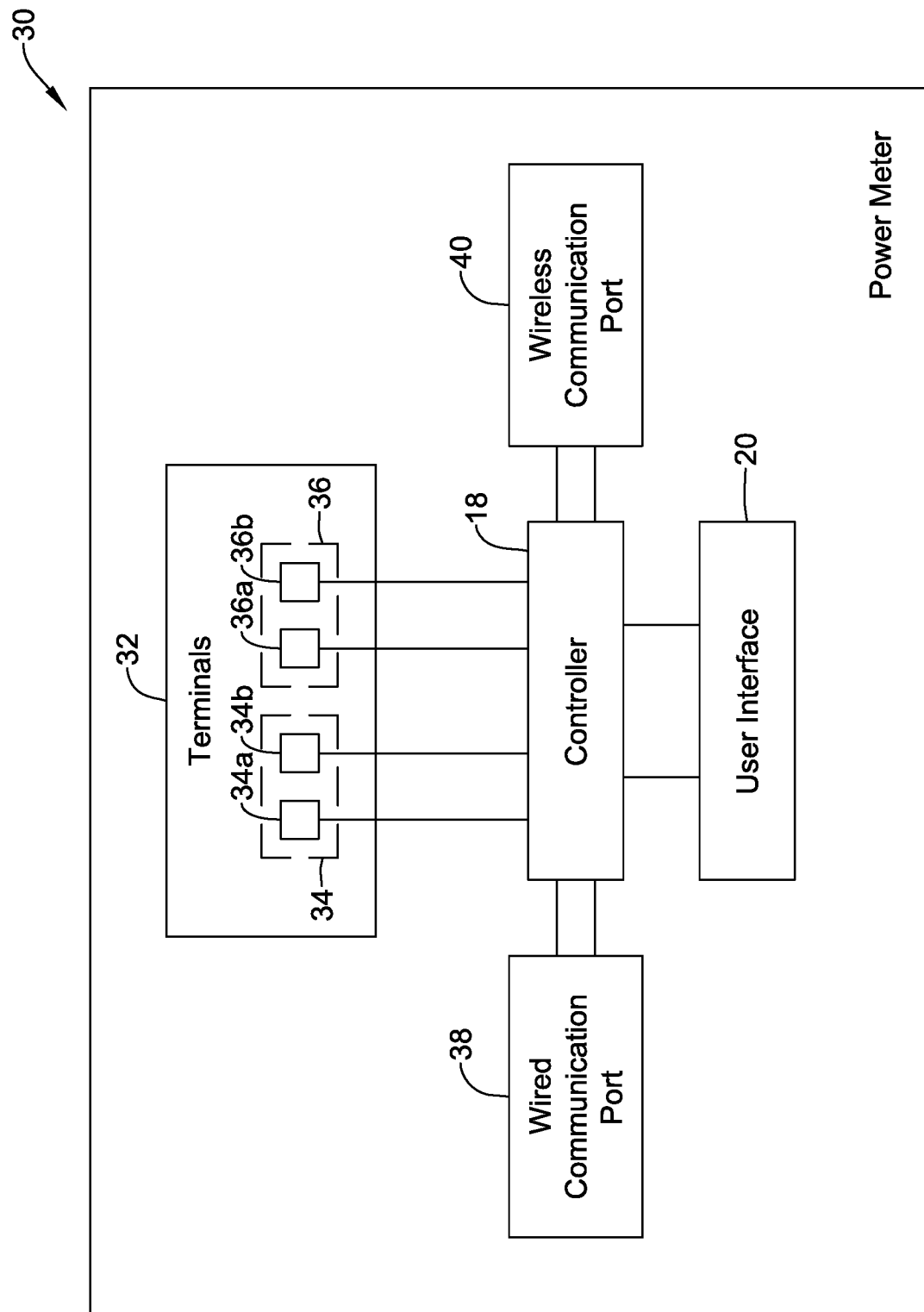
FIG. 2 is a schematic block diagram of an illustrative power meter.

FIG. 2 is a schematic block diagram of an illustrative power meter 30. The illustrative power meter 30 includes a plurality of terminals 32 that may be considered as including one or more first terminals 34 for receiving a measure of current of each of one or more phases of power that is delivered to a load as well as one or more second terminals 36 for receiving a measure of voltage of each of one or more phases of power that is delivered to the load. As illustrated, the one or more first terminals 34 includes a terminal 34a and a terminal 34b and the one or more second terminals 36 include a terminal 36a and a terminal 36b. In some cases, the one or more first terminals 34 may include only one terminal, or may include three, four or more terminals and the one or more second terminals 36 may include only one terminal, or may include three, four or more terminals.

The controller 18 is operatively coupled to the one or more first terminals 34 and the one or more second terminals 36 and is configured to determine a number of power monitor parameters based on the measure of current of each of the one or more phases of power that is delivered to the load and/or the measure of voltage of each of the one or more phases of power that is delivered to the load. A wired communication port 38 may be operably coupled to the controller 18. A wireless communication port 40 may also be operably coupled to the controller 18. In some cases, the controller 18 may be configured to communicate with an external wiring bus (shown in FIG. 3) via the wired communication port 38. The controller 18 may be configured to communicate with one or more other power meters via the wireless communication port 40, for example. In some cases, the power meter 30 may be configured to receive configuration and/or calibration information via the wireless communication port 40. The power meter 30 may be configured to receive configuration and/or calibration information from a master power meter, for example. The power meter 30 may be configured to receive configuration and/or calibration information from an application running on a mobile device.

In some cases, the power meter 30, much like the power meter 10, may be configured to be selectively used as either a master power meter or as a slave power meter. When the power meter 30 is selected to function as a master power meter, the controller 18 may be configured to use the wired communication port 38 to communicate with the external wiring bus and to use the wireless communication port 40 to communicate with one or more slave power meters. When the power meter 30 is selected to function as a slave power meter, the controller 18 may be configured to use the wireless communication port 40 to communicate with another power meter that is selected to function as a master power meter.

As another example, when the power meter 30 is selected to function as a master power meter, the power meter 30 may receive instructions from an external device operably coupled to the external wiring bus and may forward at least some of the instructions to one or more slave power meters. The power meter 30 may receive operating parameters from the one or more slave power meters and may forward the operating parameters to the external device. When the power meter 30 is selected to function as a slave power meter, the power meter 30 may receive instructions from a master power meter via the wireless communication port 40 and may transmit one or more of the power monitor parameters determined by the power meter 30 to the master power meter via the wireless communication port.

Figure 3:
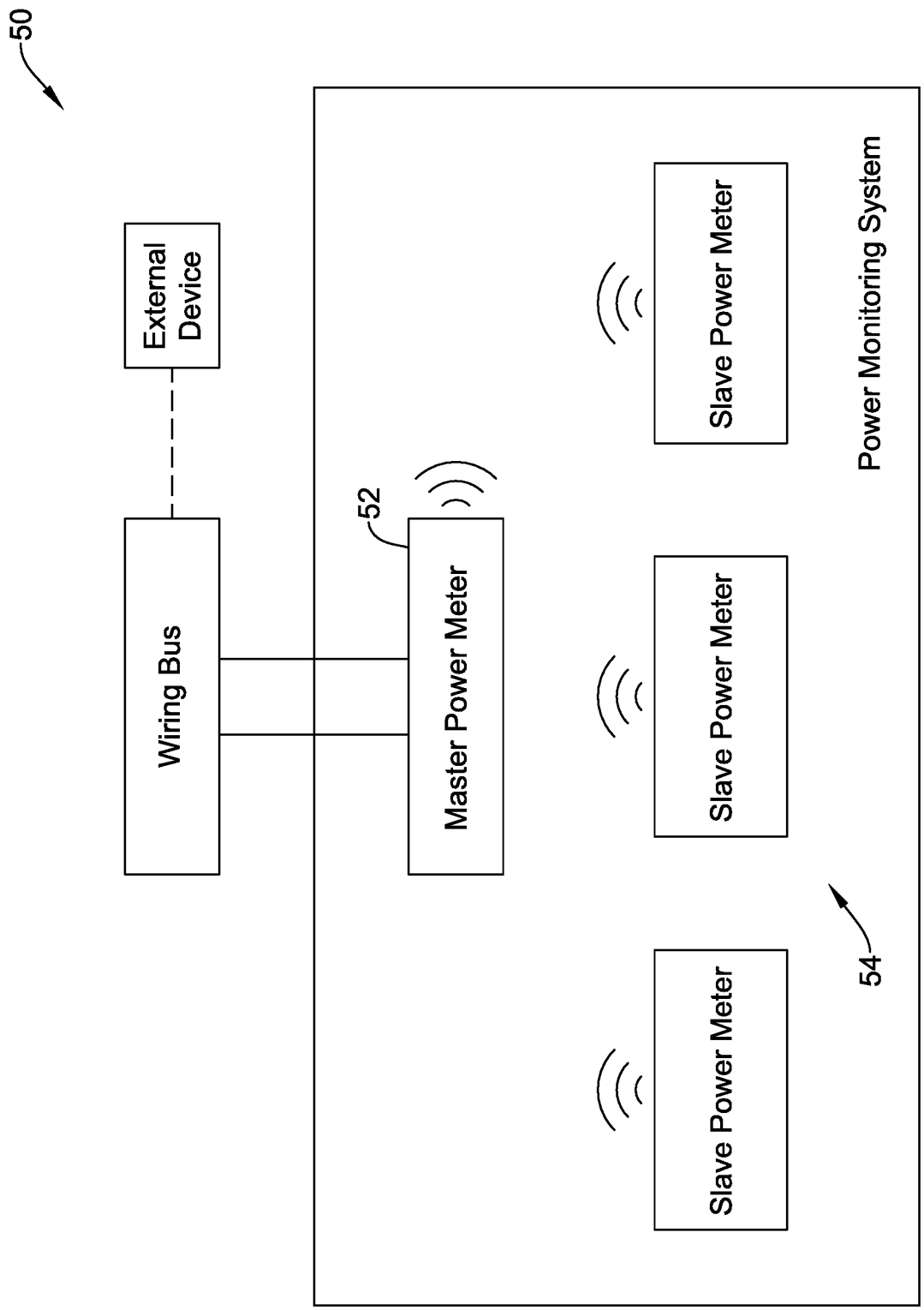
FIG. 3 is a schematic block diagram of an illustrative power monitoring system including the illustrative power meters such as those shown in FIG. 1 and FIG. 2.

FIG. 3 is a block diagram showing an illustrative power monitoring system 50. The power monitoring system 50 includes a master power meter 52 which may represent either the power meter 10 or the power meter 30 being utilized as a master power meter. The power monitoring system 50 includes a plurality of slave power meters 54 which may each represent either the power meter 10 or the power meter 30 being utilized as a master power meter. As illustrated, the plurality of slave power meters 54 includes a slave power meter 54a, a slave power meter 54b and a slave power meter 54c. This is merely illustrative, as in some cases, there may be a single slave power meter 54, or four, five, ten, twenty, fifty or more slave power meters 54. It will be appreciated that as shown in FIGS. 1 and 2, the master power meter 52 may include the first communication port 22 and the second communication port 24, and each of the slave power meters 54 may include a communication port (or may include both the first communication port 22 and the second communication port 24). In some cases, the first communication port 22 of the master power meter 52 may be a wired port (such as the wired communication port 38 of FIG. 2) and the second communication port 24 of the master power meter 52 may be a wireless port (such as the wireless communication port 40 of FIG. 2). In some cases, the communication port of each of the slave power meters 54 may include a wireless port, and at least some of the slave power meters 54 may include a wired port that is not used while the slave power meters 54 are functioning as slave power meters.

Figure 4:
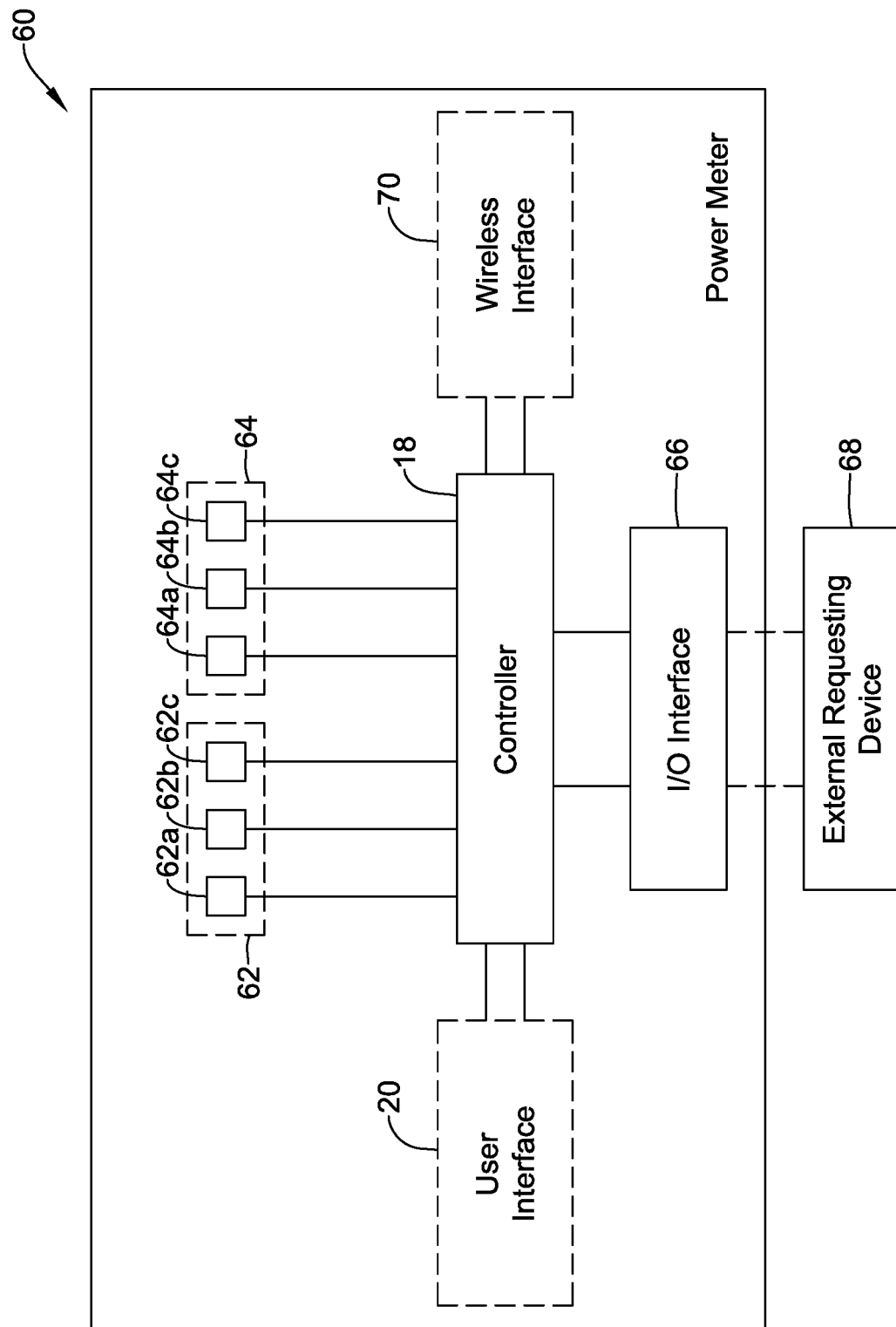
FIG. 4 is a schematic block diagram of an illustrative power meter.

FIG. 4 is a schematic block diagram of an illustrative power meter 60. The power meter 60 includes a plurality of first terminals 62 for receiving a measure of current of each of one or more phases of power that is delivered to a load as well as a plurality of second terminals 64 for receiving a measure of voltage of each of one or more phases of power that is delivered to the load. As illustrated, the plurality of first terminals 62 includes a terminal 62a, a terminal 62b and a terminal 62c and the plurality of second terminals 64 includes a terminal 64a, a terminal 64b and a terminal 64c. This is merely illustrative, as in some cases the plurality of first terminals 62 and/or the plurality of second terminals 64 may include only two terminals, or may include four, five, six or more terminals. The power meter 60 includes an I/O interface 66 that is operably coupled to the plurality of first terminals 62, the plurality of second terminals 64 and to the I/O interface 66.

The controller 18 may be configured to determine a number of power monitor parameters based on the measure of current of each of one or more phases of power that is delivered to the load and/or the measure of voltage of each of one or more phases of power that is delivered to the load and to receive one or more power monitor parameters requests from an external requesting device 68 via the I/O interface 66. In some cases, each of the one or more power monitor parameter requests includes an expected address for a requested for one of the one or more power monitor parameters. The controller 18 may store a mapping between one or more of the power monitor parameters and one or more of the expected addresses (e.g. addressable storage locations) of the external requesting device, and to transmit the requested one of the one or more power monitor parameters to the external requesting device 68 via the I/O interface 66 using the stored mapping. In some cases, the controller 18 may be configured to allow a user to change the stored mapping between one or more of the power monitor parameters and one or more expected addresses in order to accommodate a different external requesting device. For example, the external requesting device may expect the measured current in phase 1 to be stored in a register number 25, and the voltage of phase 1 to be stored in a register number 30. A different external requesting device may expect the measured current in phase 1 to be stored in a register number 4, and the voltage of phase 1 to be stored in a register number 25. It is contemplated that the mapping may be changed to match either external requesting device. This may allow the power meter to replace various power meters that are used in conjunction with a wide variety of different external requesting devices.

The power meter 60 may, for example, also include the user interface 20. The controller 18 may be configured to display one or more of the determined parameters on the user interface 20. In some cases, the user may be allowed to change the stored mapping via the user interface 20 of the power meter 60. For example, a menu of different external device protocols may be provided, and the user may select the appropriate external device protocol. In response, the power meter 60 may load and use the corresponding mapping. The power meter 60 may include a wireless interface 70 that can communicate with a mobile device (not shown) that has a mobile device user interface. In some cases, the user may be allowed to change the stored mapping using the user interface of the mobile device. In some cases, the stored mapping may be included in a configuration file, and the user may be allowed to change the stored mapping by providing an updated configuration file. For example, the updated configuration file may be uploaded to the controller 18.

In some cases, the one or more expected addresses of the external requesting device reference addressable register locations of the controller 18, and wherein the mapping maps each of one or more of the power monitor parameters to a corresponding one of the addressable register locations. In some instances, the expected address may reference one or more addressable registers, or one or more byte positions. These are just examples.

In some cases, the controller 18 may be configured to use the I/O interface 66 to communicate one or more of the power monitor parameters over a network using a configurable mapping that maps the power monitor parameters with corresponding addressable locations. The configurable mapping can be changed to emulate each of two or more different power meters. For example, when the configurable mapping is defined by a configuration file, a first configuration file may be used to emulate a first power meter and a second different configuration file may be used to emulate a second power meter. In some cases, the first power meter may be of a first brand and the second power meter may be of a different brand. In some cases, the I/O interface 66 is an M-BUS interface, and the addressable locations correspond to addressable byte positions.

Figure 5:
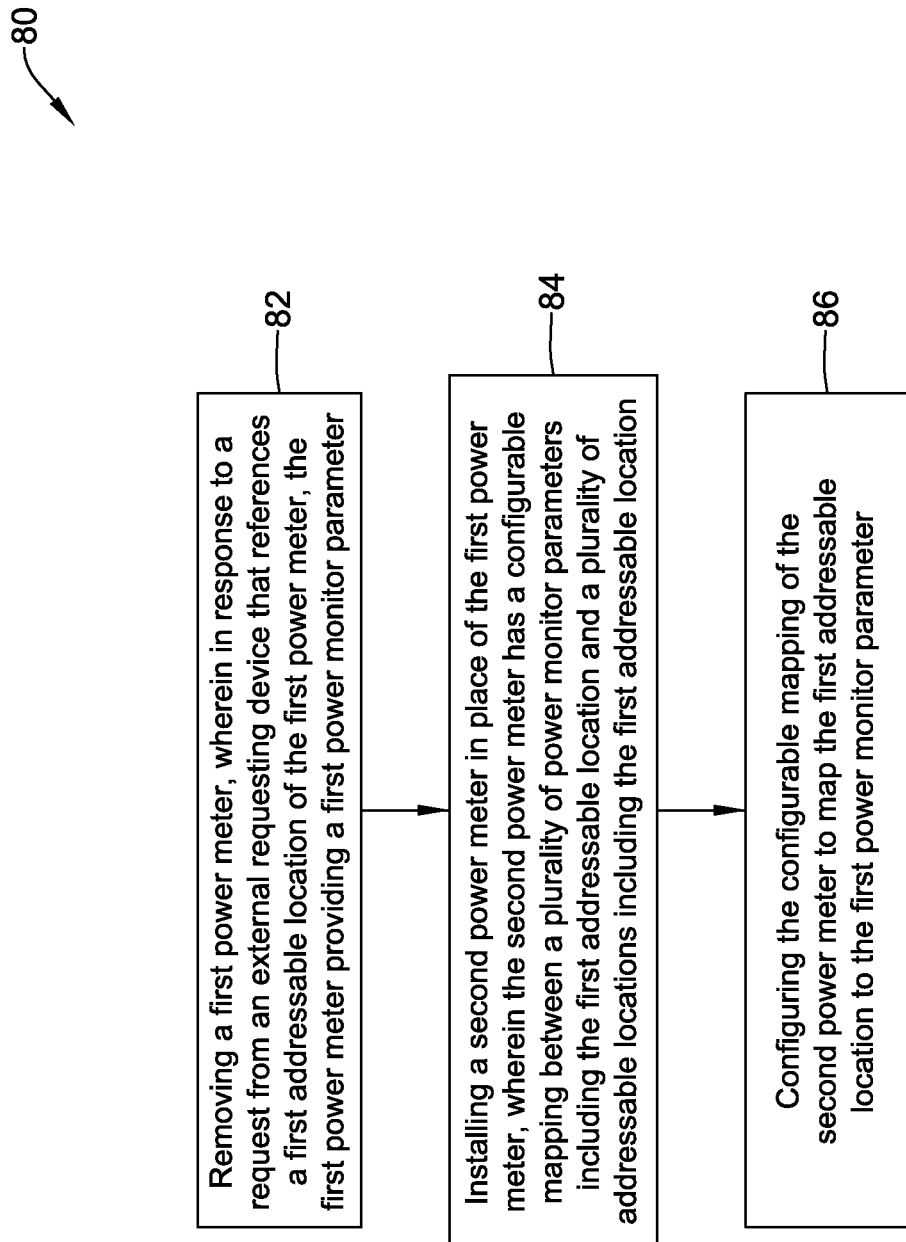
FIG. 5 is a flow diagram showing an illustrative method of replacing a first power meter with a second power meter.

FIG. 5 is a flow diagram showing an illustrative method of replacing a first power meter with a second power meter. As indicated at block 82, the first power meter may be removed. In response to a request from an external requesting device that references a first addressable location of the first power meter, the first power meter may provide a first power monitor parameter. For example, the first power meter may receive the request from the external requesting device across an M-BUS, and the first addressable location may correspond to an addressable byte position. As indicated at block 84, a second power meter may be installed in place of the first power meter, wherein the second power meter has a configurable mapping between a plurality of power monitor parameters including the first addressable location and a plurality of addressable locations including the first addressable location. As noted at block 86, the configurable mapping of the second power meter may be configured to map the first addressable location to the first power monitor parameter. In some cases, configuring the configurable mapping includes downloading a configuration file to the second power meter. The configuration file may be downloaded from a mobile device via a wireless interface, for example. In some cases, the second power meter may be configured to emulate the first power meter from a perspective of the requesting device.

Figure 6:
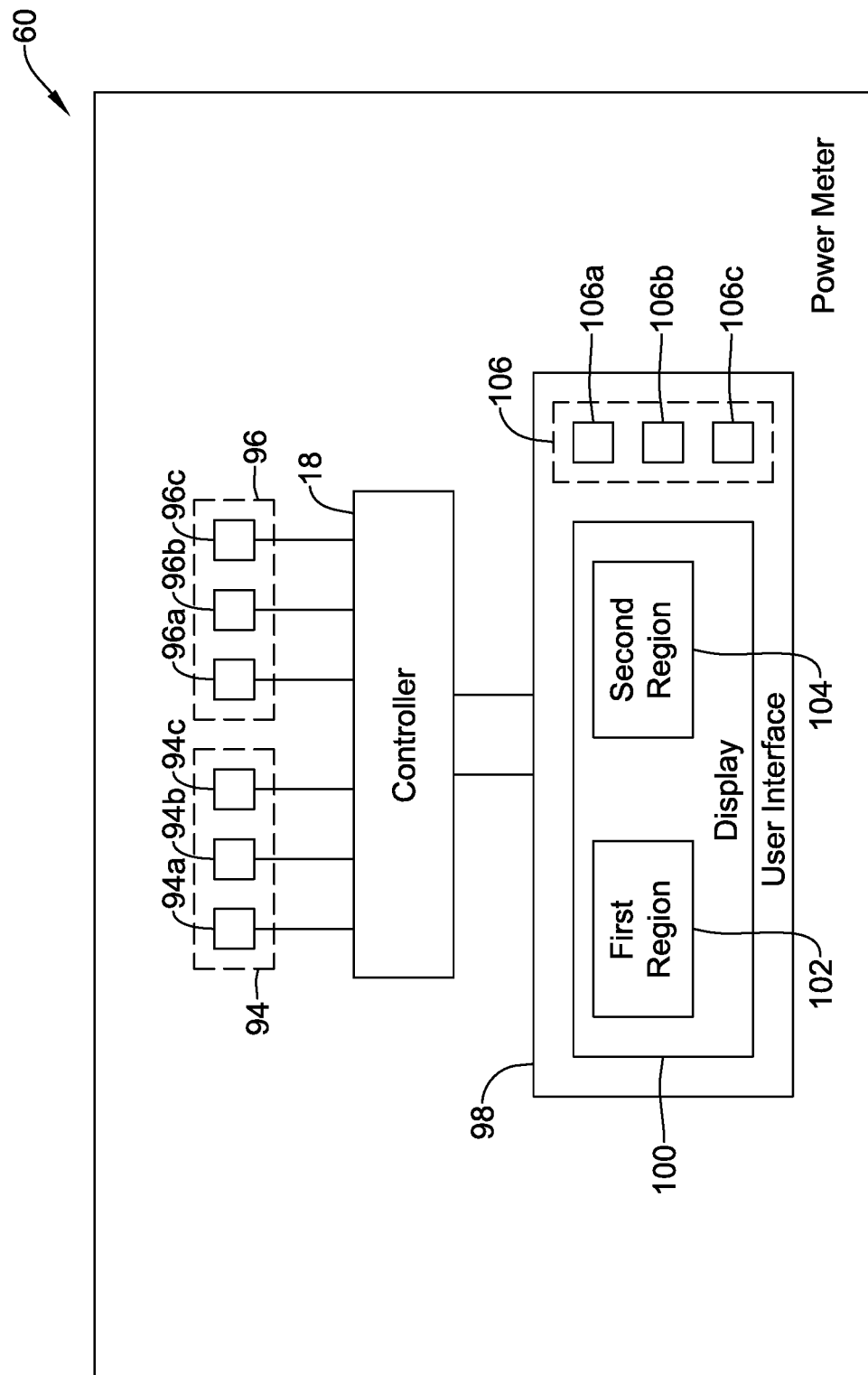
FIG. 6 is a schematic block diagram of an illustrative power meter.

FIG. 6 is a schematic block diagram of an illustrative power meter 90. The power meter 90 includes a plurality of terminals 92 that may be configured for receiving a measure of power consumption for each of one or more phases of power that is delivered to a load. If the power meter 90 is a direct meter, the plurality of terminals 92 may be configured to accommodate a LINE IN conductor and a LINE out conductor, with the power meter 90 disposed therebetween. If the power meter 90 is an indirect meter, the plurality of terminals 92 may be configured to accommodate a wire or cable providing a measure of voltage as well as wires or cables extending from a current transformer (CT) that provides a measure of current passing to the load.

In some cases, as will be discussed, the plurality of terminals 92 may be considered as being divided into a plurality of first terminals 94 and a plurality of second terminals 96. While the plurality of first terminals 94 is shown as including a terminal 94a, a terminal 94b and a terminal 96c and the plurality of second terminals 96 is shown as including a terminal 96a, 96b and 96c, it will be appreciated that this is merely illustrative. In some cases, the plurality of first terminals 94 may only include one terminal or two terminals, or may include four or more terminals. Similarly, the plurality of second terminals 96 may include only one terminal or two terminals, or may include four or more terminals.

In some cases, if the power meter 90 is a direct power meter, the plurality of first terminals 94 may be configured to receive a line input for each of the one or more phases of power and the plurality of second terminals 96 may be configured to receive a line output for each of the one or more phases of power. In some cases, when the power meter 90 is an indirect or CT power meter, the plurality of first terminals 94 may be configured for receiving a measure of current of each of one or more phases of power that is delivered to the load and the plurality of second terminals 96 may be configured for receiving a measure of voltage of each of the one or more phases of power that is delivered to the load.

The power meter 90 includes a user interface 98. In some instances, the user interface 98 includes a fixed segment display 100 that includes a first region 102 and a second region 104. The user interface 98 also includes a plurality of buttons 106. As illustrated, the plurality of buttons 106 includes a button 106a, a button 106b and a button 106c. In some cases, there may be fewer buttons 106, or more buttons 106. For example, there may be two or more buttons 106. In some cases, the user interface 98 may include a fixed segment display that is configured to display screens dictated by an interactive menu and the buttons 106 include an UP button, a DOWN button and a SET button that a user may use to navigate the interactive menu. In some cases, the user interface 98 includes a fixed segment display that is configured to display at least three lines of alphanumeric information, wherein each of the at least three lines of alphanumeric information include a first portion (such as the first region 102 of the display 100) that is configured for displaying letters and numbers and a second portion (such as the second region 104 of the display 100) that is configured for displaying numbers.

The first region 102 of the display 100 may be configured to display three or more lines of alphanumeric information, where each of the three or more lines of alphanumeric information of the first region include two or more alphanumeric characters with "M" elongated display segments allocated to each of the two or more alphanumeric characters. The second region 104 of the display 100 may be configured to display three or more lines of alphanumeric information, where each of the three or more lines of alphanumeric information of the second region include two or more alphanumeric characters with "N" elongated display segments allocated to each of the two or more alphanumeric characters, and wherein M is greater than N. As an illustrative but non-limiting example, M may be equal to 14 and N may be equal to 7.

The controller 18 is operably coupled to the plurality of first terminals 94, the plurality of second terminals 96, and the user interface 98. The controller 18 may be configured to determine a number of power monitor parameters based on the measure of current of each of one or more phases of power that is delivered to the load and/or the measure of voltage of each of one or more phases of power that is delivered to the load. The controller 18 may be configured to provide an interactive menu including two or more menu screens displayed on the display 100 of the user interface 98, wherein one or more of the buttons 106 may be used to navigate between the two or more menu screens of the interactive menu. At least one of the buttons 106 may, for example, be used to select between two or more selections that are displayed on one or more of the menu screens. In some cases, at least one of the buttons 106 may be used to change a value of a setting that is displayed on one or more of the menu screens. At least some of the buttons 106 may be touch regions on the display 100. In some cases, the buttons 106 may be adjacent to the display 100. In some cases, the buttons 106 may include an up button, a down button and a set button.

In some cases, the first region 102 of the display 100 may be configured to more optimally display letters while the second region 104 of the display 100 may be configured to display numbers. For example, the first region 102 of the display 100 may be configured for displaying two or more lines of alphanumeric information (or three or more lines or four or more lines), where each of the two or more lines of alphanumeric information include two or more character positions with each character position including a plurality of elongated display segments arranged substantially horizontally and vertically, and a plurality of elongated display segments arranged at angles other than substantially horizontally and vertically. The second region 104 of the display 100 may be configured for displaying two or more lines of alphanumeric information, where each of the two or more lines of alphanumeric information include two or more character positions where each character position includes a plurality of elongated display segments arranged substantially horizontally and vertically but free from elongated display segments arranged at angles other than substantially horizontally and vertically.

Each alphanumeric character of the three or more lines of alphanumeric information of the first region 102 may be allocated "M" elongated display segments plus a decimal point segment on the display while each alphanumeric character of the three or more lines of alphanumeric information of the second region may be allocated "N" elongated display segments plus a decimal point segment on the display. In some instances, each of the three or more lines of alphanumeric information of the first region includes less alphanumeric characters than each of the three or more lines of the second region. Each of the three or more lines of alphanumeric information of the first region may include seven or less alphanumeric characters and each of the three or more lines of alphanumeric information of the second region may include eight or more alphanumeric characters.

In some cases, the user interface 98 may further include one or more fixed segment icons at a predefined location on the display 100. For example, the one or more fixed segment icons may include two or more menu selection icons spaced horizontally from one another. The one or more fixed segment icons may include two or more measurement unit icons that are adjacent to each of the two (or three) or more lines of the second region 104. A selection icon may be adjacent to each of two or more lines of the first region. In some cases, there may be an L1 icon adjacent a first one of the three or more lines of the first region 102, an L2 icon adjacent a second one of the three or more lines of the first region 102, and an L3 icon adjacent a third one of the three or more lines of the first region 102.

Figure 7:
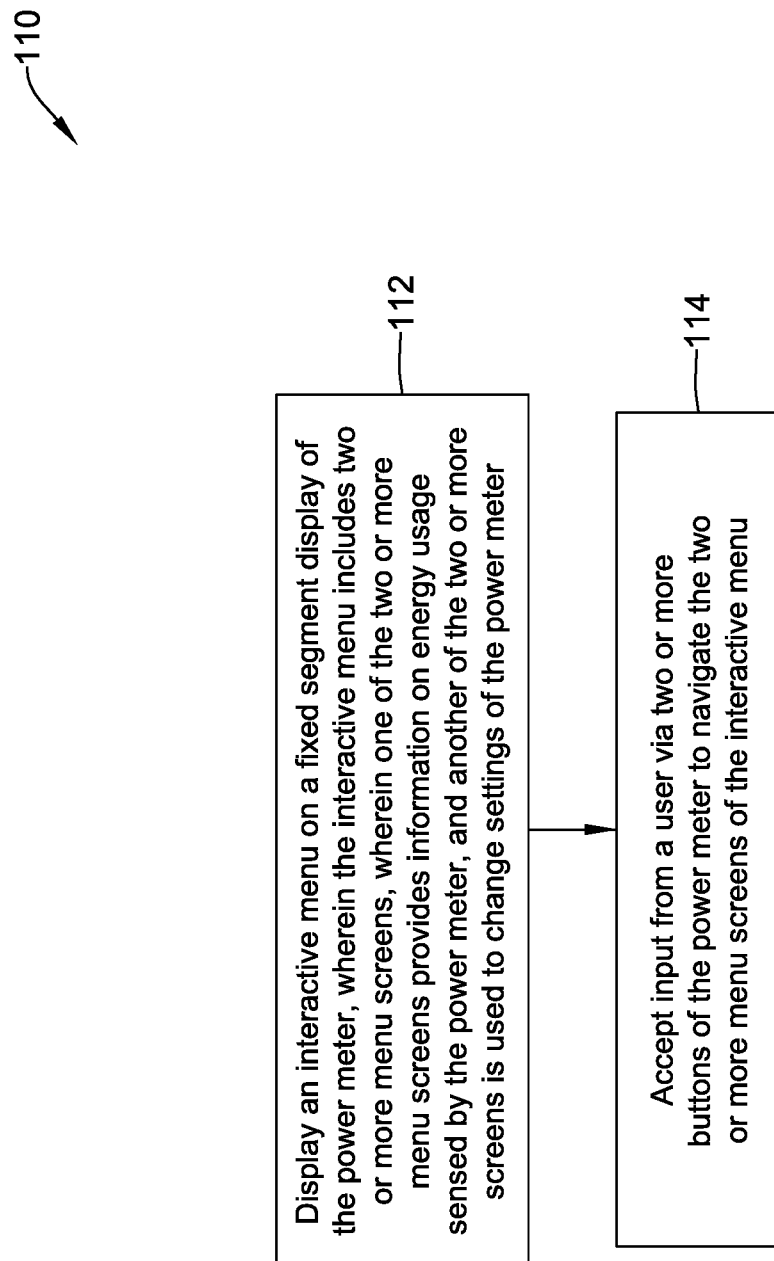
FIG. 7 is a flow diagram showing an illustrative method.

FIG. 7 is a flow diagram showing an illustrative method 110. As indicated at block 112, an interactive menu may be displayed on a fixed segment display of the power meter, wherein the interactive menu includes two or more menu screens, wherein one of the two or more menu screens provides information on energy usage sensed by the power meter, and another of the two or more menu screens is used to change settings of the power meter. As indicated at block 114, input may be accepted from a user via two or more buttons of the power meter to navigate the two or more menu screens of the interactive menu.

Figure 8:
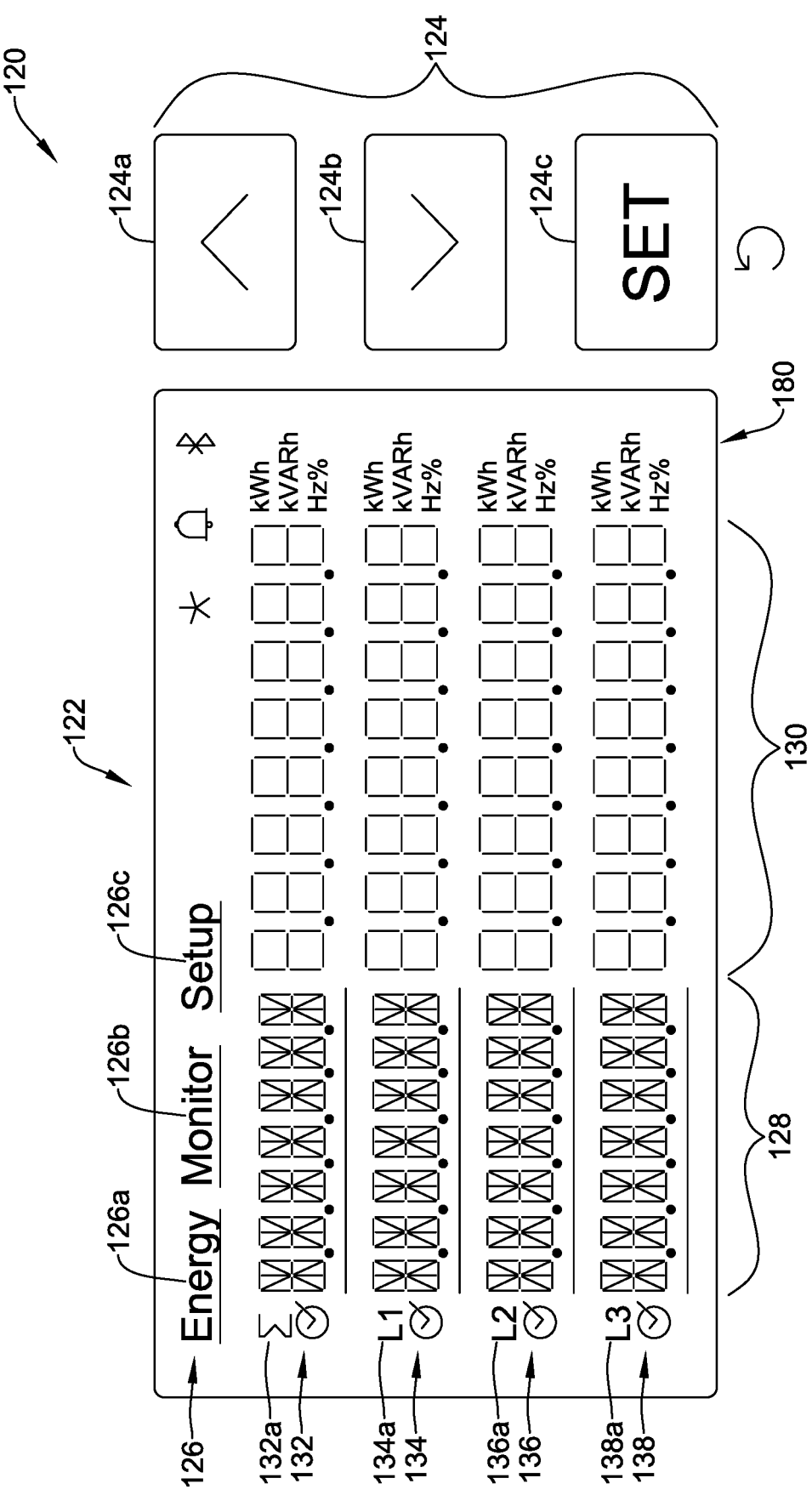
FIG. 8 is a view of an illustrative user interface that includes a display that may be part of any of the illustrative power meters described in FIGS. 1, 2, 4 and 6.

FIG. 8 may be considered as being an example of the user interface 98 shown in FIG. 6. FIG. 8 provides an example of the fixed segments that may be included within the fixed segment display 100, with all of the fixed segments illuminated. In some cases, it will be appreciated that the display 100 may instead show white segments on a black background, but this is not required in all cases. FIG. 8 shows a user interface 120 that includes a display portion 122 and a button portion 124. In some cases, the button portion 124 is part of the display, such as a touch sensitive region of the display. In other cases, the button portion 124 is separate from the display. As illustrated, the display portion 122 accommodates four lines of information including alphanumeric characters as well as special characters.

The display 122 includes an upper menu bar 126 including an ENERGY icon 126*a*, a MONITOR icon 126*b* and a SETUP icon 126*c*. As will be appreciated, each of these upper menu bar items may cause the controller 18 to display additional screens using the available fixed segments that allow a user to drill down. The display 122 includes a first region 128 that corresponds to the first region 102 of FIG. 6 and a second region 130 that corresponds to the second region 104 of FIG. 6. As shown, the first region 128 includes a total of seven character spaces that are separated by decimals, while the second region 130 includes a total of eight character spaces that are separated by decimals. The first region 128 may be considered as being designed for displaying both numbers and letters while the second region 130 may be considered as being designed for displaying numbers. Accordingly, each character space within the first region 128 may include a plurality of elongated display segments arranged substantially horizontally and vertically, and a plurality of elongated display segments arranged at angles other than substantially horizontally and vertically while each character space within the second region 130 may include a plurality of elongated display segments arranged substantially horizontally and vertically but free from elongated display segments arranged at angles other than substantially horizontally and vertically.

FIG. 8A provides an enlarged but somewhat schematic view of a character space within the first region 128 and FIG. 8B provides an enlarged but somewhat schematic view of a character space within the second region 130. It will be appreciated that the elongated display segments shown in FIGS. 8A and 8B may vary in segment thickness, segment length, whether ends of each segment are square or angles, etc. As can be seen in FIG. 8A, a character space 140 includes a total of fourteen elongated display segments. In particular, the character space 140 includes a total of six vertical (in the illustrated orientation) elongated display segments labeled 142, 144, 146, 148, 150 and 152, a total of four horizontal (in the illustrated orientation) elongated display segments labeled 154, 156, 158 and 160, and a total of four elongated display segments that are arranged at an angle relative to the other elongated display segments. The angled elongated display segments are labeled 162, 164, 166 and 168. The character space 140 may be considered as being optimized for displaying either letters or characters. In FIG. 8B, a character space 170 includes a total of seven elongated display segments. In particular, the character space 170 includes the vertical elongated display segments 142, 146, 148 and 152 and the horizontal elongated display segments 154 and 160. The character space 170 also includes a horizontal elongated display segment 172 (as compared to the character space 140, which includes a pair of horizontal elongated display segments 156 and 158 at the middle of the character space 140).

Returning to FIG. 8, the user interface 120 may include a first line 132 that includes a summation icon 132*a*, a second line 134 that includes an L1 icon 134*a*, a third line 136 that includes an L2 icon 136*a* and a fourth line 138 that includes an L3 icon 138. These icons may be selectively illuminated to indicate which line of the display corresponds to which power phase (L1, L2 and L3). As can be seen, the button portion 124 may include an up button 124*a*, a down button 124*b* and a set button 124*c*. The user interface 120 also includes a column of labels 180 that provide identification for the data displayable within the second region 130.

Figure 9:
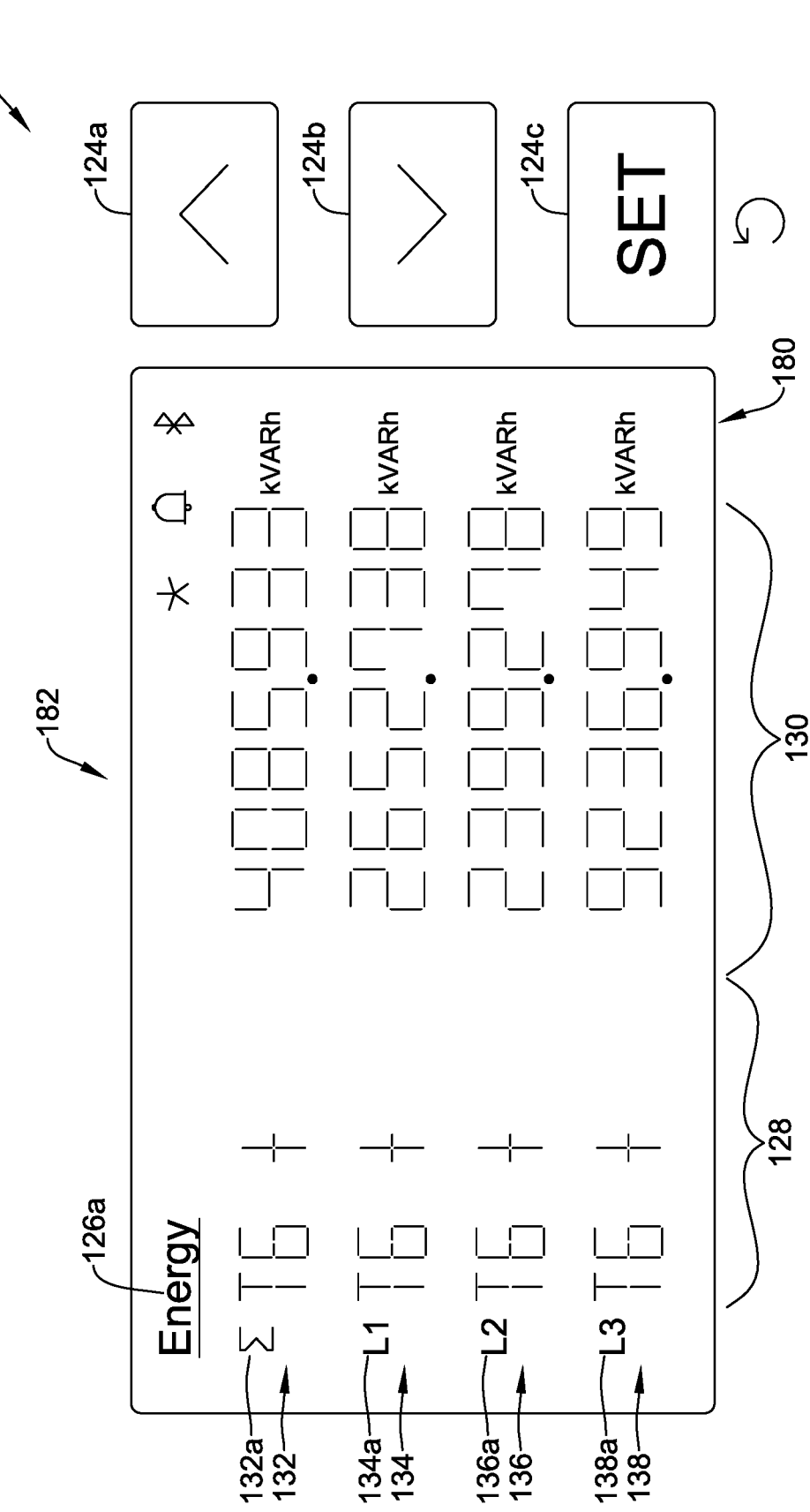
FIG. 9 is an illustrative screen capture that may be shown on the illustrative display of FIG. 8.

FIG. 9 provides an example of an illustrative screen 182 that may be displayed by the controller 18 on the user interface 120. This particular screen is within the energy menu, as indicated by the ENERGY icon 126*a* being illuminated. As can be seen, the first line 132 shows a total energy value obtained by summing the values for each of the three phases denoted by L1, L2 and L3.

Figure 10:
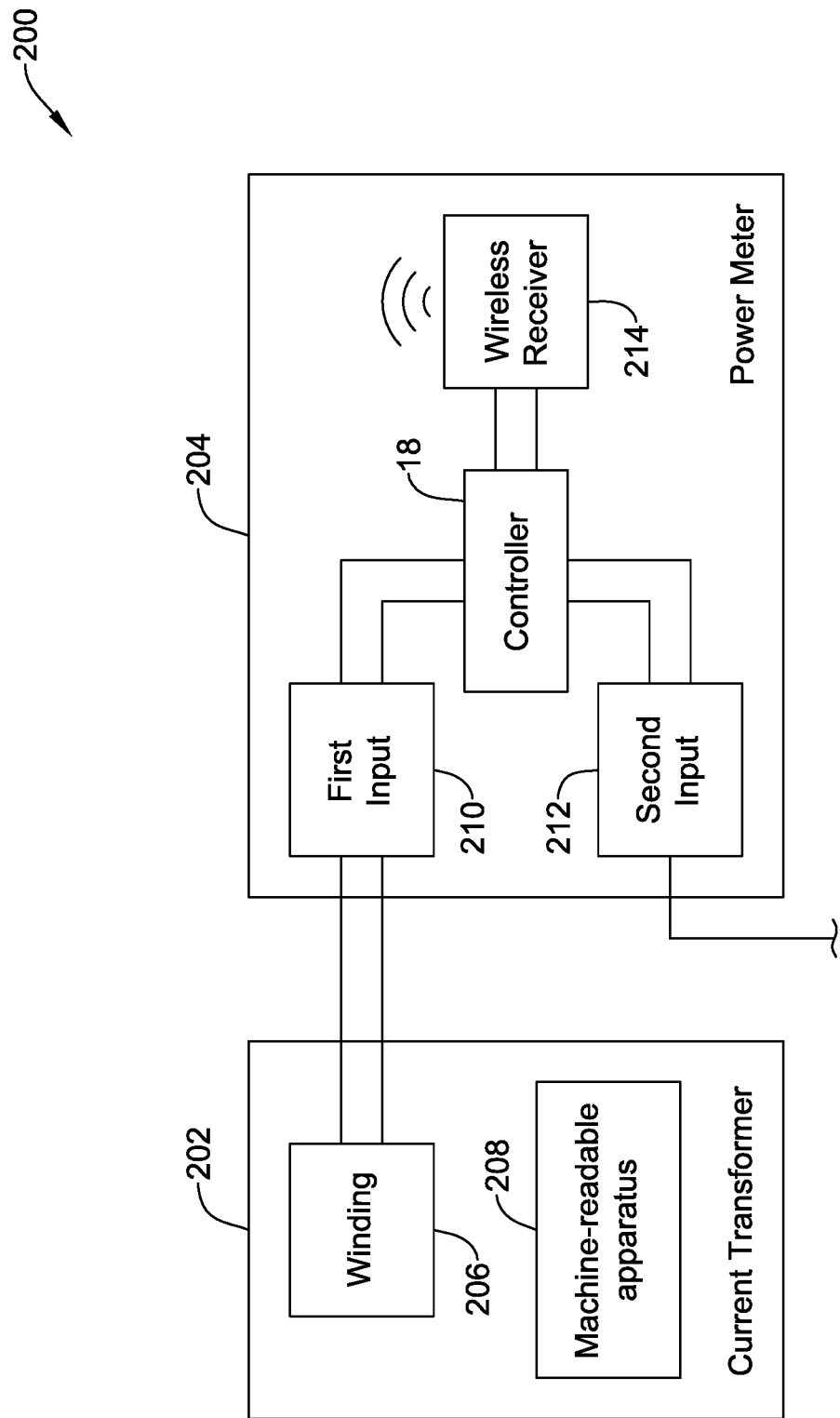
FIG. 10 is a schematic block diagram of an illustrative power monitoring system.

FIG. 10 is a schematic block diagram of a power monitoring system 200 that includes a current transformer 202 and a power meter 204. It will be appreciated that the power meter 204 is an indirect or CT power meter by virtue of the inclusion of the current transformer 202. The current transformer 202 includes a winding 206 for sensing a measure of current in a conductor that supplies power to a load as well as a machine-readable apparatus 208 that is secured relative to the current transformer 202. It will be appreciated that the current transformer 202 may be installed such that the conductor extends through the winding 206, with the winding 206 surrounding the conductor. In some cases, the current transformer 202 may be a split-core transformer. The current transformer 202 may be a rope current transformer, in some cases. These are just examples. The machine-readable apparatus 208 may be secured to the current transformer 202 itself, or the machine-readable apparatus 208 may be disposed in the packaging in which the current transformer 202 is shipped. This is just an example. In the example shown, the machine-readable apparatus 208 encodes calibration information that is specific to the current transformer 202.

The power meter 204 includes a first input 210 that is configured to receive the measure of current in the conductor from the current transformer 202 and a second input 212 that is configured to receive a measure of voltage of the conductor. The controller 18 is operably coupled to the first input 210 and to the second input 212 and the controller 18 is configured to receive the calibration information that is encoded in the machine-readable apparatus 208 and to calibrate the controller 18 with the particular current transformer 202 based on the calibration information. In some cases, the controller 18 is also configured to determine a number of power monitor parameters based at least in part on the calibration information, the measure of current sensed in the conductor by the current transformer 202 and the measure of voltage of the conductor. In some cases, the current transformer 202 may be paired with the power meter 204 in the field, and thus the calibration information that is encoded in the machine-readable apparatus 208 maybe used to instruct the power meter 204 how to interpret the measure of current that is received from the current transformer 202.

In some cases, the machine-readable apparatus 208 includes a sticker with a bar code and/or a QR code that encodes the calibration information specific to the current transformer 202, and the sticker is readable via an application running on a mobile device. The power meter 204 may include a wireless receiver 214 such that the power meter 204 is able to receive the calibration information from the mobile device via a short range wireless communication. For example, the short range wireless communication may include Bluetooth Low Energy (BLE) or Near Field Communication (NFC).

In some cases, the machine-readable apparatus 208 may include a passive data store such as an NFC device or even a passive RFID tag. The passive data store may be readable by an application running on a mobile device such as but not limited to a smartphone or a tablet. When the passive data store includes an NFC device, the power meter 204 may further include a loop antenna (or the loop antenna may form the wireless receiver 214) such that electromagnetic induction between the NFC device and the loop antenna enables the power meter 204 to read the calibration information stored in the NFC device. When the passive data store includes an RFID tag, the power meter 204 may further include an RFID reader (or the RFID reader may form or be included within the wireless receiver 214) such that the power meter 204 is able to read the calibration information stored in the passive RFID tag.

Figure 11:
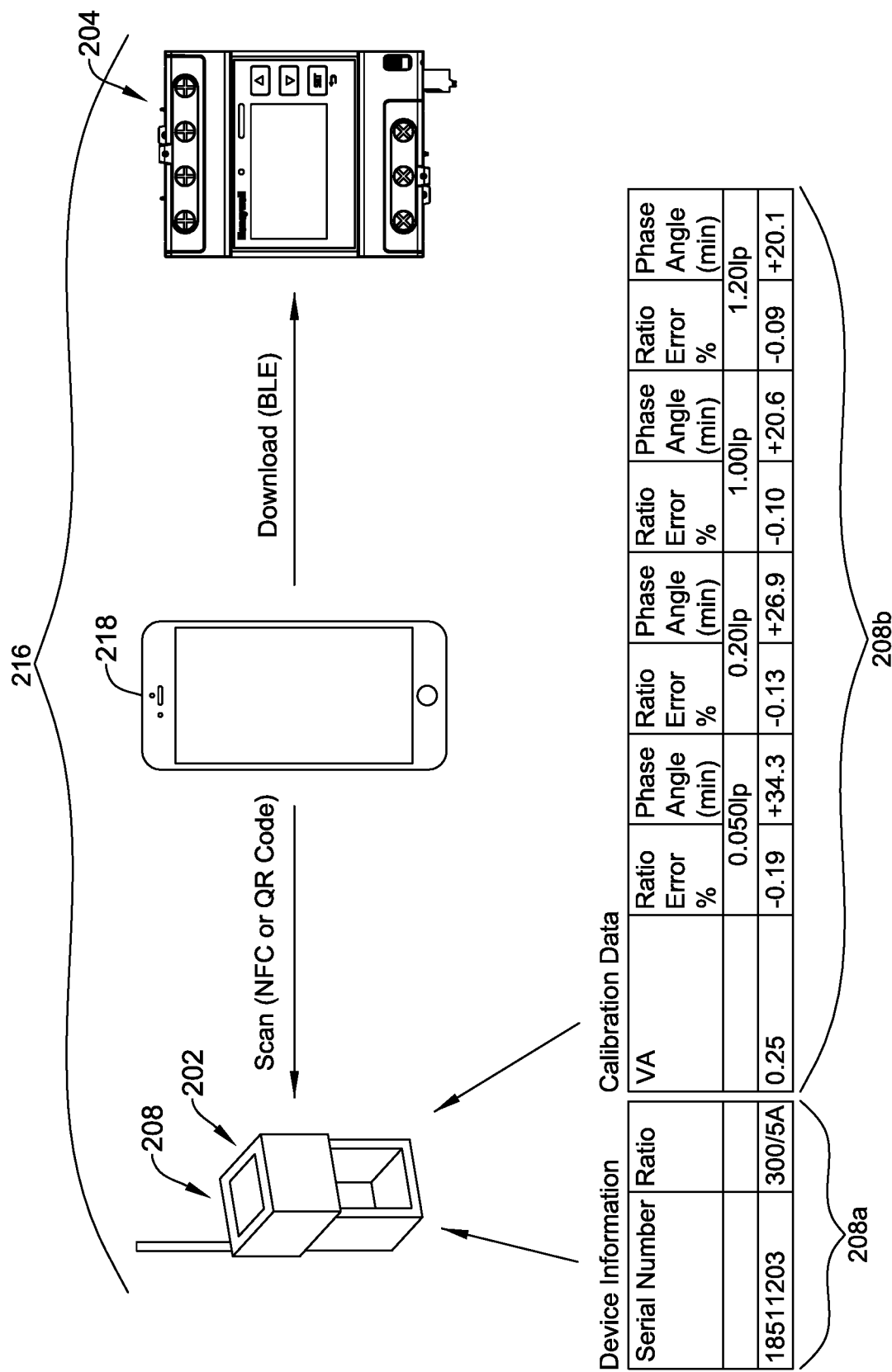
FIG. 11 is a diagram of an assembly by which the illustrative power monitoring system of FIG. 10 may be calibrated in the field.

FIG. 11 is a diagram of an assembly 216 that facilitates obtaining the calibration information from the machine-readable apparatus 208 and communicating the information to the power meter 204. In some cases, a mobile device such as a smartphone 218 may be used to scan or otherwise obtain the encoded information from the machine-readable apparatus 208. For example, the machine-readable apparatus 208 may be an NFC code or a QR code that can be read by an application running on the smartphone 218. Once the encoded information has been obtained by the smartphone 218, the smartphone 218 can communicate the encoded information to the power meter 204. In some cases, the smartphone 218 may communicate with the power meter 204 via BLE. In some cases, as shown, the encoded information read from the machine-readable apparatus 208 includes device information 208a as well as calibration data 208b.

Figure 12:
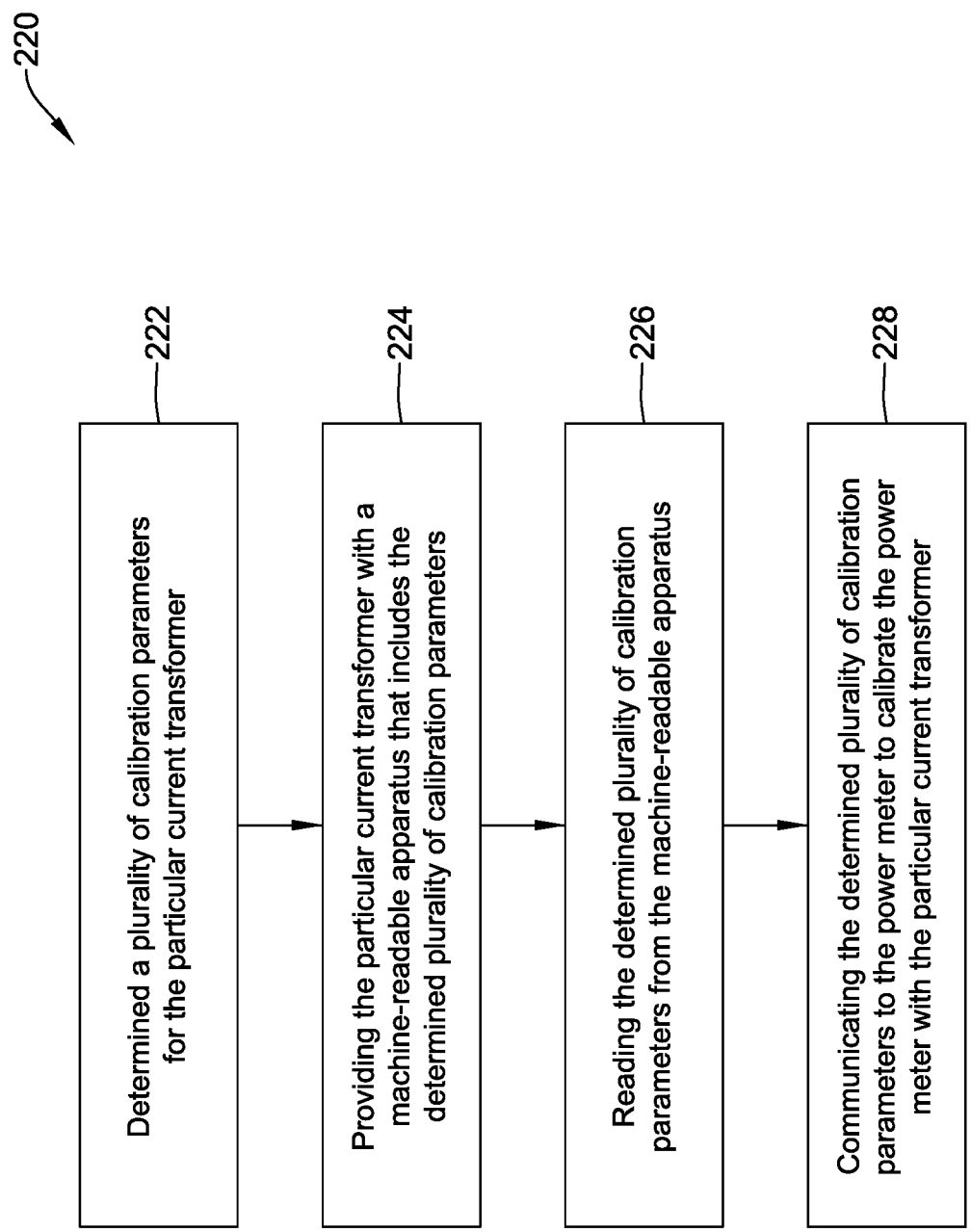
FIG. 12 is a flow diagram showing an illustrative method of configuring a power meter to be used with a particular current transformer.

FIG. 12 is a flow diagram showing an illustrative method 220 of configuring a power meter to be used with a particular current transformer. As indicated at block 222, the method includes determining a plurality of calibration parameters for the particular current transformer. As indicated at block 224, the particular current transformer may be provided with a machine-readable apparatus that includes the determined plurality of calibration parameters. As indicated at block 226, the determined plurality of calibration parameters may be read from the machine-readable apparatus. As indicated at block 228, the determined plurality of calibration parameters may be communicated to the power meter to calibrate the power meter with the particular current transformer. In some cases, determining the plurality of calibration parameters may occur during manufacturing, and reading and communicating the determined plurality of calibration parameters may occur after manufacturing, such as out in the field.

Figure 13:
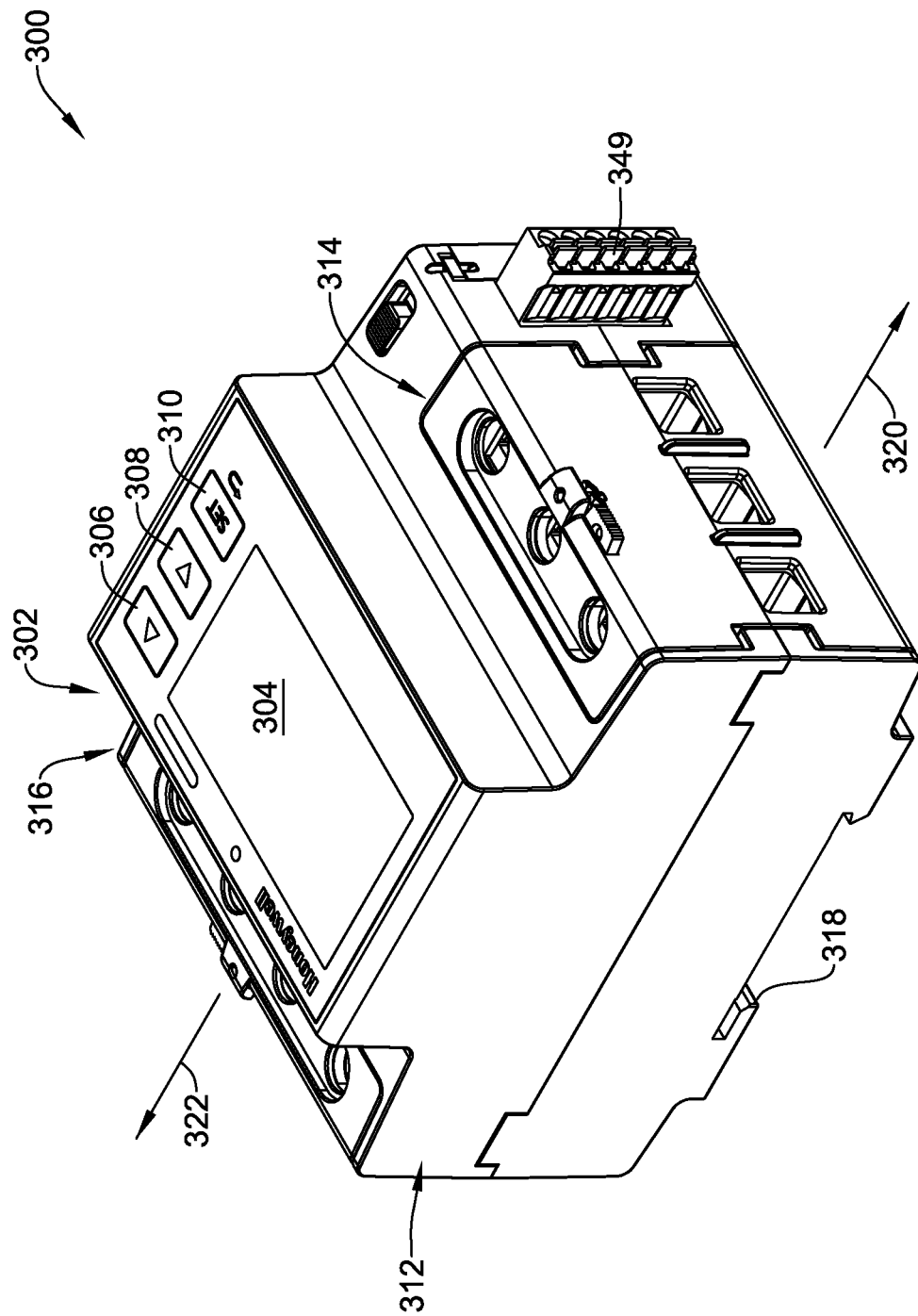
FIG. 13 is a perspective view of an illustrative power meter with movable terminal blocks.

FIG. 13 is a perspective view of an illustrative power meter 300 with movable terminal blocks. The power meter 300 may be considered as being an example of a direct power meter, meaning that the power meter 300 may be spliced into each of the conductors providing power to a particular load. The power meter 300 may be considered as being an example of, or including features and elements of, any of the power meter 10 (FIG. 1), the power meter 30 (FIG. 2), the power meter 60 (FIG. 4) or the power meter 90 (FIG. 5). Accordingly, the power meter 300 may be considered as including the controller 18 described with respect to any of the power meters 10, 30, 60, 90. The power meter 300 includes a user interface 302 having, as illustrated, a display 304, an up button 306, a down button 308 and a set button 310. It will be understood that the user interface 302 may be considered as being an example of, or including features and elements of, any of the user interface 20 (FIGS. 1, 2 and 4) or the user interface 98 (FIG. 6).

The power meter 300 includes a power meter housing 312. A bottom terminal block 314 is releasably secured to the power meter housing 312. A top terminal block 316 is releasably secured to the power meter housing 312. Each of the bottom terminal block 314 and the top terminal block 316 define one or more wiring terminals. As illustrated, the bottom terminal block 314 defines three wiring terminals that may be used for LINE IN for each of three power phases (L1, L2, L3, for example). As illustrated, the top terminal block 316 defines four wiring terminals that may be used for LINE OUT for each of the three power phases as well as a NEUTRAL wiring terminal. These are just examples. As illustrated, the bottom terminal block 314 and the top terminal block 316 may be considered as being disposed in a first orientation in which the terminals (and terminal screws) face in a first direction towards a front of the power meter 300. The terminals (and terminal screws) will be discussed in greater detail with respect to subsequent Figures.

In some cases, the power meter 300 may be mounted in such a way that the power meter 300 is secured at the back of the power meter 300. As illustrated, the power meter housing 312 includes a track 318 that is configured to accommodate mounting the power meter 300 to a DIN rail. In some cases, however, the power meter 300 may be mounted within a control panel, with the user interface 302 extending outwardly through an aperture within the control panel. In such cases, it will be appreciated that this can cause potential difficulties in wiring the power meter 300. Accordingly, the power meter 300 may be configured such that the bottom terminal block 314 and the top terminal block 316 may be moved to a second orientation in which the terminals (and terminal screws) face in a second direction, such as towards a back of the power meter 300 or a side of the power meter 300. For example, each of the bottom terminal block 314 and the top terminal block 316 may be rotated from the first orientation to the second orientation, sometimes without completely removing the bottom terminal block 314 and the top terminal block 316 from the power meter 300 housing. In some cases, the bottom terminal block 314 and the top terminal block 316 may be removed from the power meter housing 312 and reinstalled in the second orientation in which the terminals (and terminal screws) face in a second direction towards a back of the power meter 300. In some cases, the bottom terminal block 314 may be removed by pulling the bottom terminal block 314 in a direction indicated by an arrow 320. The top terminal block 316 may be removed by pulling the top terminal block 316 in a direction indicated by an arrow 322. The power meter 300 may include a control terminal block 349 corresponding to the control terminals 26 of FIG. 1.

Figure 14:
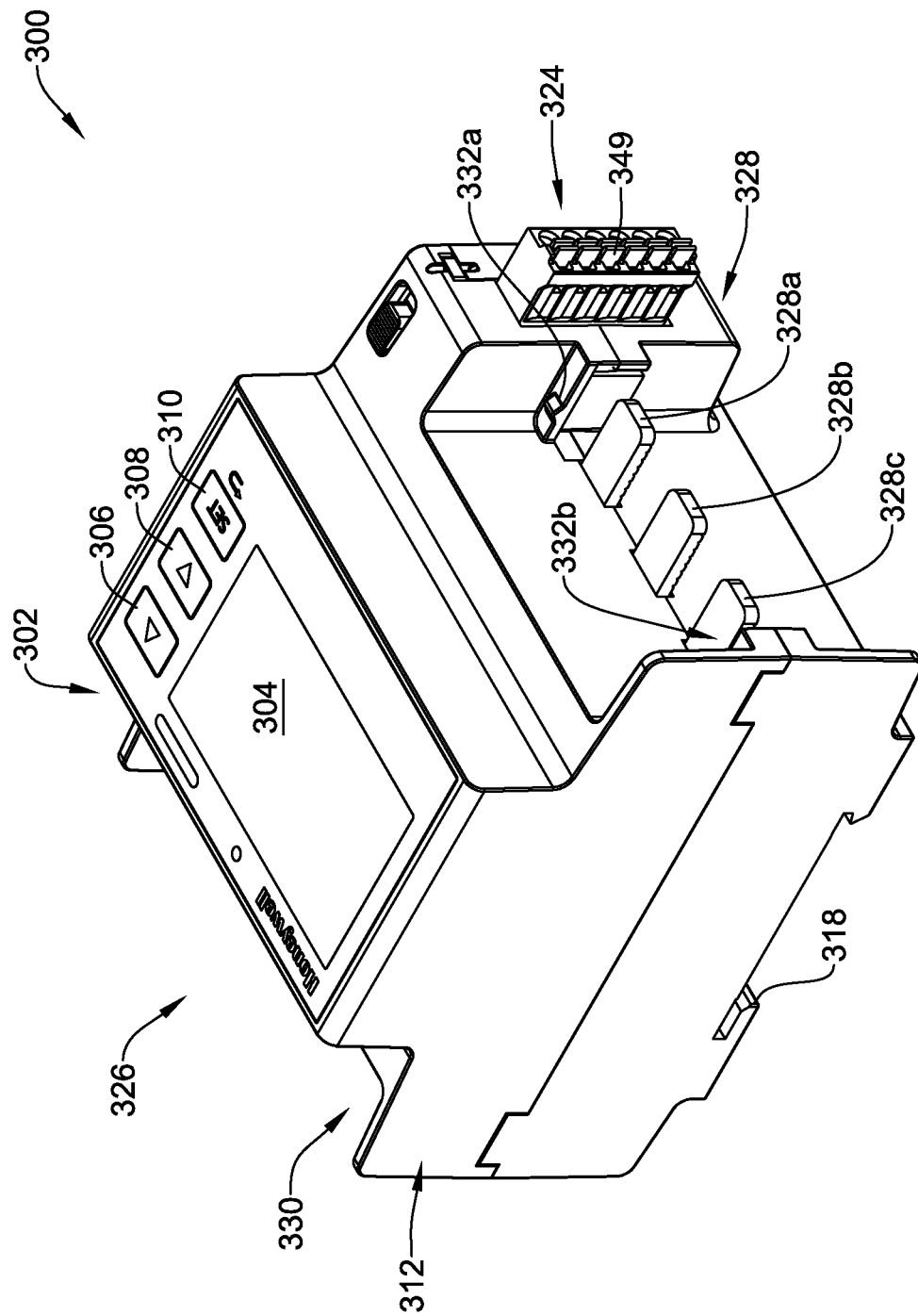
FIG. 14 is a perspective view of the power meter of FIG. 13, with top and bottom terminal blocks removed.

FIG. 14 is a perspective view of the power meter 300 with the bottom terminal block 314 and the top terminal block 316 removed. As can be seen, the power meter 300 includes a bottom terminal block cavity 324 into which the bottom terminal block 314 fits and a top terminal block cavity 326 into which the top terminal block 316 fits. The bottom terminal block cavity 324 includes several features of interest. The bottom terminal block cavity 324 includes electrical contacts 328 extending from an interior of the power meter 300. Because the bottom terminal block 314 includes three terminals, the bottom terminal block cavity 324 includes three electrical contacts 328a, 328b and 328c. It will be appreciated that if the bottom terminal block 314 included fewer terminals, there would correspondingly be fewer electrical contacts 328 extending from an interior of the power meter 300. If the bottom terminal block 314 included additional terminals, there would corresponding be additional electrical contacts 328 extending from an interior of the power meter 300. It will be appreciated that there are electrical contacts 330 extending into the top terminal block cavity 326, with the number of electrical contacts 330 corresponding to the number of terminals within the top terminal block 316. In some cases, at least some of the electrical contacts 328 may be electrically coupled with at least some of the electrical contacts 330.

The bottom terminal block 314 may fit into the bottom terminal block cavity 324 via an interference fit, or a snap fit. In some cases, one or more screws or other fasteners may be used to releasably secure the bottom terminal block 314. In some cases, as illustrated, the bottom terminal block cavity 324 also includes an engagement feature 332a along one side of the bottom terminal block cavity 324 as well as an engagement feature 332b along an opposing side of the bottom terminal block cavity 324. As will be discussed, the bottom terminal block 314 may include features that releasably engage the engagement features 332a, 332b. While not visible, it will be appreciated that there are similar engagement features within the top terminal block cavity 326 that releasably engage the top terminal block 316.

Figure 15A:
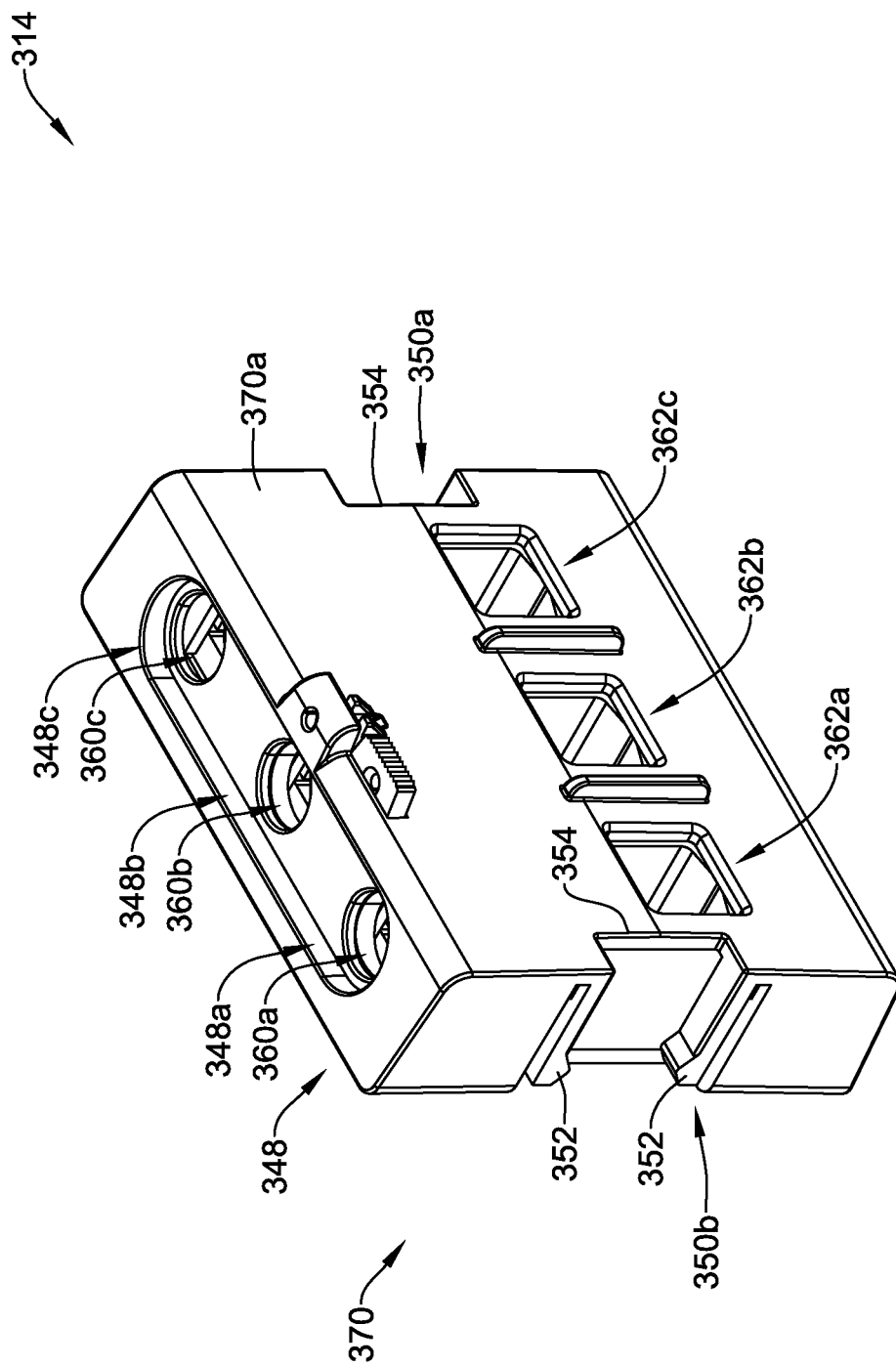
FIGS. 15A and 15B are bottom and top perspective views, respectively, of the bottom terminal block of FIG. 14.
Figure 15B:
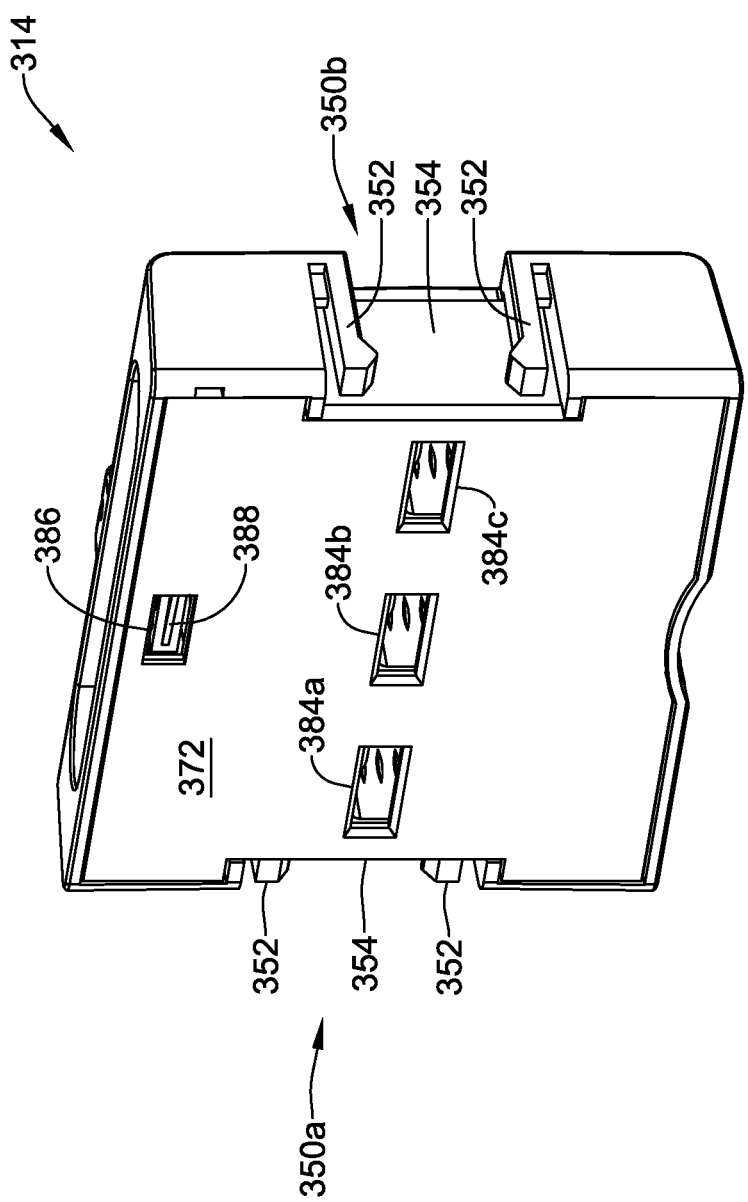

FIGS. 15A and 15B are perspective views showing the bottom of the bottom terminal block 314 and the top of the bottom terminal block 314, respectively. The bottom terminal block 314 can be seen as including an engagement feature 350a that is configured to releasably engage the engagement feature 332a of the bottom terminal block cavity 324 and an engagement feature 350b that is configured to releasably engage the engagement feature 332b of the bottom terminal block cavity 324. In some cases, the engagement feature 350a and 350b each may include one or two (two are illustrated) cantilevered latches 352 along either side of a recess 354.

As previously noted, the bottom terminal block 314 is shown as having three terminals 348, which are individually labeled as 348a, 348b and 348c. Each terminal 348 includes a terminal screw 360, labeled individually as a terminal screw 360a, a terminal screw 360b and a terminal screw 360c. It will be appreciated that it is to ensure access to the terminal screws 360 that the bottom terminal block 314 (and the top terminal block 316) are configured to be releasably secured in either the first orientation (shown for example in FIG. 13) in which the terminals 348 face forward and the opposing second orientation in which the terminals 348 face rearward. Other orientations are also contemplated. In the example shown, each terminal 348 includes a conductive cage 362, which are individually labeled as a conductive cage 362a, a conductive cage 362b and a conductive cage 362c. It will be appreciated that the conductive cages 362 are configured to accommodate a conductor inserted into the conductive cage 362. As will be discussed with respect to FIGS. 17A through 17D, the terminal screws 360 and the conductive cages 362 interact with the electrical contacts 328 to physically secure each conductor inserted into the conductive cages 362 and to ensure electrical contact between the conductors (not shown) and the electrical contacts 328.

Figure 16A:
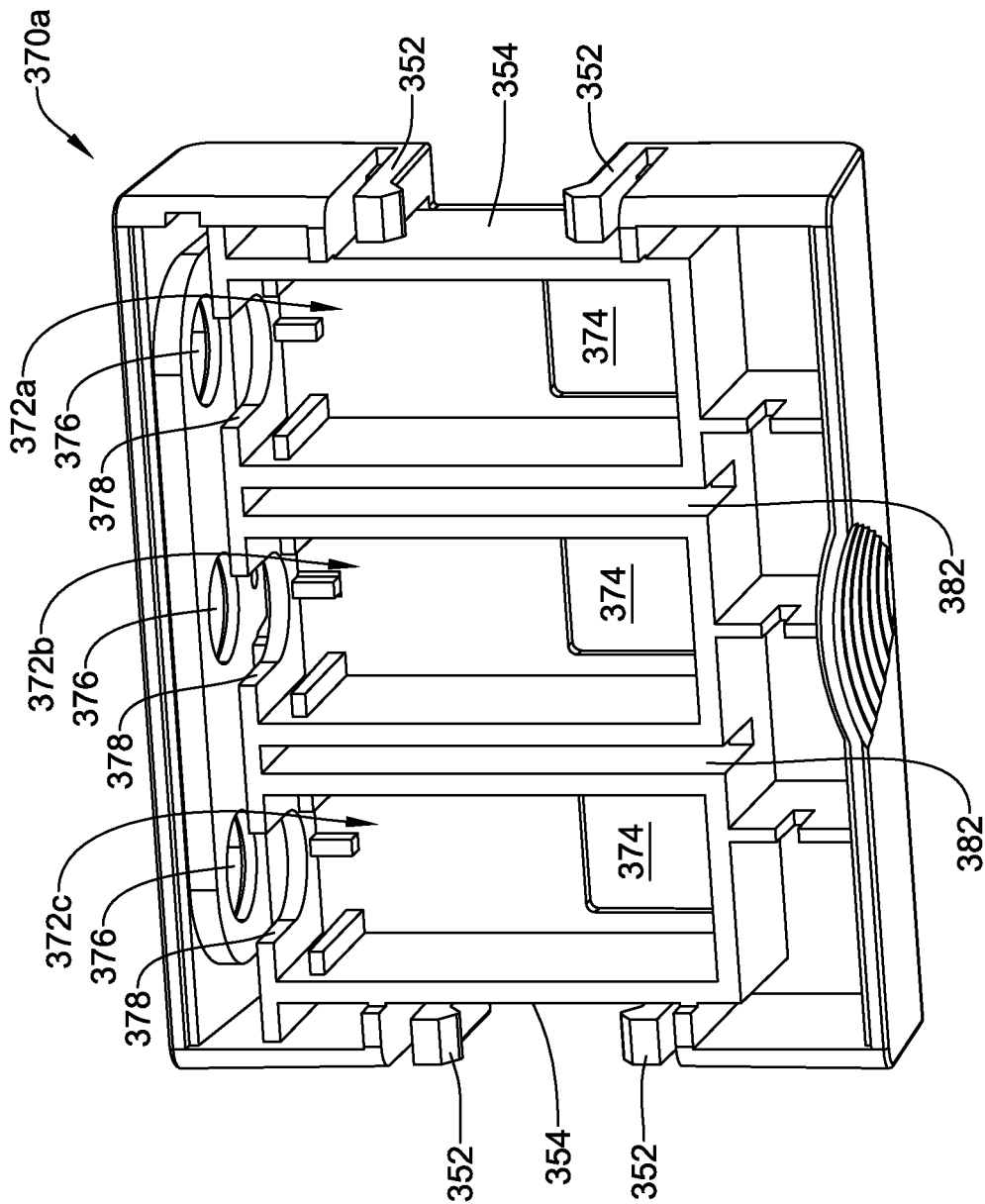
FIGS. 16A and 16B are perspective views, respectively, of top and bottom housing sections of the bottom terminal block of FIG. 14.
Figure 16B:
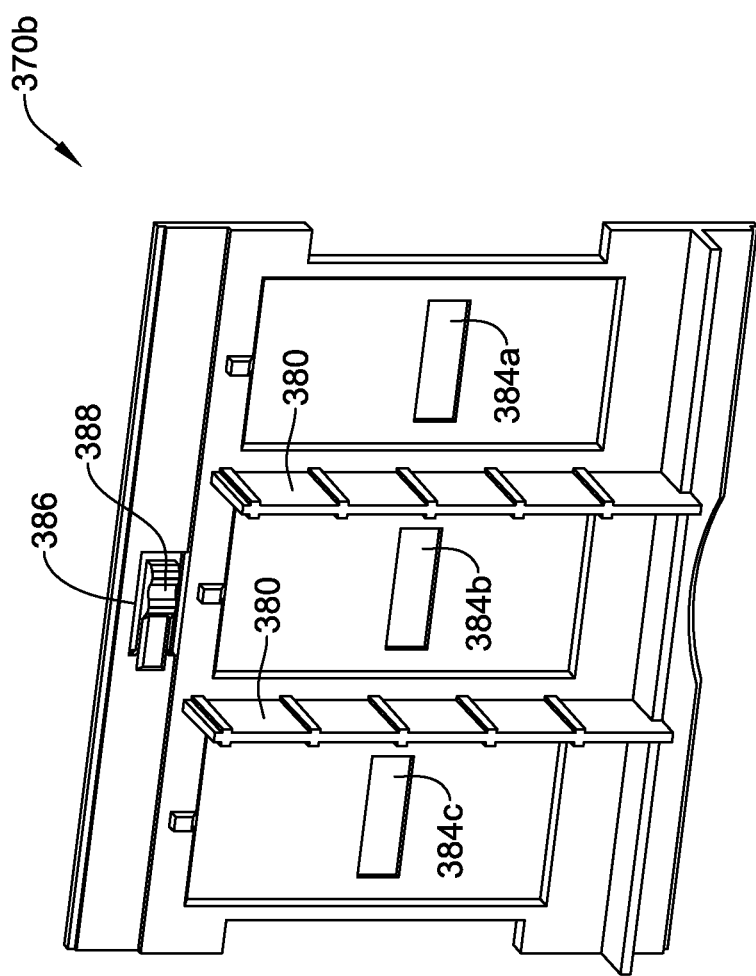

FIGS. 16A and 16B are perspective views of a bottom housing section 370a and a top housing section 370b, respectively, that together form a bottom terminal block housing 370. In looking at the bottom housing section 370a, it can be seen that the bottom housing section 370a defines terminal channels 372, which are individually labeled as a terminal channel 372a, a terminal channel 372b and a terminal channel 372c. Each of the terminal channels 372 may be seen as including an aperture 374 that permits insertion of a conductor into one of the conductive cages 362. The bottom housing section 370a also defines apertures 376 that accommodate insertion of a screwdriver or other tool in order to engage the terminal screws 360. In some cases, the apertures 376 are sized to be large enough to permit tool insertion but are smaller in diameter than the terminal screws 360 in order to retain the terminal screws 360. It can be seen that each of the terminal channels 372 include a cutout 378 to accommodate each terminal screw 360.

With respect to FIG. 16B, the top housing section 370b includes a pair of walls 380 that are configured to fit into corresponding voids 382 that are formed in the bottom housing section 370a. Together, the walls 380 and the voids 382 interact to help secure the bottom housing section 370a to the top housing section 370b. The top housing section 370b includes apertures 384, individually labeled as an aperture 384a, an aperture 384b and an aperture 384c. The apertures 384 are configured to accommodate the electrical contacts 328 when the bottom terminal block 314 is disposed within the bottom terminal block cavity 324. By virtue of the apertures 384 being centered vertically within the top housing section 370b, it will be appreciated that the electrical contacts 328 will extend into the apertures 384 regardless of whether the bottom terminal block 314 is inserted into the bottom terminal block cavity 324 in the first orientation or in the second orientation. In some cases, an aperture 386 extends through the top housing section 370b in order to accommodate a cantilevered latch 388. As will be discussed, the illustrative cantilevered latch 388 is configured to interact with a protective plate.

Figure 17A:
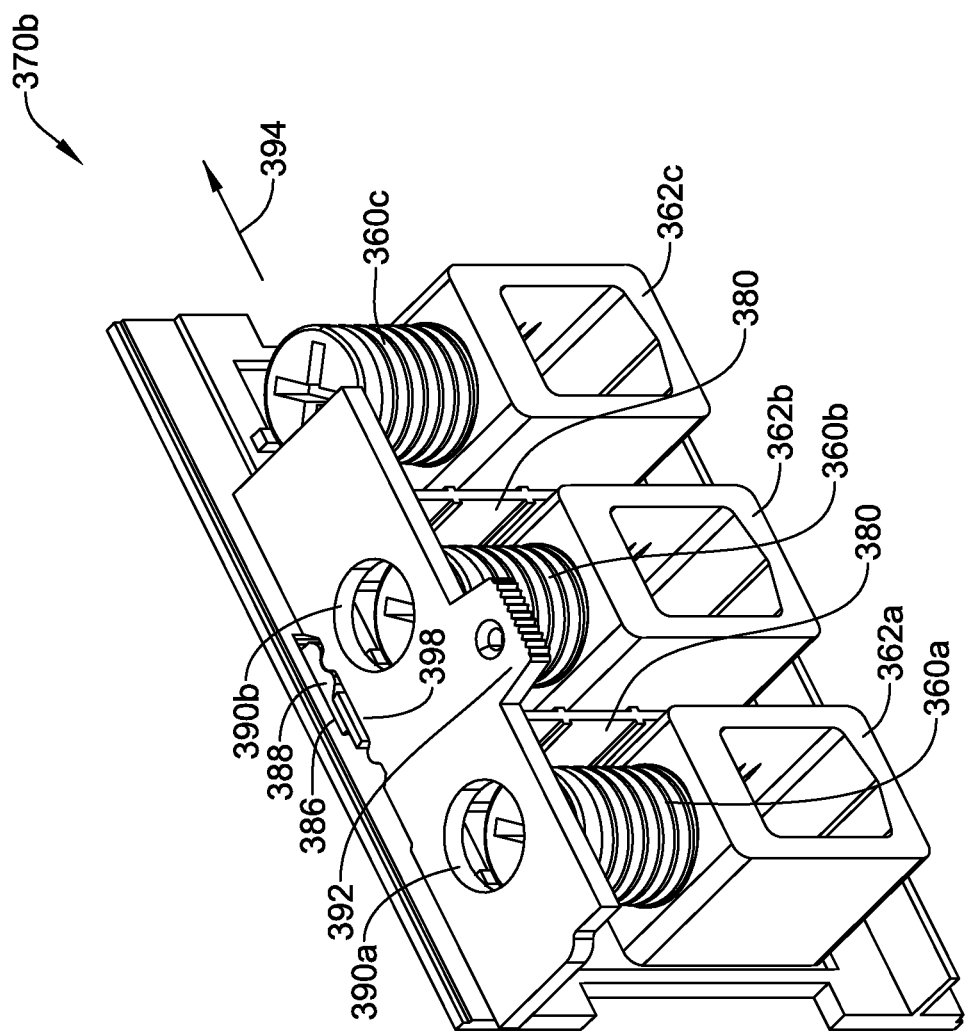
FIGS. 17A through 17D are perspective views illustrating internal components of the bottom terminal block of FIG. 14.

FIG. 17A shows the bottom terminal block 314 with the bottom housing section 370a removed. As can be seen, the bottom terminal block 314 includes a protective plate 390 that is movable between a first position, as shown, that permits access to each of the terminal screws 360. By engaging a latch 392, the protective plate 390 may be moved in a direction that is indicated by an arrow 394 in order to prevent access to each of the terminal screws 360. As shown, the protective plate 390 includes apertures 390a and 390b that in the first position permit access to each of the terminal screws 360 such that a screwdriver or other tool can engage each of the terminal screws 360. By moving the protective plate 390 in the direction indicated by the arrow 394, the apertures 390a and 390b will no longer align with the terminal screws 360, and the protective plate 390 may prevent access to the terminal screws 360. The protective plate 390 includes a cutout profile 398 that engages the cantilevered latch 388.

Figure 17B:
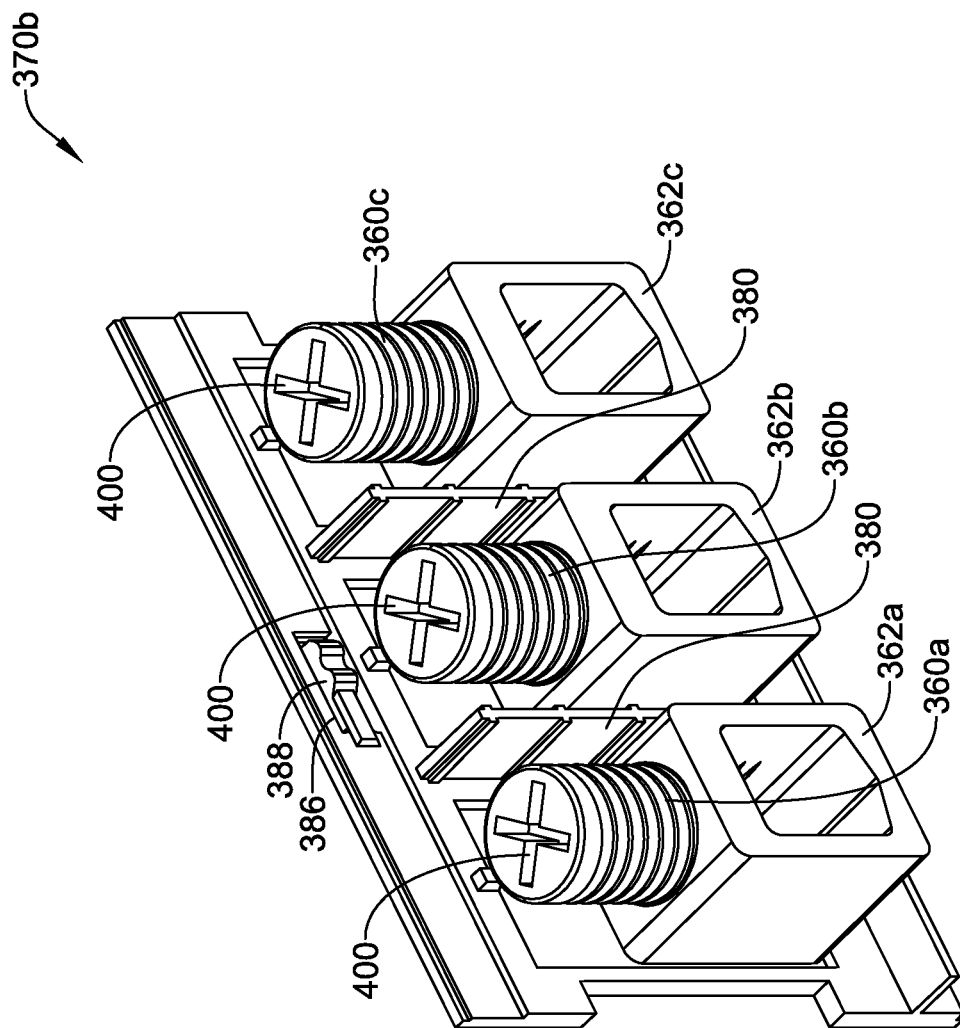
Figure 17C:
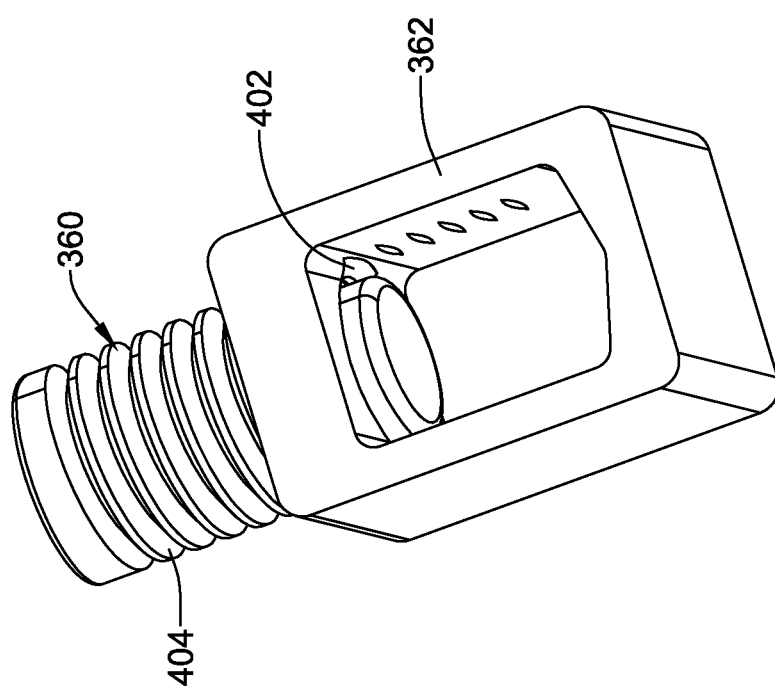
Figure 17D:
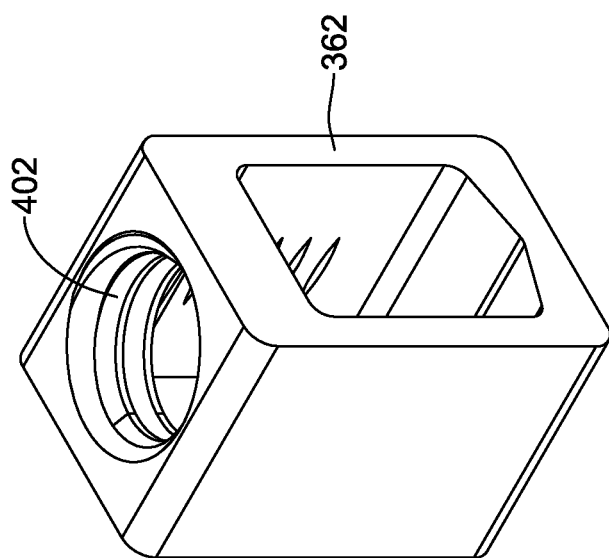

In FIG. 17B, the protective plate 390 has been removed. Each of the terminal screws 360 may be seen as including a tool engagement feature 400. While each tool engagement feature 400 is illustrated as being configured to accommodate a Phillips screwdriver, this is not required. For example, there are a variety of different options for the tool engagement feature 400, including a single slot (to accommodate a standard screwdriver) a hex shaped cavity (to accommodate an Allen wrench) and the like. It should be noted that each of the terminal screws 360 are threadedly engaged with the corresponding conductive cages 362. By comparing FIG. 17B with FIG. 14, it will be appreciated that the electrical contacts 328 extend into the conductive cages 362 such that the terminal screws 360 engage the electrical contacts 328. As the terminal screws 360 are turned, the terminal screws 360 cause the conductive cages 362 to move up or down, thereby tightening against conductors inserted into the conductive cages 362. Accordingly, the conductors are physically and electrically secured relative to the conductive cages 362. As can be seen in FIGS. 17C and 17D, the conductive cages 362 include a threaded aperture 402 that threadedly engage corresponding threads 404 formed on the terminal screws 360.

Figure 18A:
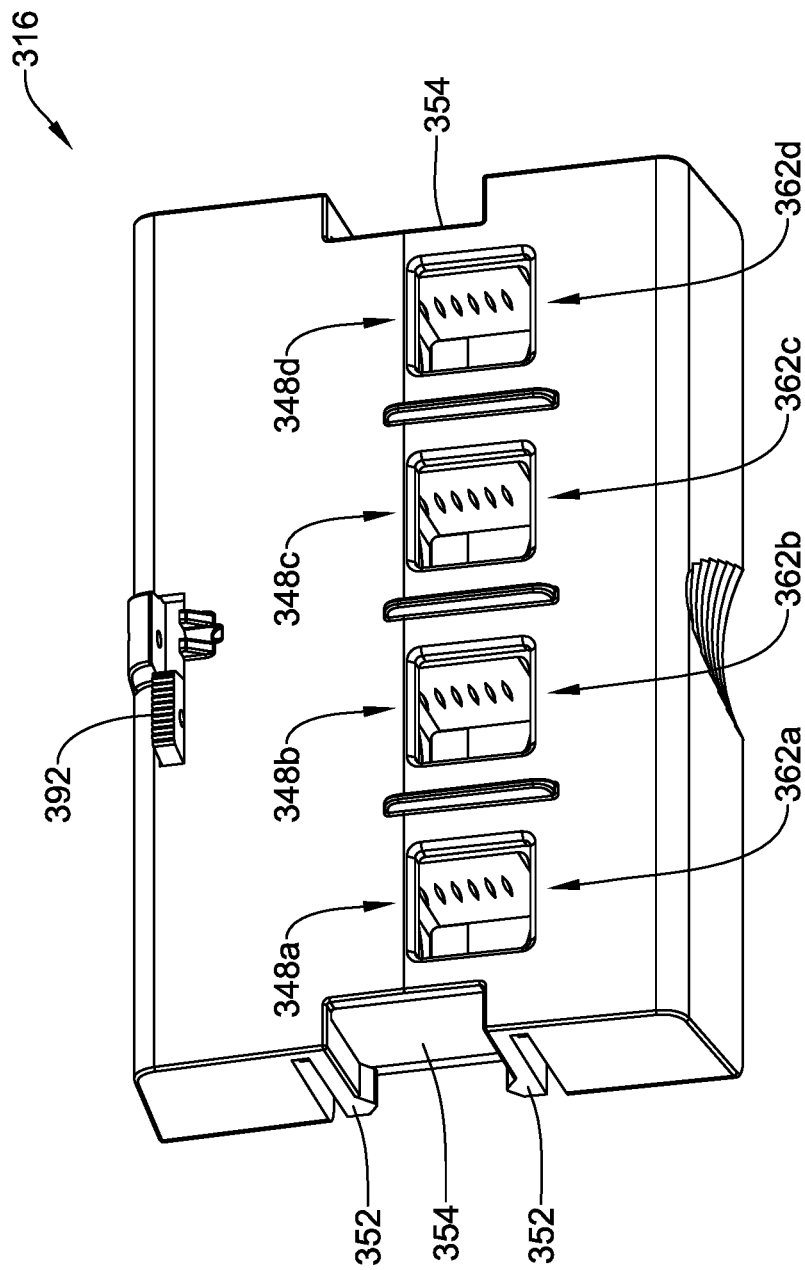
FIGS. 18A and 18B are bottom and top perspective views, respectively, of the top terminal block of FIG. 14.
Figure 18B:
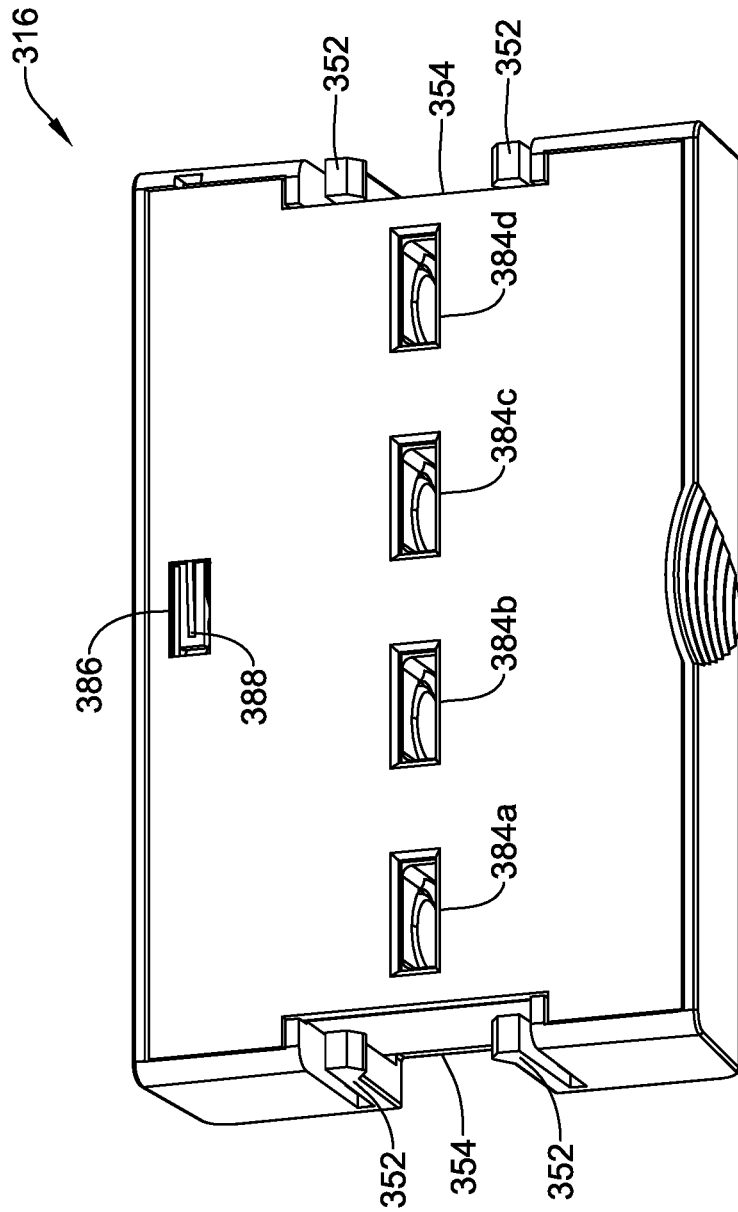

FIGS. 18A and 18B provide perspective views of the top and bottom, respectively, of the top terminal block 316. Construction of the top terminal block 316 is essentially the same as that described with respect to the bottom terminal block 314. The only difference is that in some cases, as illustrated, the top terminal block 316 may have a fourth terminal 348.

Figure 19:
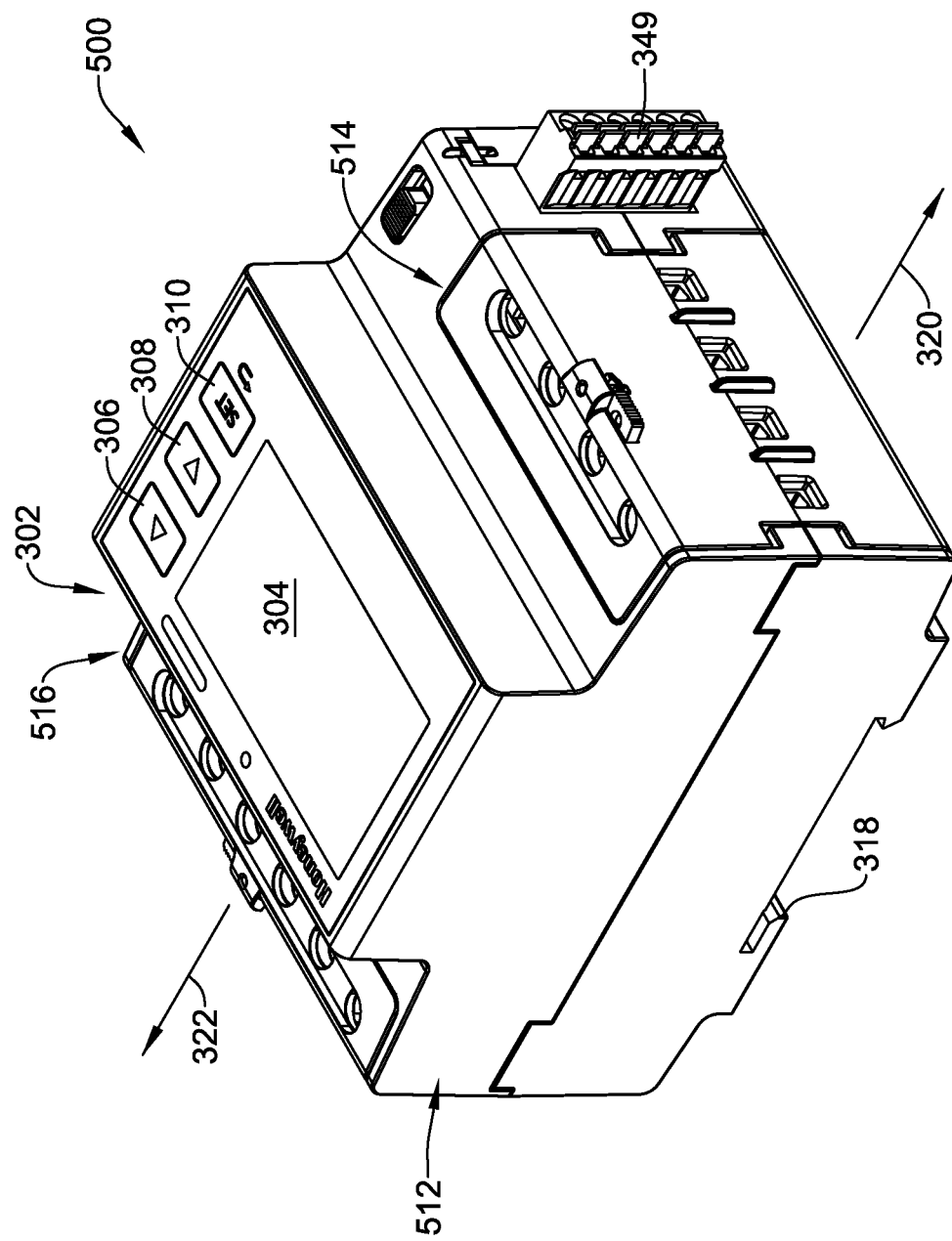
FIG. 19 is a perspective view of an illustrative power meter.

FIG. 19 is a perspective view of an illustrative power meter 500. The power meter 500 may be considered as being an example of an indirect or CT power meter, meaning that the power meter 500 includes one or more first terminals that are each configured to accept a conductor providing an indication of line voltage in a corresponding phase of a power line, as well as one or more second terminal pairs that are each configured to accept conductor pairs from a current transformer sensor or the like that provides an indication of current in a corresponding phase of the power line. As an example, the one or more first terminals may include a LINE ONE voltage terminal, a LINE TWO voltage terminal, a LINE THREE voltage terminal and a NEUTRAL terminal. The one or more second terminal pairs may include a LINE ONE S1 and a LINE ONE S2 terminal pair, a LINE TWO S1 and a LINE TWO S2 terminal pair, a LINE THREE S1 and a LINE THREE S2 terminal pair, where for each power phase S1 and S2 correspond to two lines coming from a corresponding current transformer sensor.

The power meter 500 may be considered as being an example of, or including features and elements of, any of the power meter 10 (FIG. 1), the power meter 30 (FIG. 2), the power meter 60 (FIG. 4) or the power meter 90 (FIG. 5). Accordingly, the power meter 500 may be considered as including the controller 18 described with respect to any of the power meters 10, 30, 60, 90. The power meter 500 includes a user interface 302 having, as illustrated, a display 304, an up button 306, a down button 308 and a set button 310. It will be understood that the user interface 302 may be considered as being an example of, or including features and elements of, any of the user interface 20 (FIGS. 1, 2 and 4) or the user interface 98 (FIG. 6).

The power meter 500 includes a power meter housing 512. A bottom terminal block 514 is releasably secured to the power meter housing 512. A top terminal block 516 is releasably secured to the power meter housing 512. Each of the bottom terminal block 514 and the top terminal block 516 define one or more wiring terminals. As illustrated, the bottom terminal block 514 and the top terminal block 516 may be considered as being disposed in a first orientation in which the terminals (and terminal screws) face in a first direction towards a front of the power meter 500.

In some cases, the power meter 500 may be configured such that the bottom terminal block 514 and the top terminal block 516 may be removed from the power meter housing 512 and reinstalled in a second orientation in which the terminals (and terminal screws) face in a second direction towards a back of the power meter 500. In some cases, the bottom terminal block 514 may be removed by pulling the bottom terminal block 514 in a direction indicated by an arrow 320. The top terminal block 516 may be removed by pulling the top terminal block 516 in a direction indicated by an arrow 322.

Figure 20A:
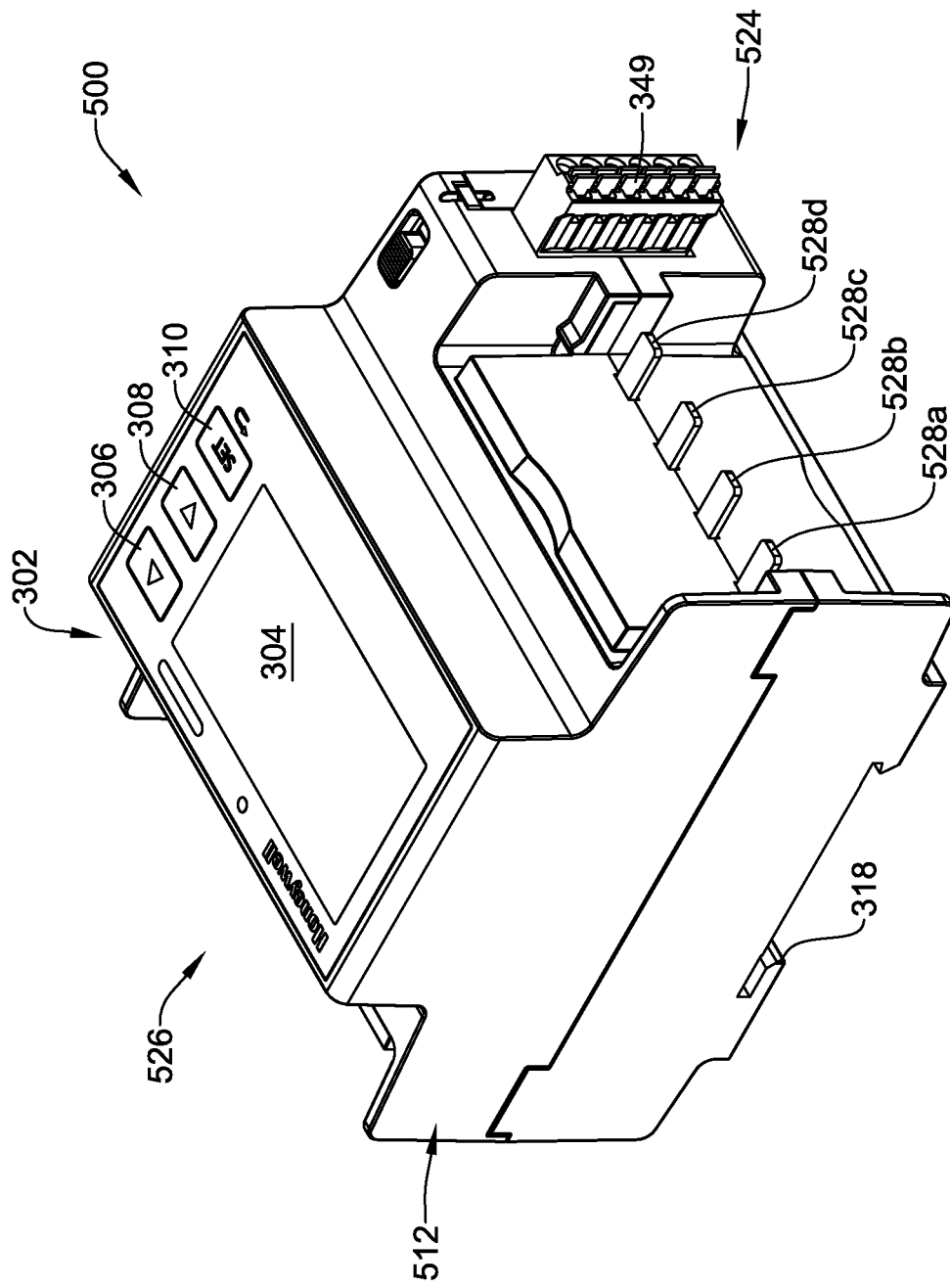
FIGS. 20A and 20B are bottom and top perspective views, respectively, of the power meter 19 with the top and bottom terminal blocks removed.
Figure 20B:
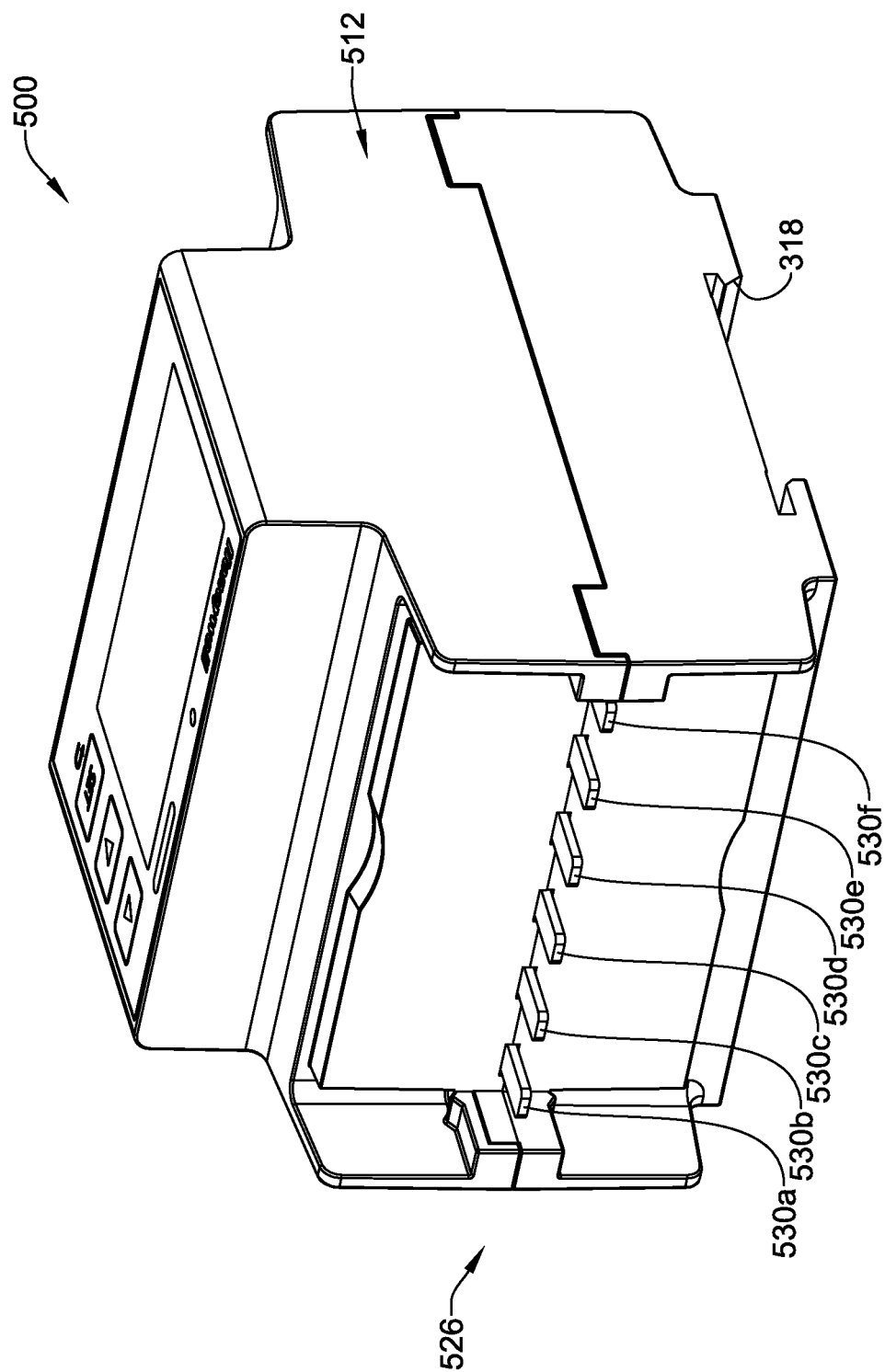

FIGS. 20A and 20B are bottom and top perspective views, respectively, of the power meter 500 with the bottom terminal block 514 and the top terminal block 516 removed. As can be seen, the power meter 500 includes a bottom terminal block cavity 524 into which the bottom terminal block 514 fits and a top terminal block cavity 526 into which the top terminal block 516 fits. The bottom terminal block cavity 524 includes electrical contacts 528 extending from an interior of the power meter 500 and the top terminal block cavity 526 includes electrical contacts 530 extending from an interior of the power meter 500.

Because the bottom terminal block 514 includes four terminals, the bottom terminal block cavity 524 includes four electrical contacts 528a, 528b, 528c and 528d. It will be appreciated that if the bottom terminal block 514 included fewer terminals, there would correspondingly be fewer electrical contacts 528 extending from an interior of the power meter 500. If the bottom terminal block 514 included additional terminals, there would corresponding be additional electrical contacts 528 extending from an interior of the power meter 500. Similarly, because the top terminal block 516 includes six terminals, the top terminal block cavity 526 includes six electrical contacts 530a, 530b, 530c, 530d, 530e and 540f. It will be appreciated that if the top terminal block 516 included fewer terminals, there would correspondingly be fewer electrical contacts 530 extending from an interior of the power meter 500. If the top terminal block 516 included additional terminals, there would correspondingly be additional electrical contacts 530 extending from an interior of the power meter 500.

In the example shown, construction and interior details of the bottom terminal block 514 and the top terminal block 516 are identical, apart from size considerations, to that described with respect to the bottom terminal block 314 of the power meter 300. How the bottom terminal block 514 and the top terminal block 516 are releasably secured to the power meter housing 512 is also the same as that described for the bottom terminal block 314 and the top terminal block 516. It will be appreciated that the terminal screws 360, the conductive cages 362, and the terminal channels 370 may be smaller, depending on how many terminals 348 are required. The overall dimensions of the bottom terminal block 514 may be similar or identical to the overall dimensions of the bottom terminal block 314. The overall dimensions of the top terminal block 516 may be similar or identical to the overall dimensions of the top terminal block 316. Accordingly, if there are more terminals 348, the individual components such as the terminal screws 360, the conductive cages 362, and the terminal channels 370 may be correspondingly smaller. In some cases, the conductive cages, terminals and/or screws may be sized to accommodate the expected current that each of the terminals are expected to carry during operation of the power meter. Generally, the larger the electrical components, the less electrical resistance will be introduced into the terminal paths.

Figure 21:
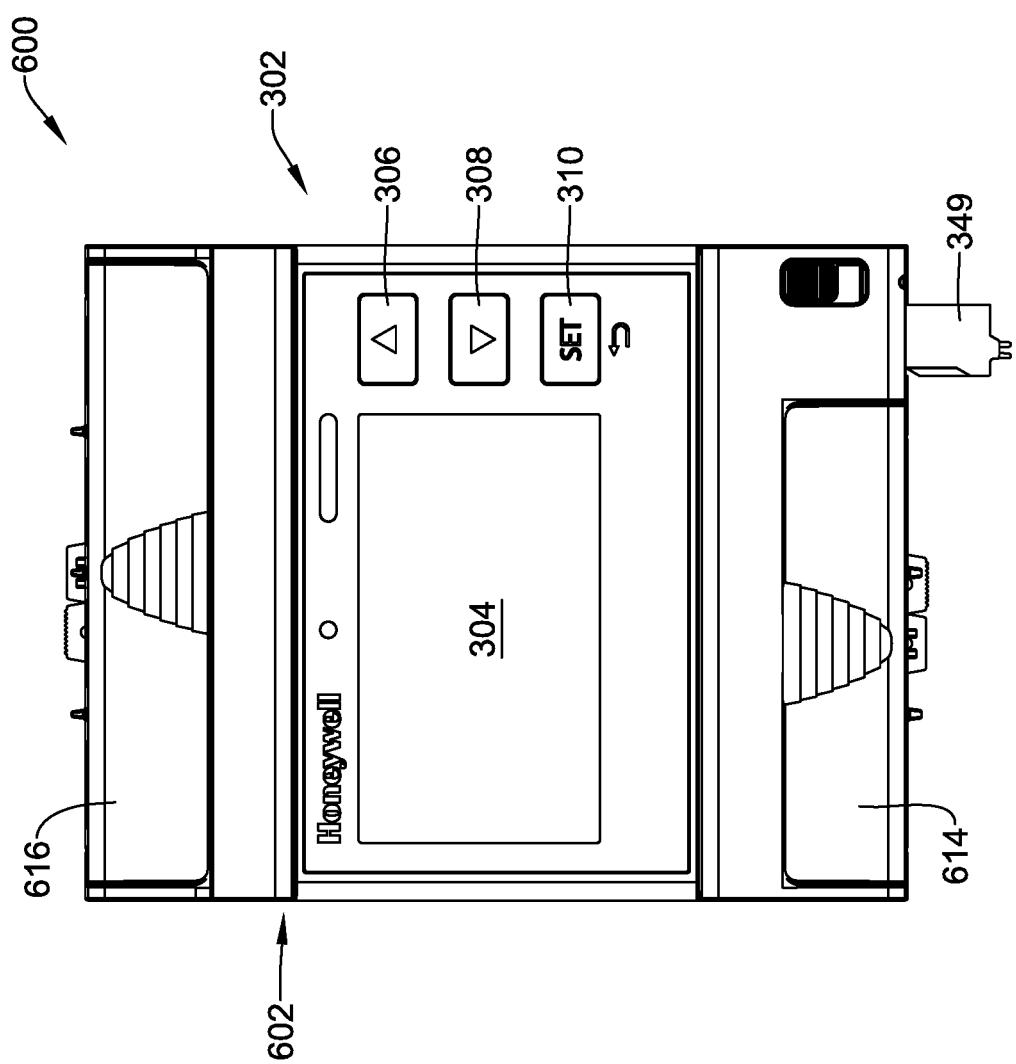
FIG. 21 is a front elevation view of an illustrative power meter with the top and bottom terminal blocks shown facing a rear of the power meter.

FIG. 21 is a front view of an illustrative power meter 600. The power meter 600 may be considered as being an example of, or including features and elements of, any of the power meter 10 (FIG. 1), the power meter 30 (FIG. 2), the power meter 60 (FIG. 4) or the power meter 90 (FIG. 5). Accordingly, the power meter 600 may be considered as including the controller 18 described with respect to any of the power meters 10, 30, 60, 90. The power meter 600 may be considered as representing a direct power meter, such as the power meter 300, or an indirect or CT power meter, such as the power meter 500. In FIG. 21, it can be seen that a bottom terminal block 614 and a top terminal block 616 have both been moved from the first orientation in which the terminals 348 face forward, to the second orientation in which the terminals 348 face backward. The power meter 600 is shown as being configured to be secured to a panel in which the user interface 303 extends through an aperture in the panel.

Figure 22:
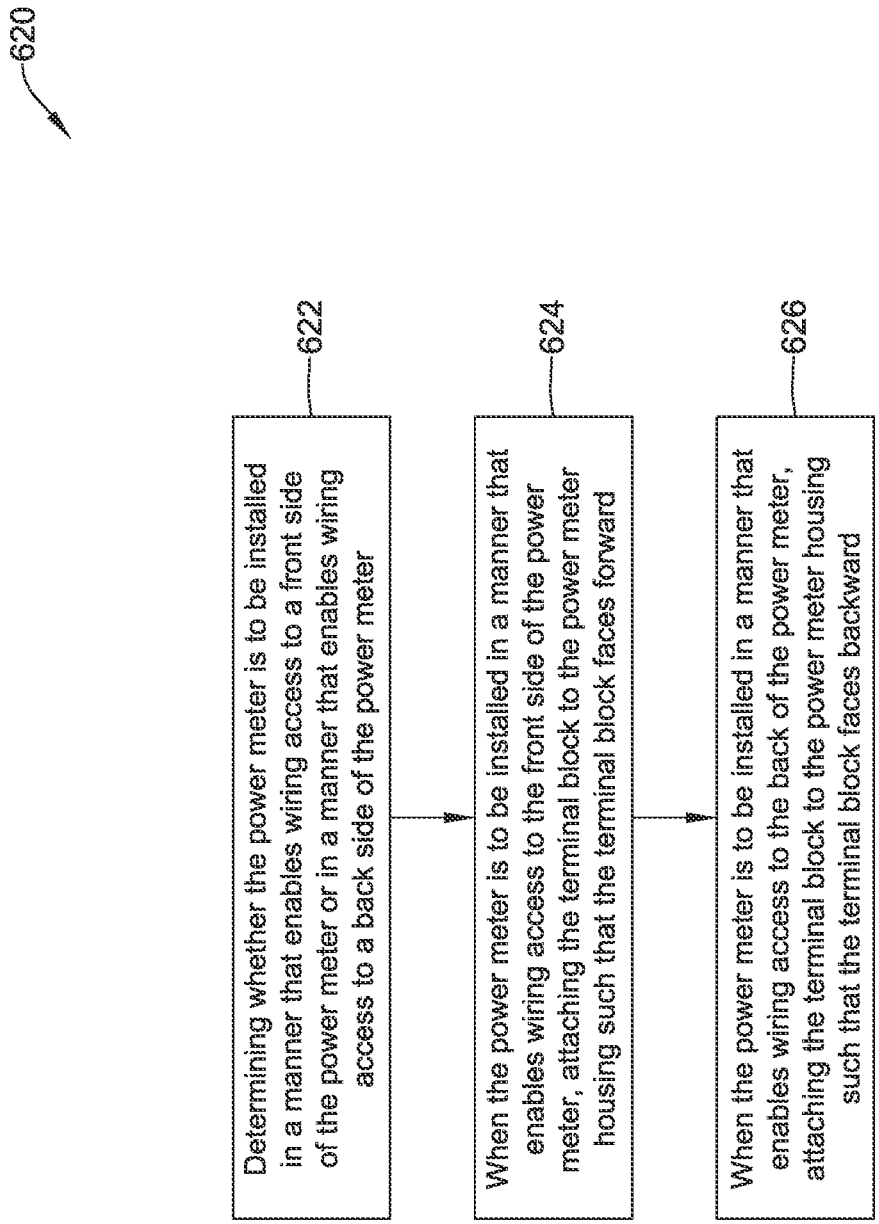
FIG. 22 is a flow diagram showing an illustrative method of installing a power meter.

FIG. 22 is a flow diagram showing an illustrative method 620 of installing a power meter that includes a power meter housing and a terminal block that is movable relative to the power meter housing. As indicated at block 622, the illustrative method 620 includes determining whether the power meter is to be installed in a manner that enables wiring access to a front side of the power meter or in a manner that enables wiring access to a back side of the power meter. In some cases, this includes determining whether the power meter is to be installed on a DIN rail or through an opening in a panel. As indicated at block 624, when the power meter is to be installed in a manner that enables wiring access to the front side of the power meter, the terminal block is attached to the power meter housing such that the terminal block faces forward. As indicated at block 626, when the power meter is to be installed in a manner that enables wiring access to the back of the power meter, the terminal block is attached to the power meter housing such that the terminal block faces backward.

Figure 23:
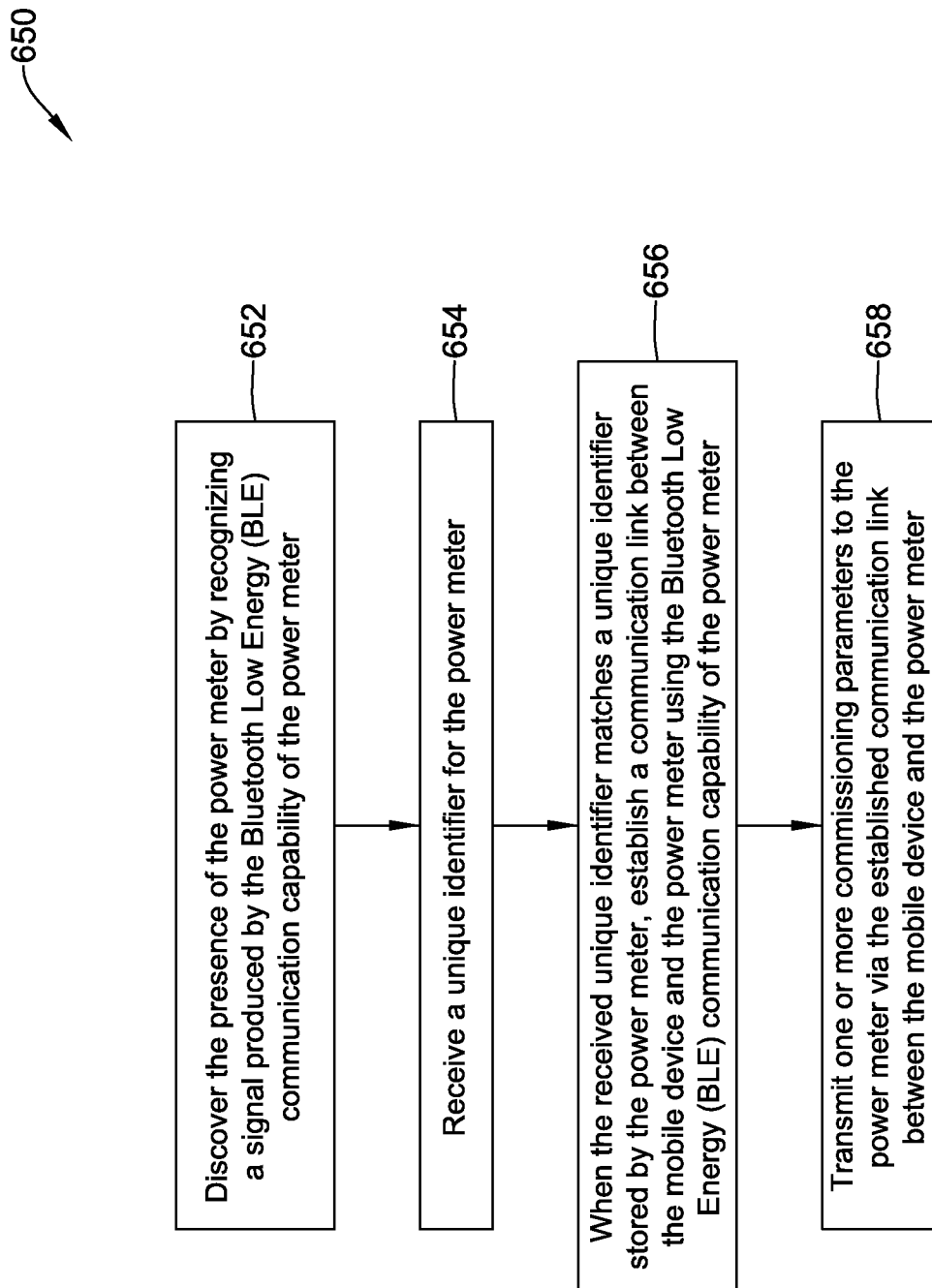
FIG. 23 is a flow diagram showing an illustrative method of commissioning a power meter using a mobile device.

In some instances, the power meters 10, 30, 60, 90, 300, 500 and 600 described herein may undergo a configuration or commissioning process before they are fully functional. For example, in some cases, the power meter utilizes configuration data for a particular current transformer that will be used with the power meter. A variety of other commissioning parameters may also be useful. A mobile device such as a smartphone or a tablet may be used in commissioning a power meter. FIG. 23 is a flow diagram showing an illustrative method 650 in which a mobile device may be used in commissioning a power meter, particularly if the power meter includes a Bluetooth Low Energy (BLE) communication capability.

As indicated at block 652, the mobile device may discover the presence of the power meter by recognizing a signal produced by the Bluetooth Low Energy (BLE) communication capability of the power meter. As indicated at block 654, the mobile device may receive a unique identifier for the power meter. In some cases, the mobile device may receive the unique identifier for the power meter from a user via the user interface of the mobile device. Alternatively, the mobile device may receive the unique identifier for the power meter by decoding a QR code that is captured by a camera of the mobile device.

As indicated at block 656, when the received unique identifier matches a unique identifier stored by the power meter, a communication link may be established between the mobile device and the power meter using the Bluetooth Low Energy (BLE) communication capability of the power meter. As indicated at block 658, one or more commissioning parameters may be transmitted to the power meter via the established communication link between the mobile device and the power meter. In some cases, the mobile device may receive one or more commissioning parameters for the power meter from a user via the user interface of the mobile device. In some cases, one or more of the commissioning parameters that are transmitted to the power meter may include an automatically generated address for use in subsequently addressing the power meter. As additional examples, one or more of the commissioning parameters that are transmitted to the power meter may include one or more of a power meter type, a power meter location, a power meter name, a power meter frequency setting, a primary ratio of a current transformer that is coupled to the power meter, a secondary ratio of a current transformer that is coupled to the power meter, and a direction of power delivery relative to a current transformer that is coupled to the power meter.

In some cases, the one or more commissioning parameters may be part of a template that is stored in a memory of the mobile device. In some cases, a template may be created using the user interface of the mobile device. Alternatively, a template may be downloaded to the mobile device from an external source. The mobile device may in some cases store two or more templates, and the mobile device may solicit or otherwise receive a selection of a selected template from the two or more templates via the user interface of the mobile device. The mobile device may transmit one or more commissioning parameters from the selected template to the power meter via the established communication link between the mobile device and the power meter.

In some cases, the mobile device may receive input from a user to create a project via the user interface of the mobile device, and to assign one or more templates to the project. The mobile device may also receive input from the user to assign the power meter to the project. A project may serve as a convenient depository for templates, parameters, power meter listings, and/or other information for a particular facility or site. This may allow the various technicians working at the site to share templates and/or other information, speed the commissioning process, and/or help improve uniformity of the commissioning of power meters across the facility or site.

In some cases, the mobile device may read a machine-readable code on or adjacent a particular current transformer, and use information encoded in the machine-readable code to calibrate a particular power meter for use with the particular current transformer. Alternatively, or in addition, the mobile device may download an emulation mapping that maps addressable locations of the power meter to corresponding power monitor parameters, and to communicate the emulation mapping to the power meter so that the power meter can emulate a particular power meter type during use. As another example, a mobile device may organize a plurality of power meters to which a communication link has been established into two or more groups of power meters, where each of the power meters within a particular group can be commissioned together in a single commissioning process.

Figure 24:
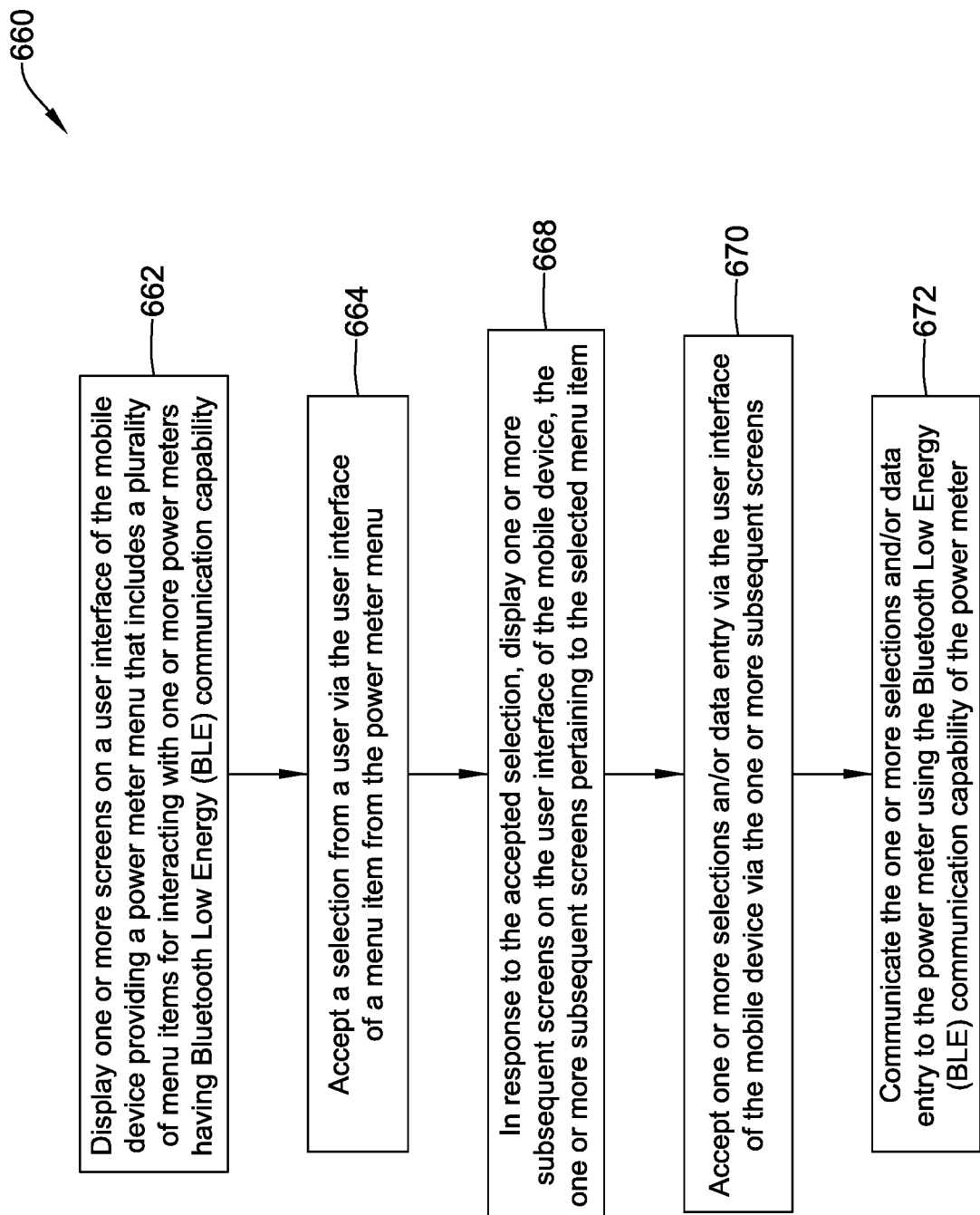
FIG. 24 is a flow diagram showing an illustrative method of commissioning a power meter using a mobile device.

FIG. 24 is a flow diagram showing an illustrative method 660 of installing a power meter that includes a power meter housing and a terminal block that is movable relative to the power meter housing. As indicated at block 662, one or more screens may be displayed on a user interface of the mobile device that provides a power meter menu that includes a plurality of menu items for interacting with one or more power meters having Bluetooth Low Energy (BLE) communication capability. As indicated at block 664, a selection from a user may be accepted via the user interface of a menu item from the power meter menu. As indicated at block 668, and in response to the accepted selection, one or more subsequent screens may be displayed on the user interface of the mobile device that pertain to the selected menu item. As indicated at block 670, one or more selections and/or data entry may be selected via the user interface of the mobile device via the one or more subsequent screens. As indicated at block 672, the one or more selections and/or data entry may be communicated to the power meter using the Bluetooth Low Energy (BLE) communication capability (or other communication capability) of the power meter.

In some cases, the selected menu item may cause the mobile device to display one or more subsequent screens that can be used to establish a BLE (or other) communication link with one or more power meters. The one or more subsequent screens may enable the user to solicit entry into, for example, one or more of a power meter setup menu, a power meter monitoring menu and a current transformer replacement menu.

Figure 25:
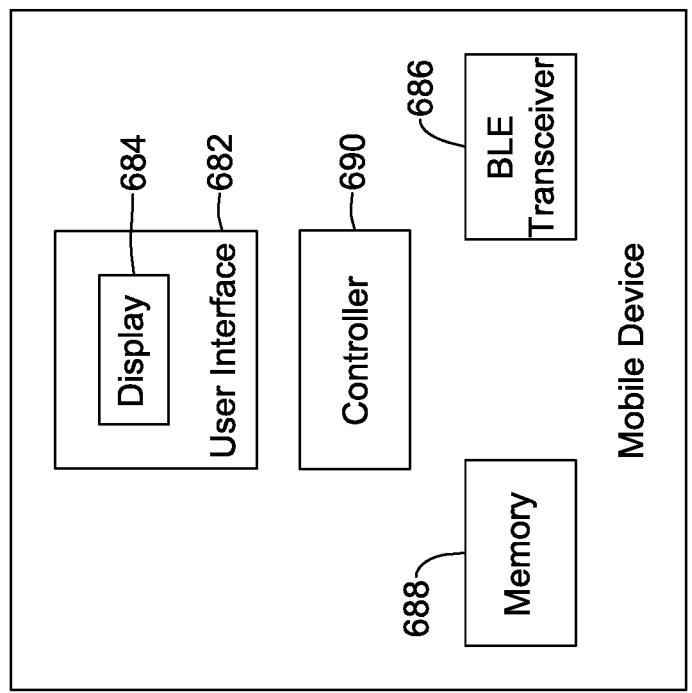
FIG. 25 is a schematic block diagram of an illustrative mobile device that may be used in commissioning a power meter.

FIG. 25 is a schematic block diagram of a mobile device 680 that is configured to communicate with a power meter having Bluetooth Low Energy (BLE) (or other) communication capability. The illustrative mobile device 680 includes a user interface 682 having a display screen 684. The user interface 682 may be configured to permit display of information on the display screen 684 as well as to accept inputs from a user via the user interface 682. The user interface 682 may be a touch screen display, for example. The mobile device 680 includes a BLE transceiver 686 and a memory 688 that stores an executable application that, when executed, enables the mobile device 680 to establish BLE communication with a power meter and to communicate information between the mobile device 680 and the power meter. A controller 690 may be operably coupled with the user interface 682, the BLE transceiver 686 and the memory 688 and may be configured to execute the executable application that is stored within the memory 688. In some cases, executing the executable application, such as by the controller 690, causes the mobile device 680 to display one or more screens on the user interface 682 of the mobile device 680 that provide a power meter menu that includes a plurality of menu items for interacting with one or more power meters having BLE communication capability. The mobile device 680 may accept a user selection of a menu item from the power meter menu and in response, may display one or more subsequent screens on the user interface 682 of the mobile device 680, the one or more subsequent screens pertaining to the selected menu item. In some cases, one or more selections and/or data entry may be accepted via the user interface 682 of the mobile device 680 via the one or more subsequent screens. In some instances, the one or more selections and/or data entry may be communicated to the power meter using the Bluetooth Low Energy (BLE) communication capability of the power meter.

Figure 26:
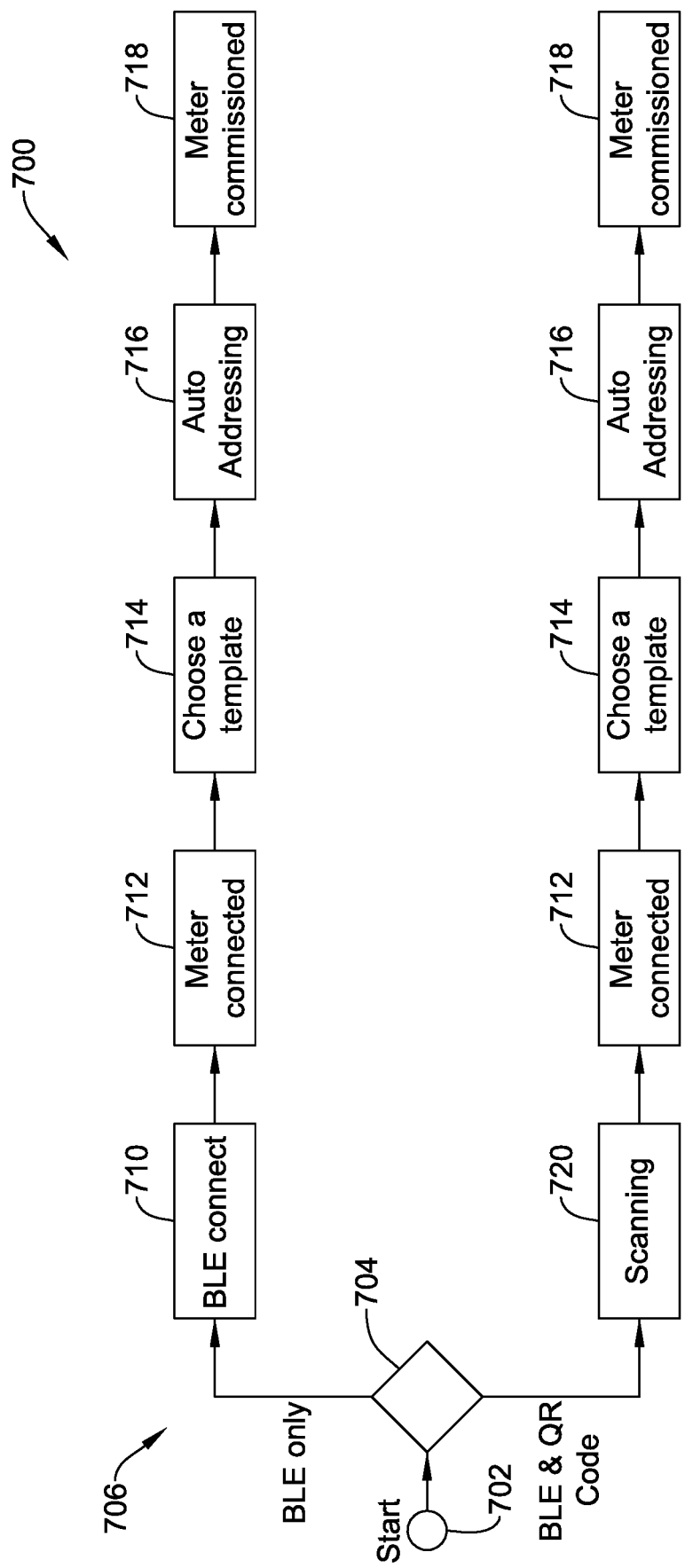
FIG. 26 is a flow diagram showing an illustrative method of discovering one or more power meters using a mobile device.

FIG. 26 is a flow diagram showing an illustrative method 700 of using a mobile device to identify, establish communication with, and commission one or more power meters that are equipped with a Bluetooth Low Energy (BLE) (or other) communication capability. This may include any of the power meters 10, 30, 60, 90, 300, 500 and 600 described herein. The method 700 begins at a starting point 702, and initially proceeds to a decision block 704 at which a determination is made whether the mobile device is to communicate with the power meters using only BLE, or if a QR code or other method of quickly reading identification data is available. If BLE only, which may be slower, the mobile device proceeds down a path 706. If a QR code or other source of mobile device-readable data is available in addition to BLE, the mobile device proceeds down a path 708.

The path 706 begins with the mobile device establishing BLE communication with a power meter, as indicated at block 710. This may include, for example, selecting a particular power meter that may be listed on a list of nearby BLE-enabled devices including power meters. In some cases, a power meter may include a pin code, such as printed on a sticker or otherwise printed on the power meter, or perhaps displayed by a display of the power meter. The user may then enter the pin code on the mobile device to establish a BLE connection between the mobile device and a particular power meter. Once a BLE connection has been established, control passes to block 712, which may include displaying a list of BLE-connected power meters, and allowing connections to be made to additional power meter. In some cases, and as noted at block 714, a template may be selected to facilitate commissioning of a particular power meter or a group of power meters. The power meters may be automatically assigned addresses rather than the user having to manually input an address for each power meter, as noted at block 716. Control passes to block 718, at which point commissioning is complete.

The path 708 begins with the mobile device establishing BLE communication with a power meter by scanning the QR code, as indicated at block 720. Once a BLE connection has been established, control passes to block 712, which may include displaying a list of BLE-connected power meters, and allowing connections to be made to additional power meter. In some cases, and as noted at block 714, a template may be selected to facilitate commissioning a particular power meter or a group of power meters. The power meters may be automatically assigned addresses, as noted at block 716. Control passes to block 718, at which point commissioning is complete.

FIGS. 27 through 47 are illustrative screen shots showing screens that may be displayed by a mobile device when using the mobile device to commission one or more power meters. Starting at FIG. 27, a home screen 800 is displayed. The home screen 800 may be displayed by a mobile device after a user logs into the application running on the mobile device. It will be appreciated that the home screen 800 provides several options for the user to select from, including a Projects icon 802, an Import Projects icon 804, a Templates icon 806 and a Settings icon 808. Depending on which icon is selected, the mobile device will display an appropriate screen or series of screens on the user interface of the mobile device. If the user selects the Templates icon 806, for example, the mobile device will display a screen 810 such as shown in FIG. 28.

The screen 810 provides the user with a number of different templates to choose from. In some cases, for example, the available templates may be organized into Full Templates 812, Communication Templates 814 and Scheduler Templates 816, with several templates organized under each of the identified types of templates. The user can decide to minimize or otherwise hide the templates listed under a particular identified type of templates by pressing a minimize arrow 820. The user can scroll through templates and can select one of the listed templates. In some cases, if they desire, the user can create a new template by pressing the New Templates icon 818. Sometimes a new templated may be created by modifying an existing template and saving the modified template as a new template.

Figure 27:
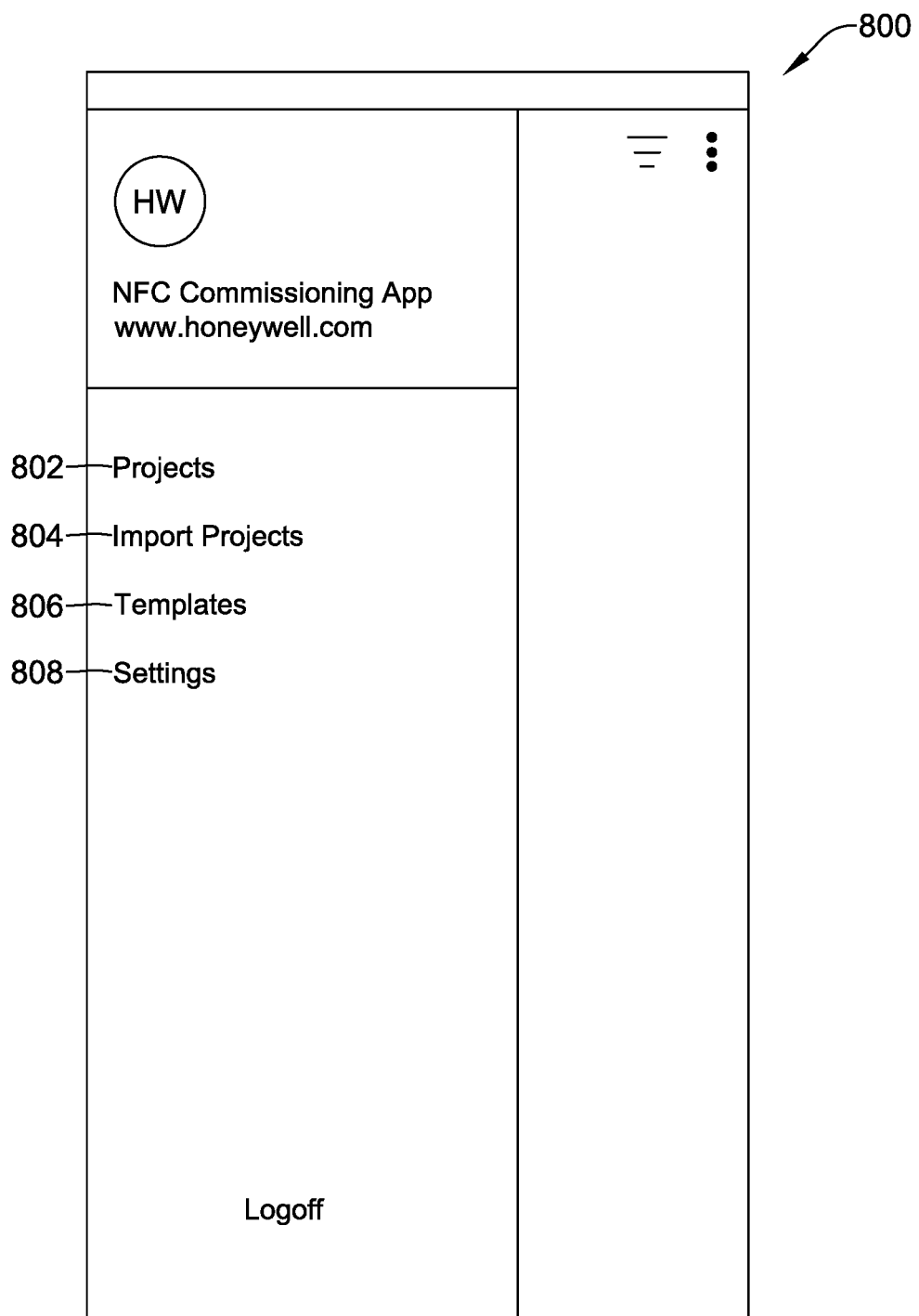
Figure 28:
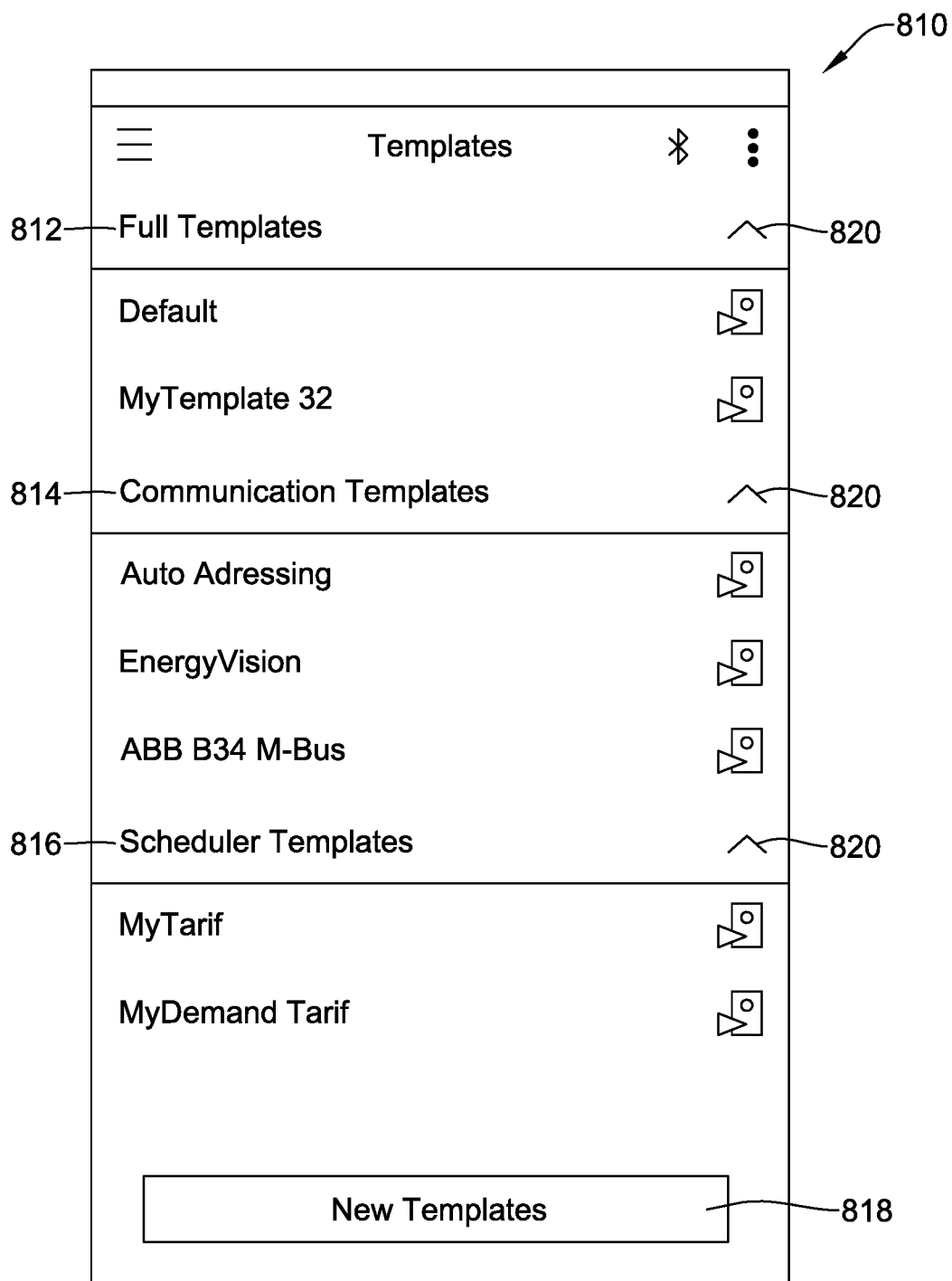
Figure 29:
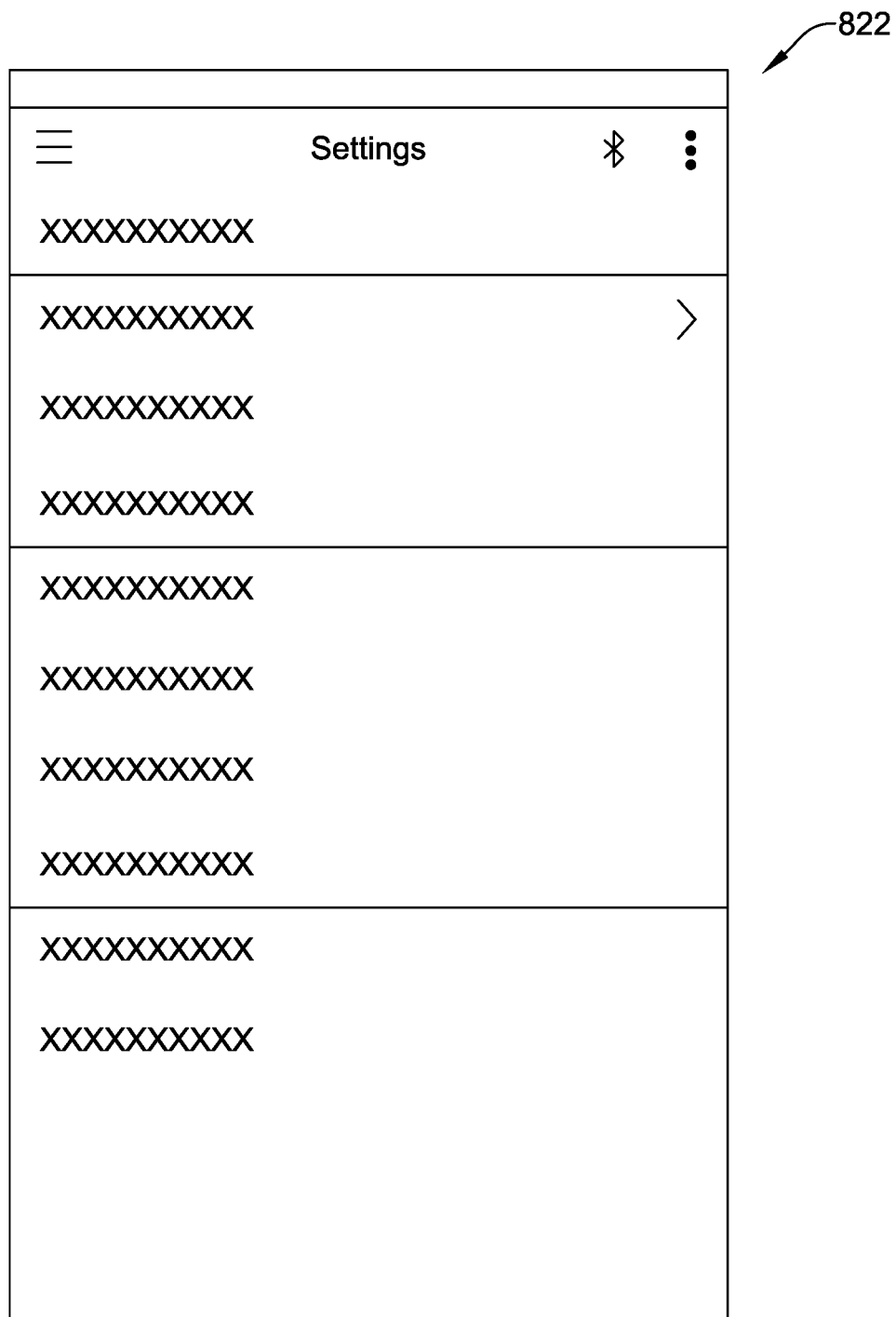

Returning briefly to the screen 800 shown in FIG. 27, if the user selects the Settings icon 808, the mobile device may display a screen 822 as shown in FIG. 29. The screen 822 lists a plurality of different settings, which are generically listed on the screen 822. In some cases, one of the listed settings may be selected, which may cause the mobile device to display one or more subsequent screens.

Figure 30:
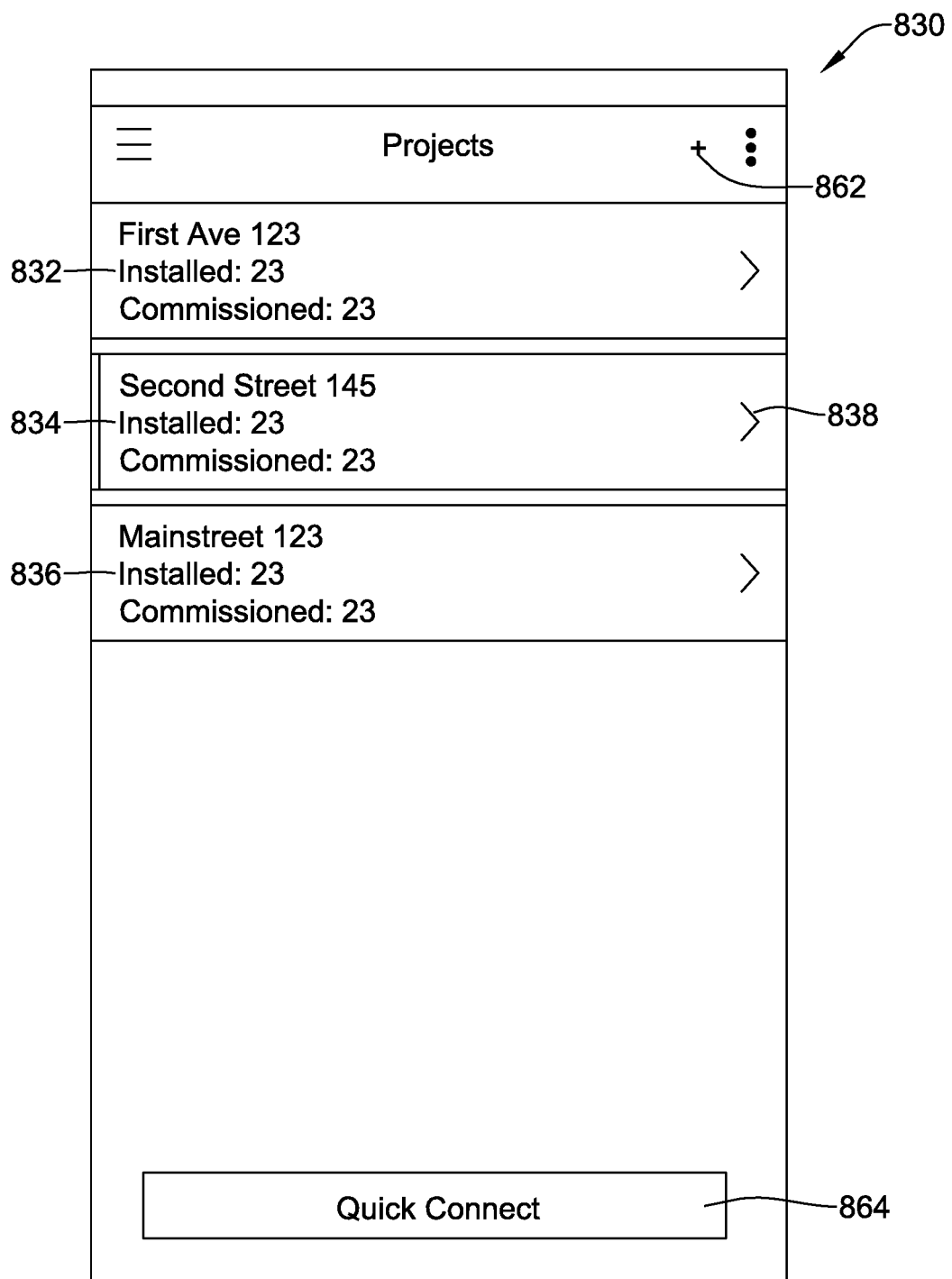
Figure 31:
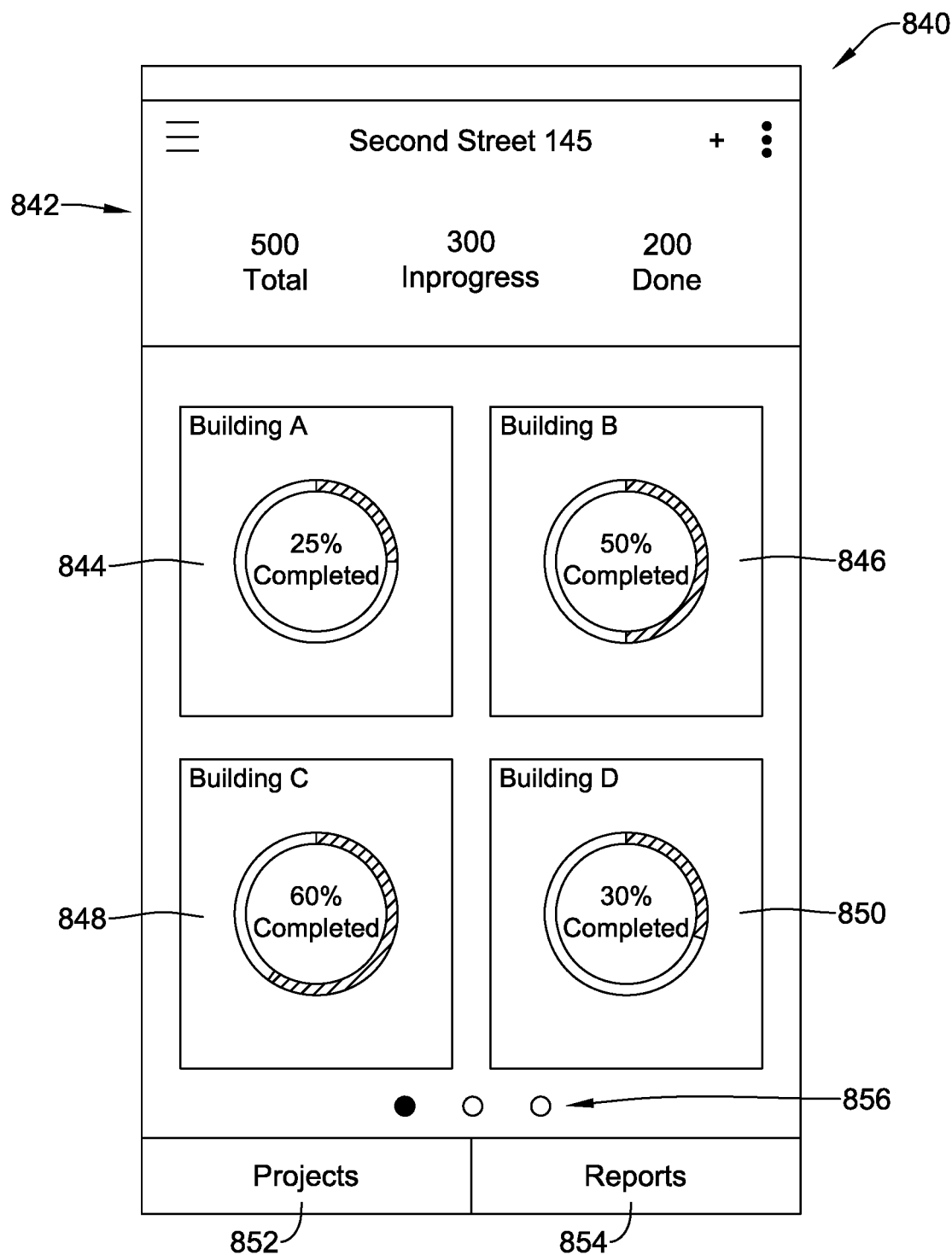
Figure 32:
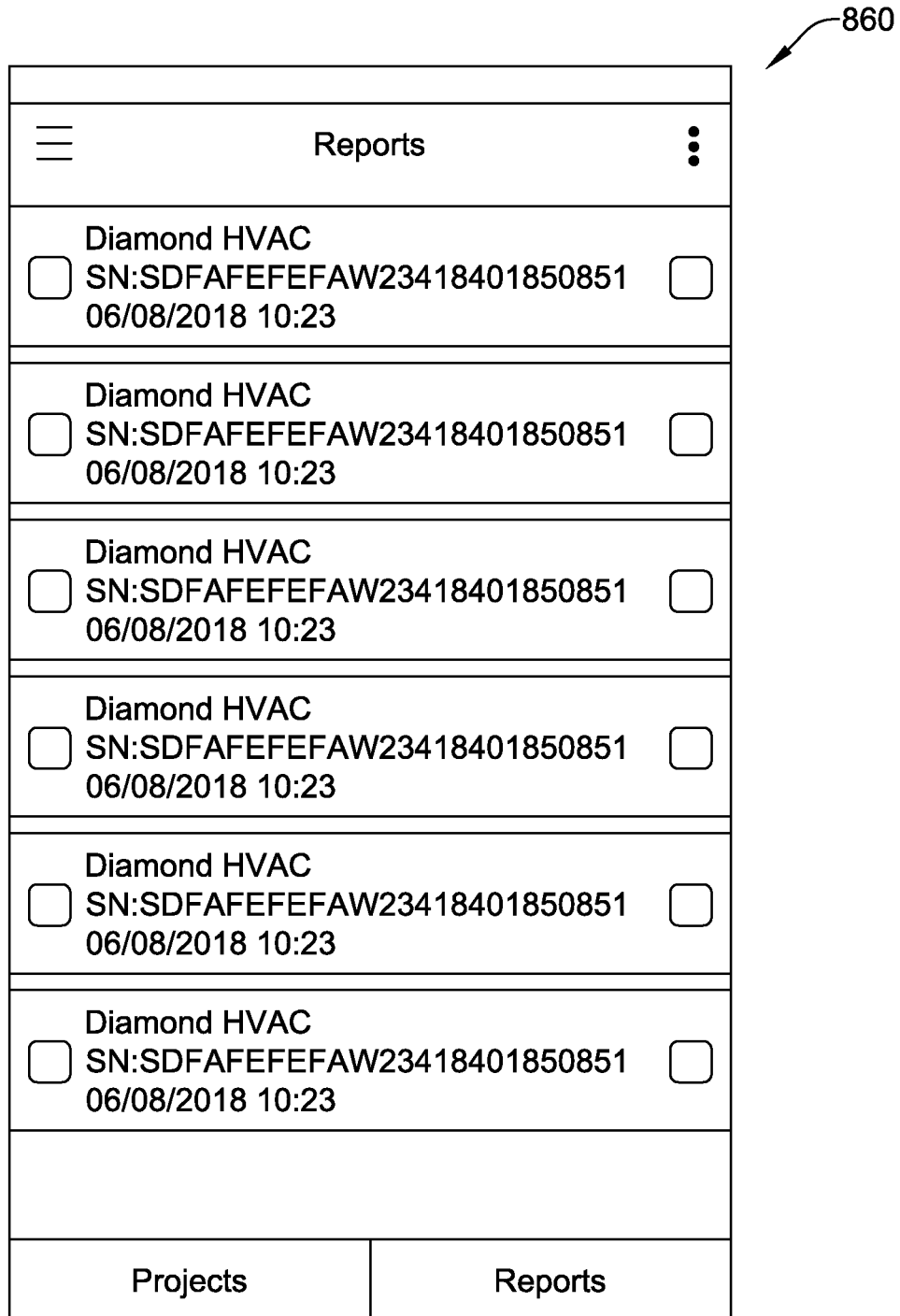
Figure 33:
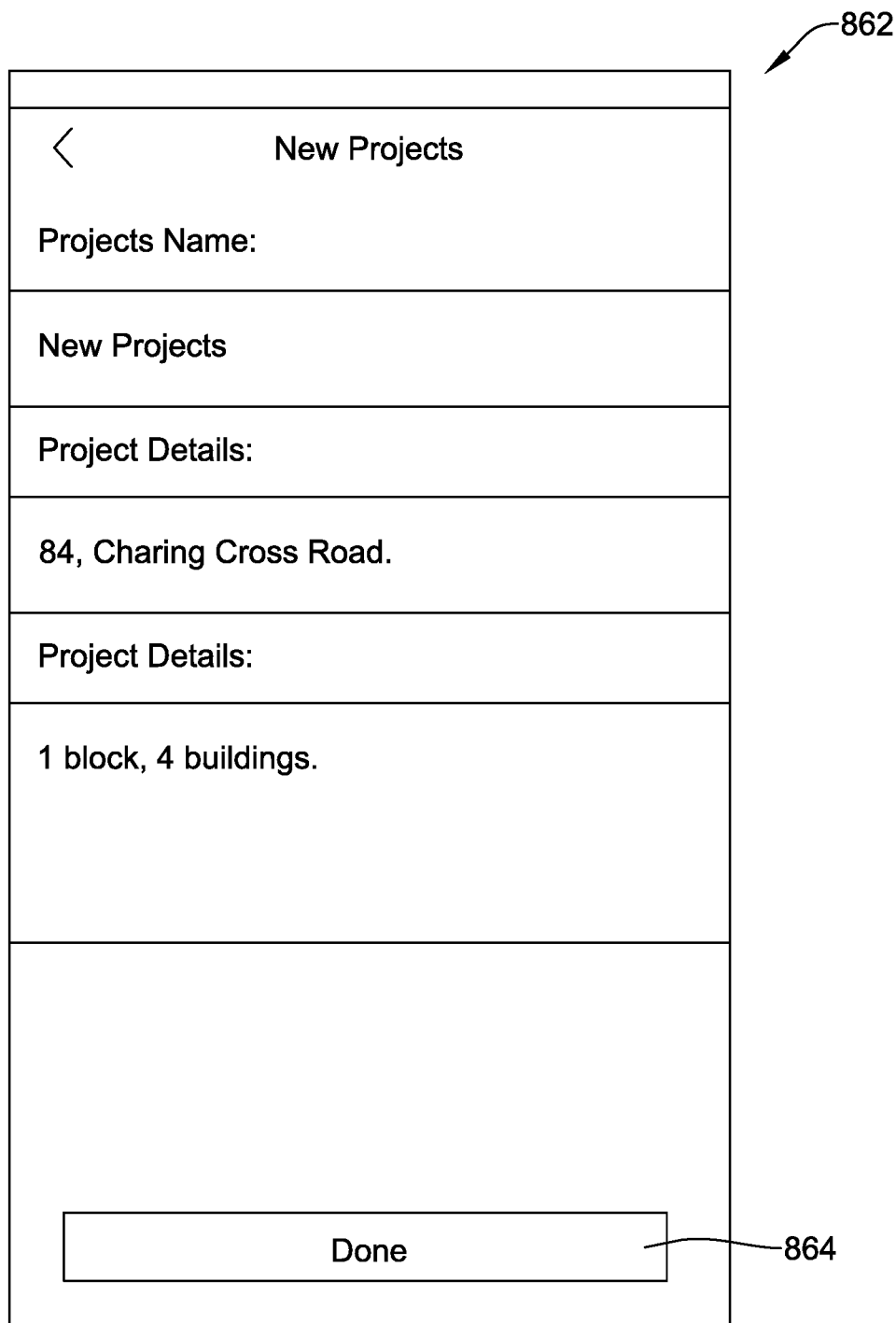

Returning briefly to the screen 800 shown in FIG. 27, if the user selects the Projects icon 802, the mobile device may display a screen 830 such as shown in FIG. 30. The screen 830 provides a list of projects. As shown, the list of projects includes a First Ave 123 project 832, a Second Street 145 project 834 and a Mainstreet 123 project 836. As shown, the Second Street 145 project 834 is highlighted, so pressing an arrow 838 causes the mobile device to display a screen 840, as shown in FIG. 31. The screen 840 includes a status summary 842 and a first page of projects labeled Building A 844, Building B 846, Building C 848 and Building D 850. As indicated by scroll buttons 856, there are a total of three pages that the user can scroll between. The screen 840 also includes a Projects button 852 and a Reports button 854 that may be used to solicit additional screens. In this particular case, the Projects button 852 is highlighted. Selecting the Projects button 852 may cause the mobile device to display a screen 860 as shown in FIG. 32. The screen 860 may include a listing of projects.

Returning to the screen 830 shown in FIG. 30, it can be seen that the screen 830 includes a PLUS icon 862 that may be used to add new projects as well as a Quick Connect button 864 that may be used to establish communication with a particular device such as a particular power meter. If the user selects the PLUS icon 862, the mobile device may display a screen that allows the user to create a new project.

Figure 34:
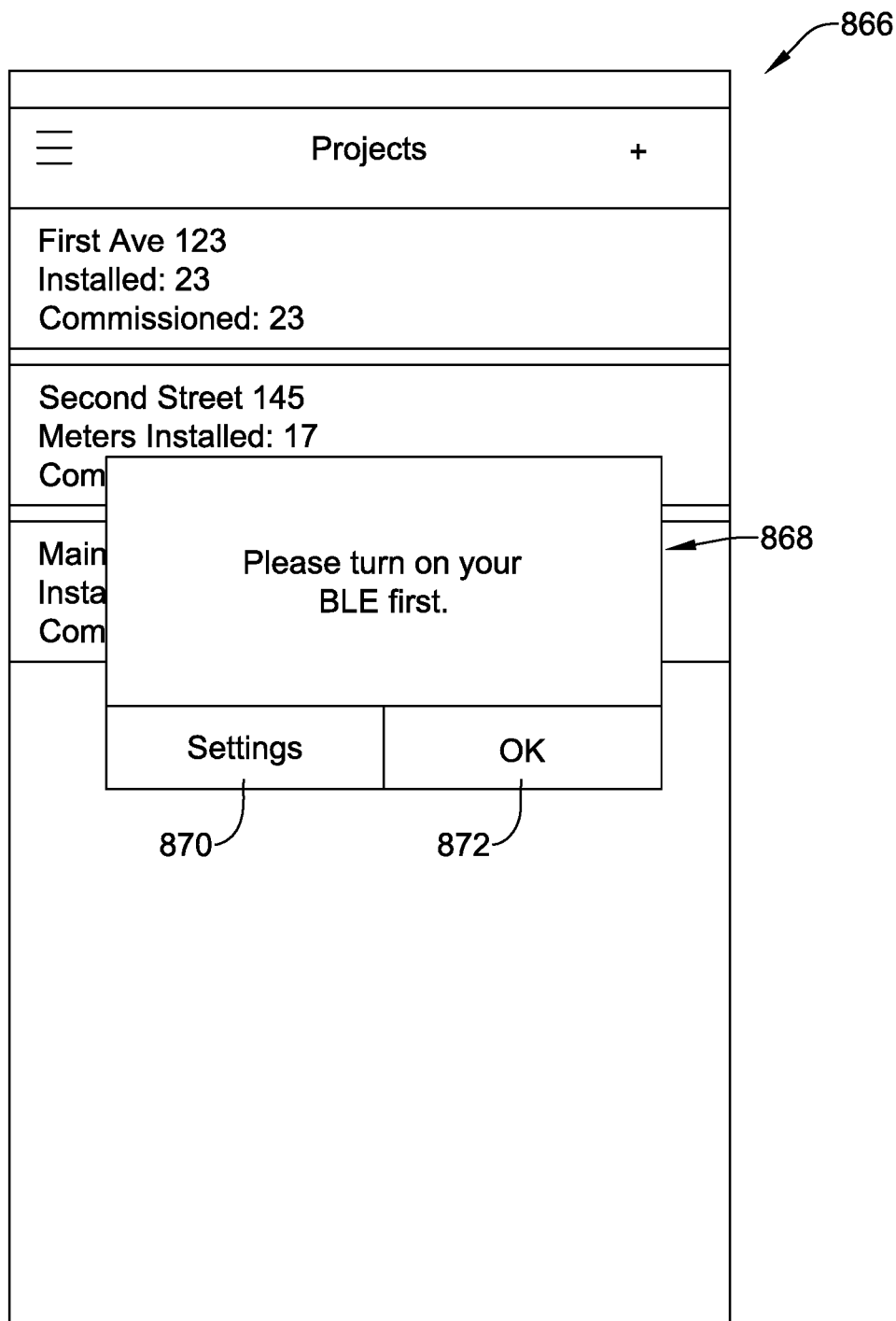

If a user indicates that they wish to add a new power meter, and the mobile device determines that the BLE capability is not turned on, the mobile device may display a screen 866 as shown in FIG. 34. In FIG. 34, an information balloon 868 has been superimposed onto a screen. The information balloon 868 includes a Settings button 870, which may for example be used to access the mobile device's BLE capabilities, as well as an OK button 872 that the user can use to acknowledge the information balloon 868 and in some cases cause the mobile device to remove the information balloon 868.

Figure 35:
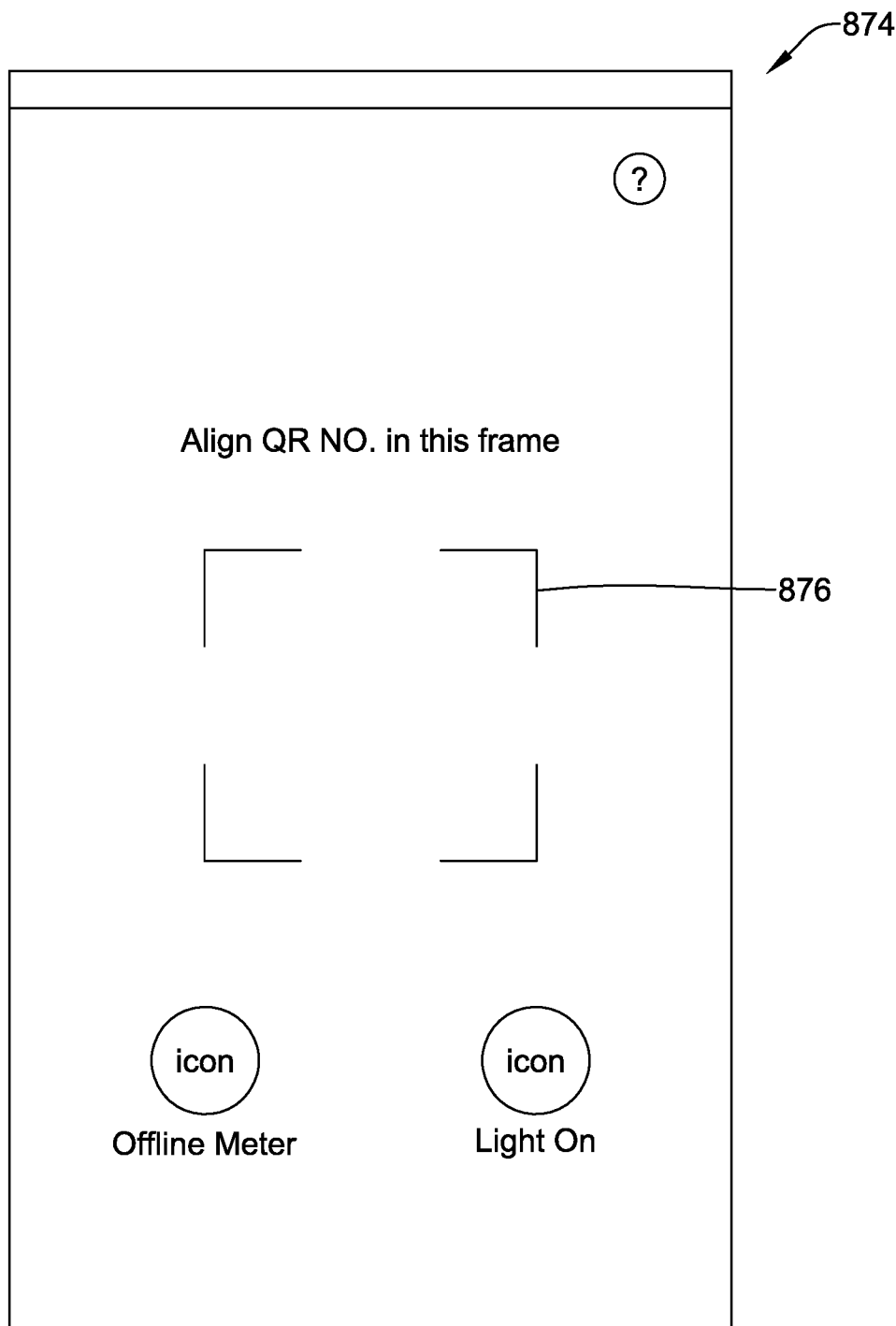
Figure 36:
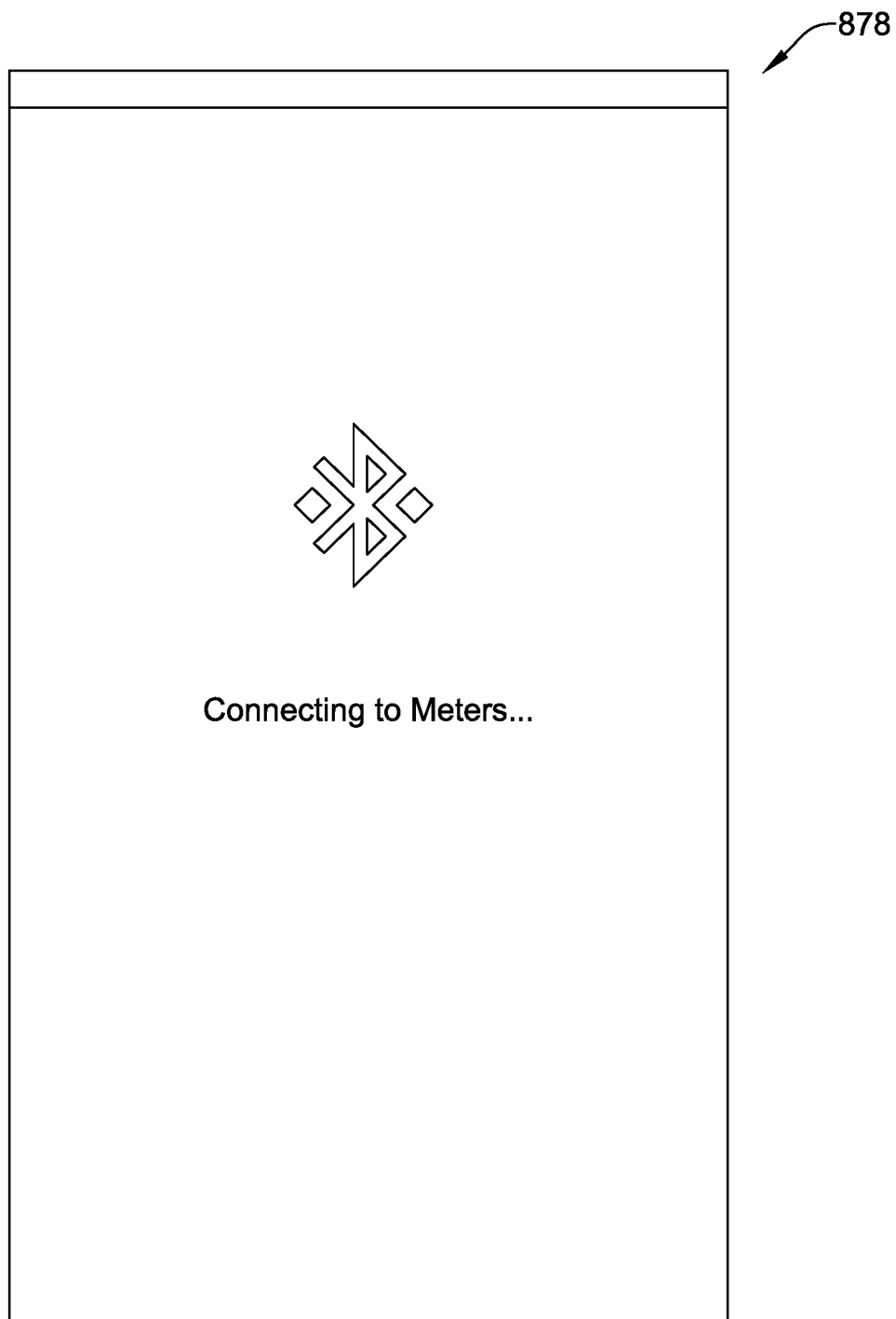
Figure 37:
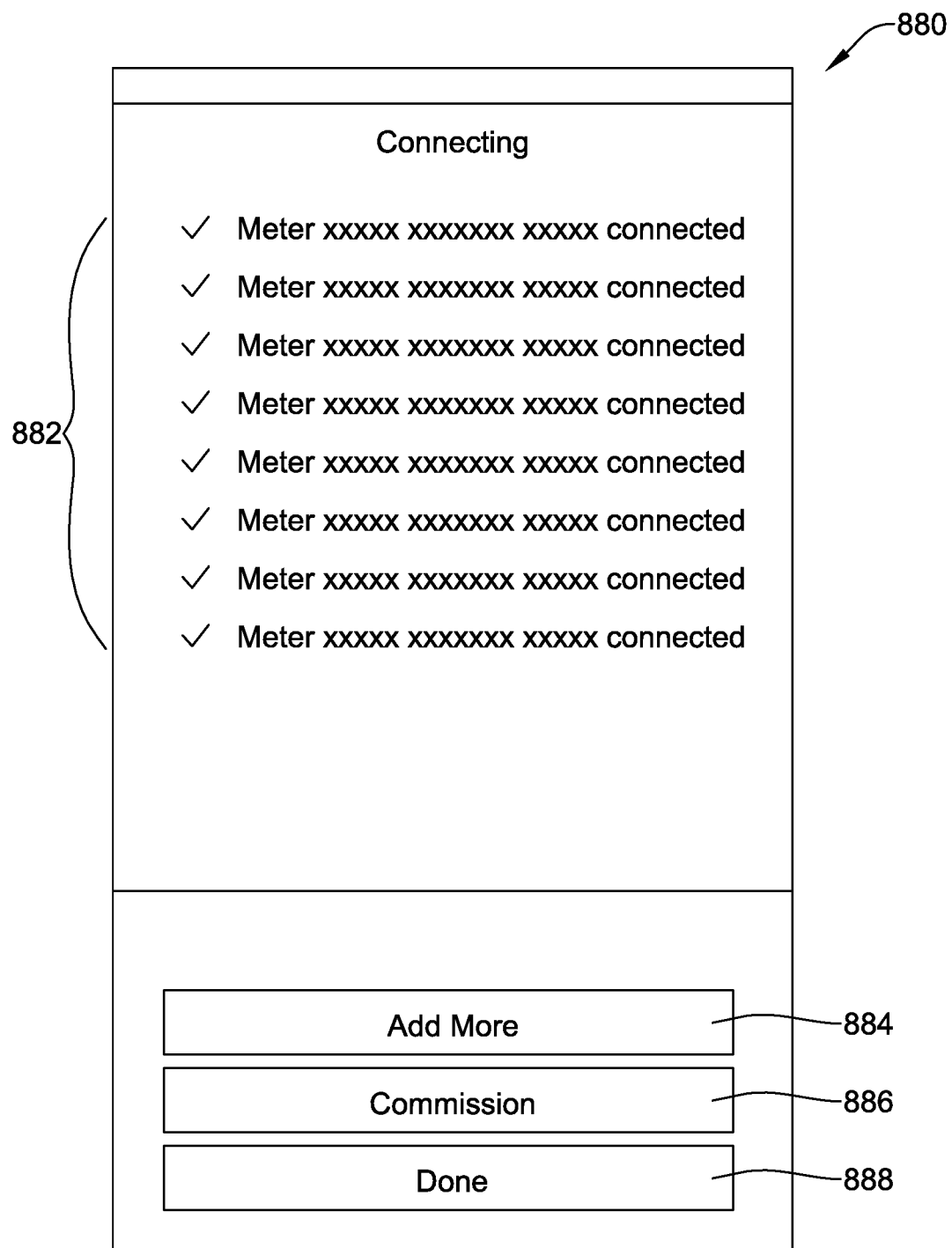

FIG. 35 shows a screen 874 that may be displayed by the mobile device if a particular power meter has a QR code that can be scanned. The screen 874 includes an alignment frame 876 to help the user accurately scan the QR code. After scanning the QR code, the mobile device may display a screen 878 that indicates to the user that the mobile device is in the process of establishing BLE connections with the power meters. Once connected, the mobile device may display a screen 880 as shown in FIG. 37. The screen 880 includes a list 882 of connected power meters. The screen 880 also includes an Add More button 884, a Commission button 886 and a Done button 888. The Add More button 884 may be used to connect additional power meters. The Commission button 886 may be selected to proceed with commissioning the connected power meters. The Done button 888, if selected, may cause the mobile device to revert to a previous screen, such as but not limited to the Home Screen 800 shown in FIG. 27.

Figure 38:
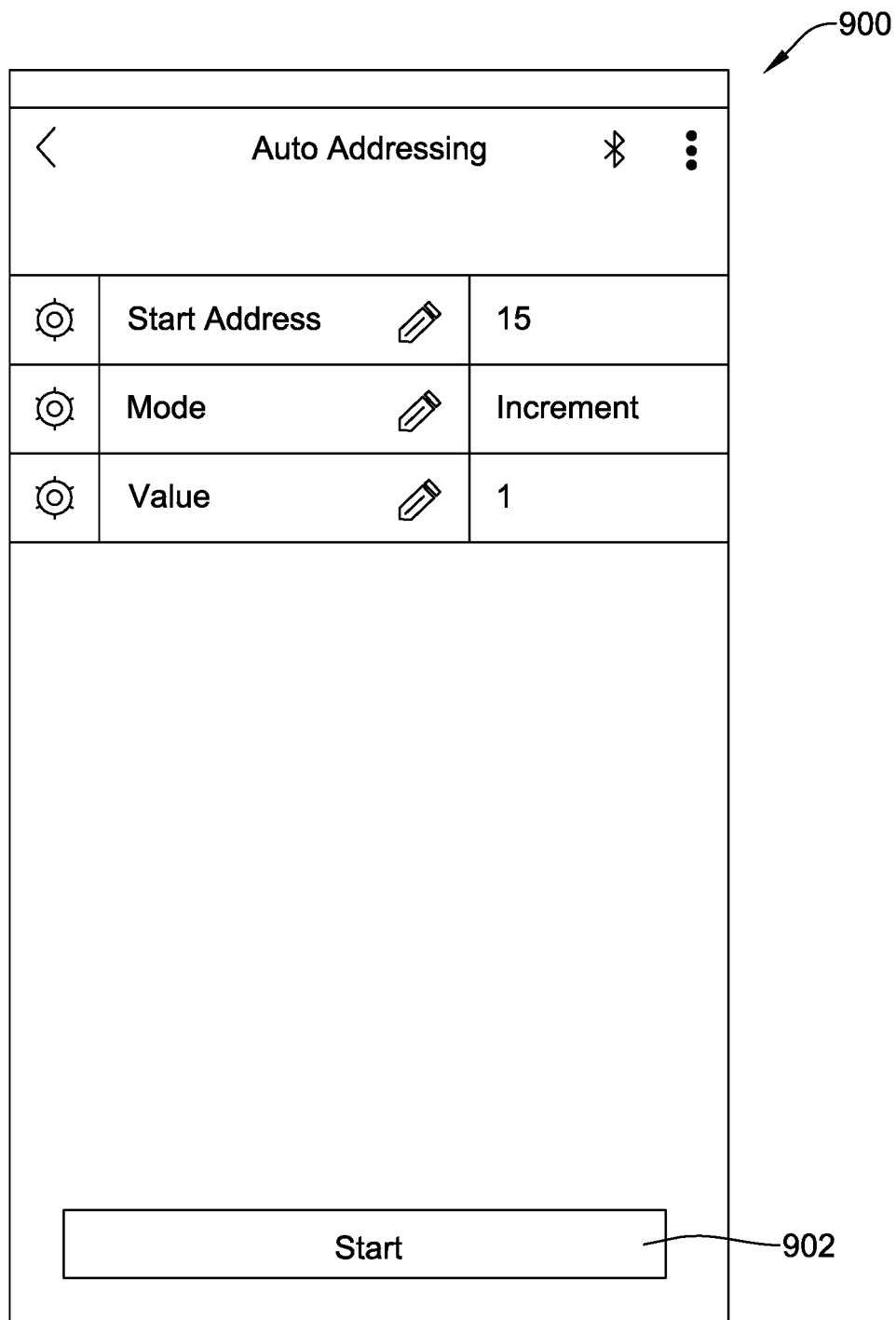
Figure 39:
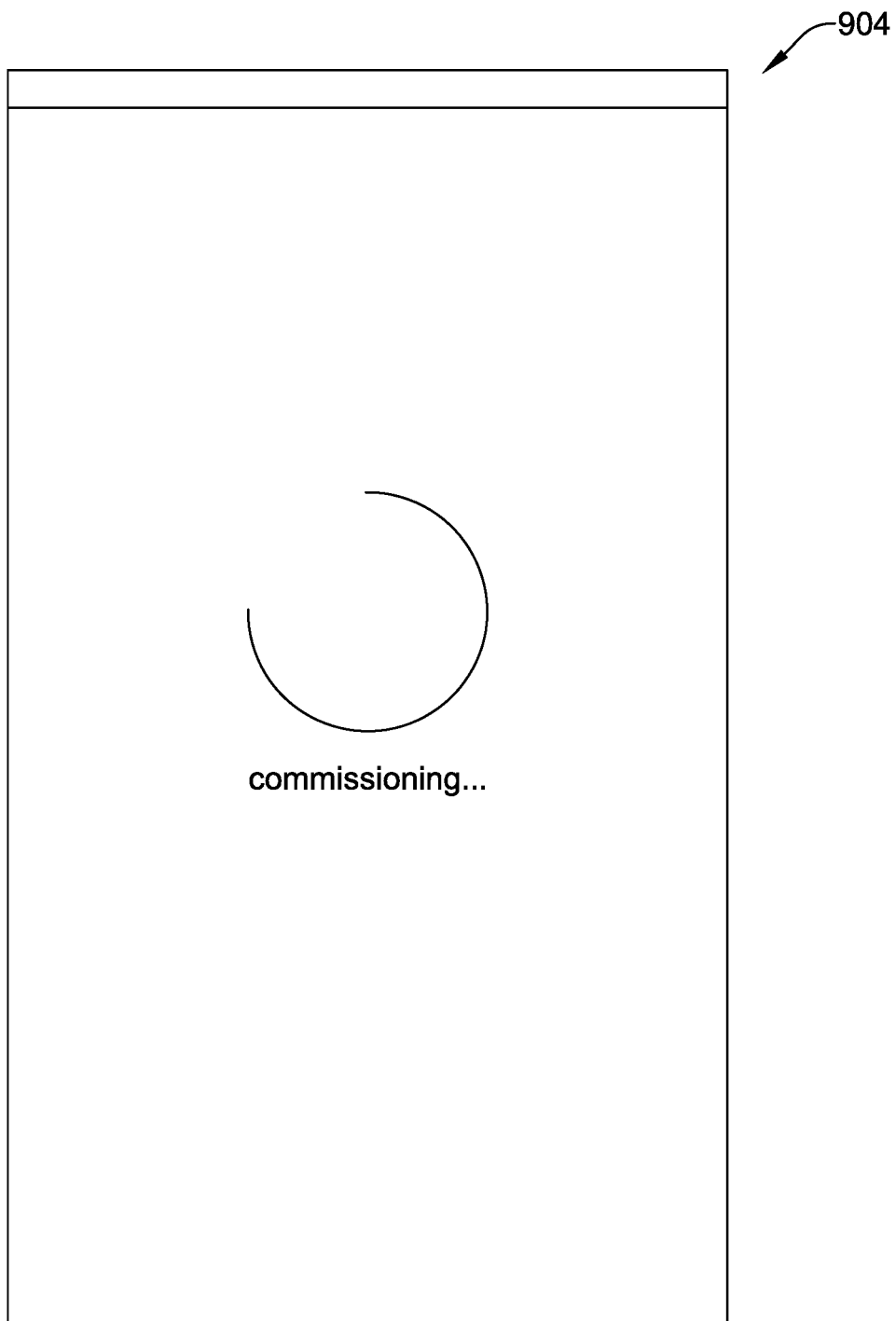
Figure 40:
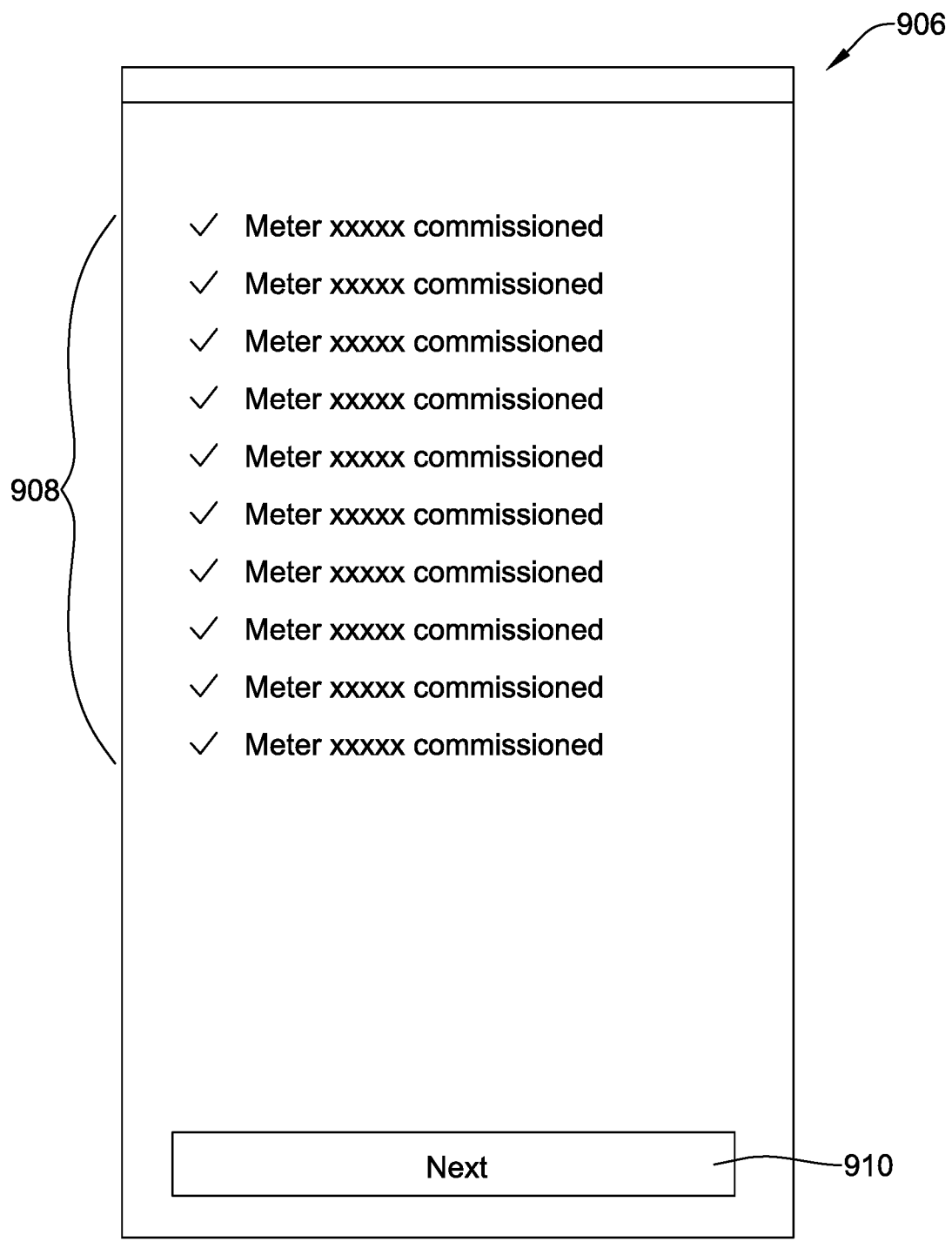
Figure 41:
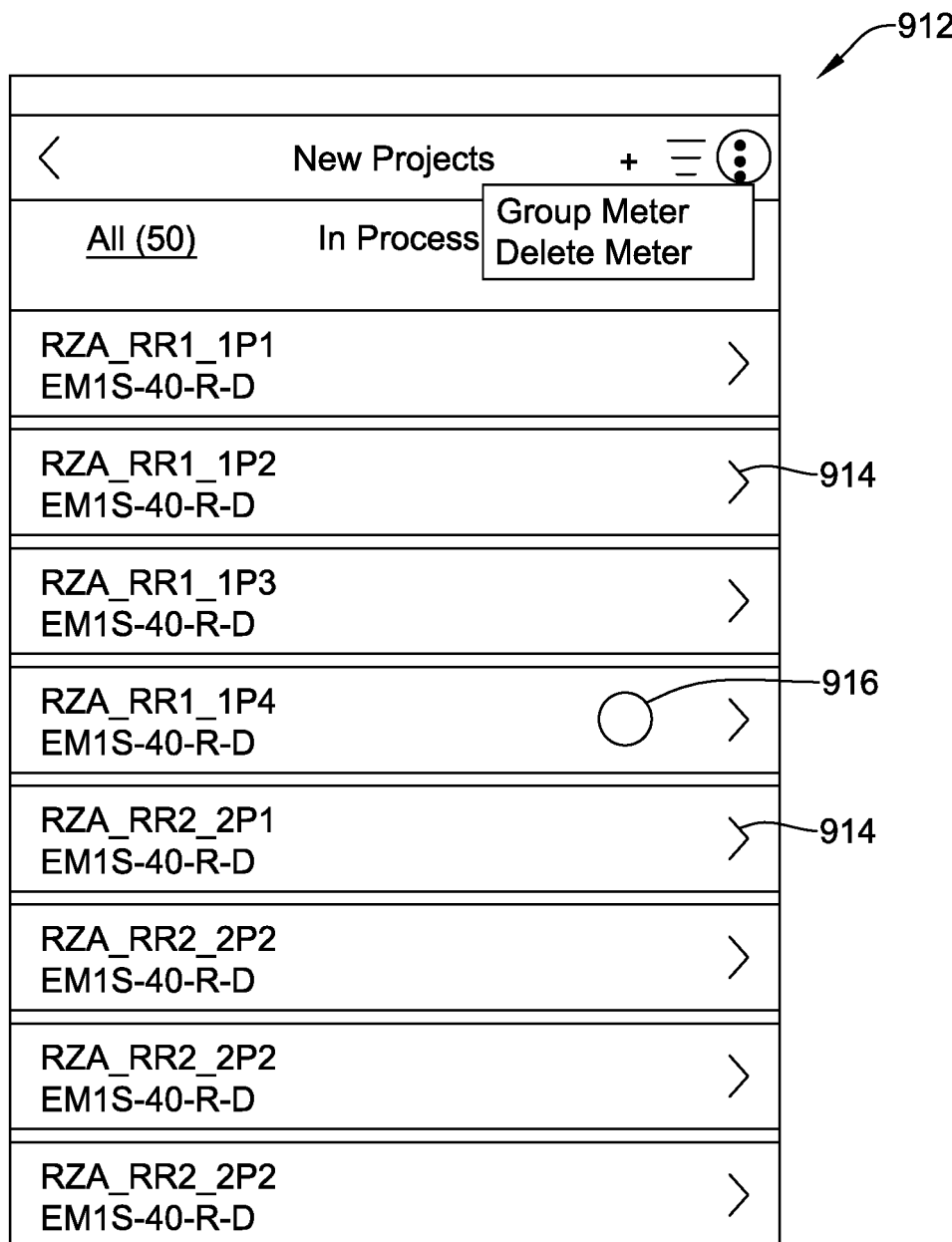

If the user selects the Commission button 886, the mobile device may display a screen 900 as shown in FIG. 38. The screen 900 enables the user to start with auto addressing, which automatically determines BLE addresses for each of the connected power meters. A Start button 902 enables the user to start the commissioning process. Pressing the Start button 902 causes the mobile device to display a screen 904, shown in FIG. 39, that informs the user that the mobile device is in the process of commissioning the connected power meters. Once commissioning has been completed, the mobile device may display a screen 906 as shown in FIG. 40. The screen 906 includes a list 908 of commissioned power meters as well as a Next button 910. In some cases, selecting the Next button 910 may cause the mobile device to display a screen 912 as shown in FIG. 41. The screen 912 shows a list of power meters, any one of which may be selected via an arrow 914. In some cases, a colored dot 916 may be illuminated next to one of the listed power meters to indicate that one or more problems have been detected with that particular power meter.

Figure 42:
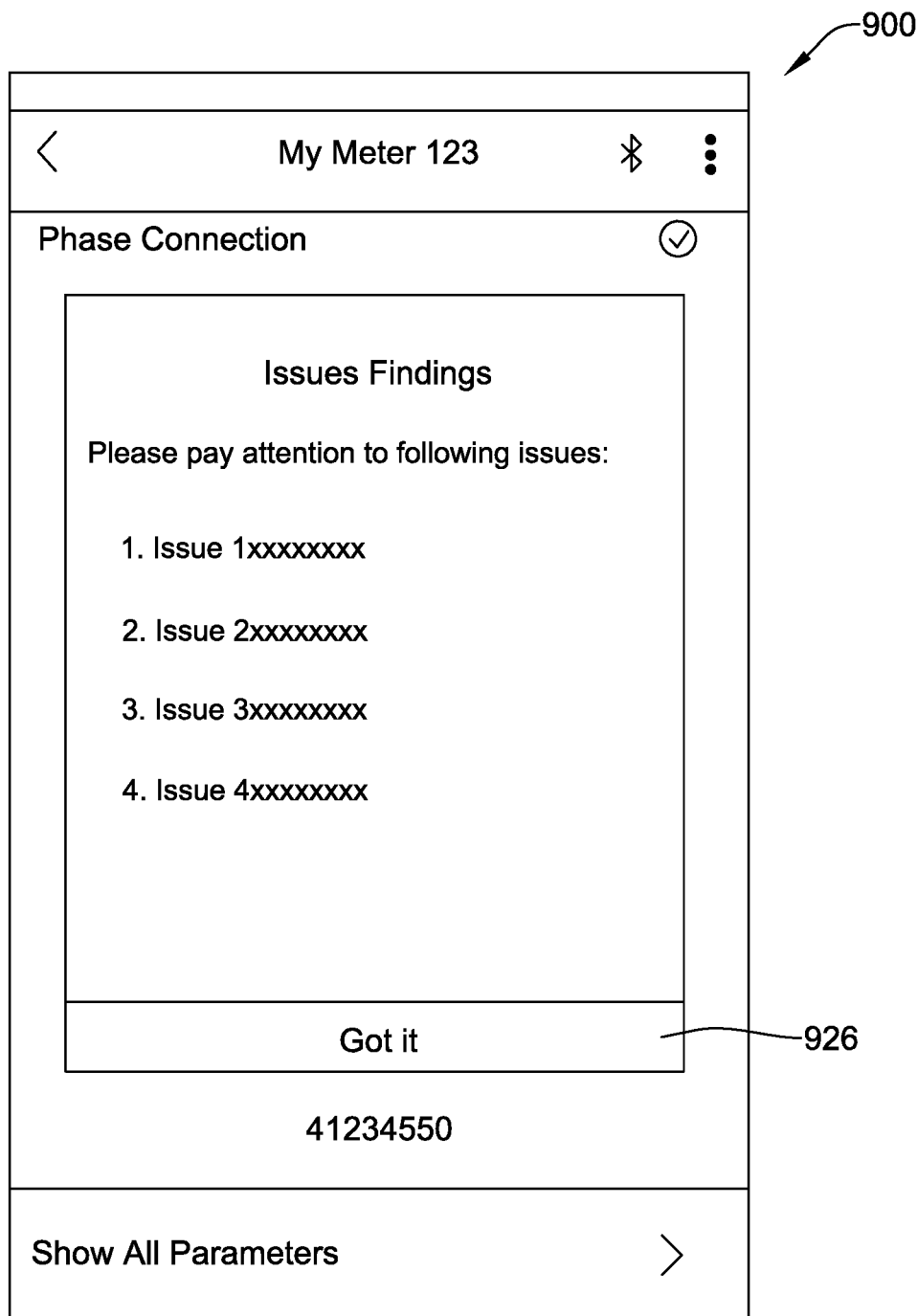
Figure 43:
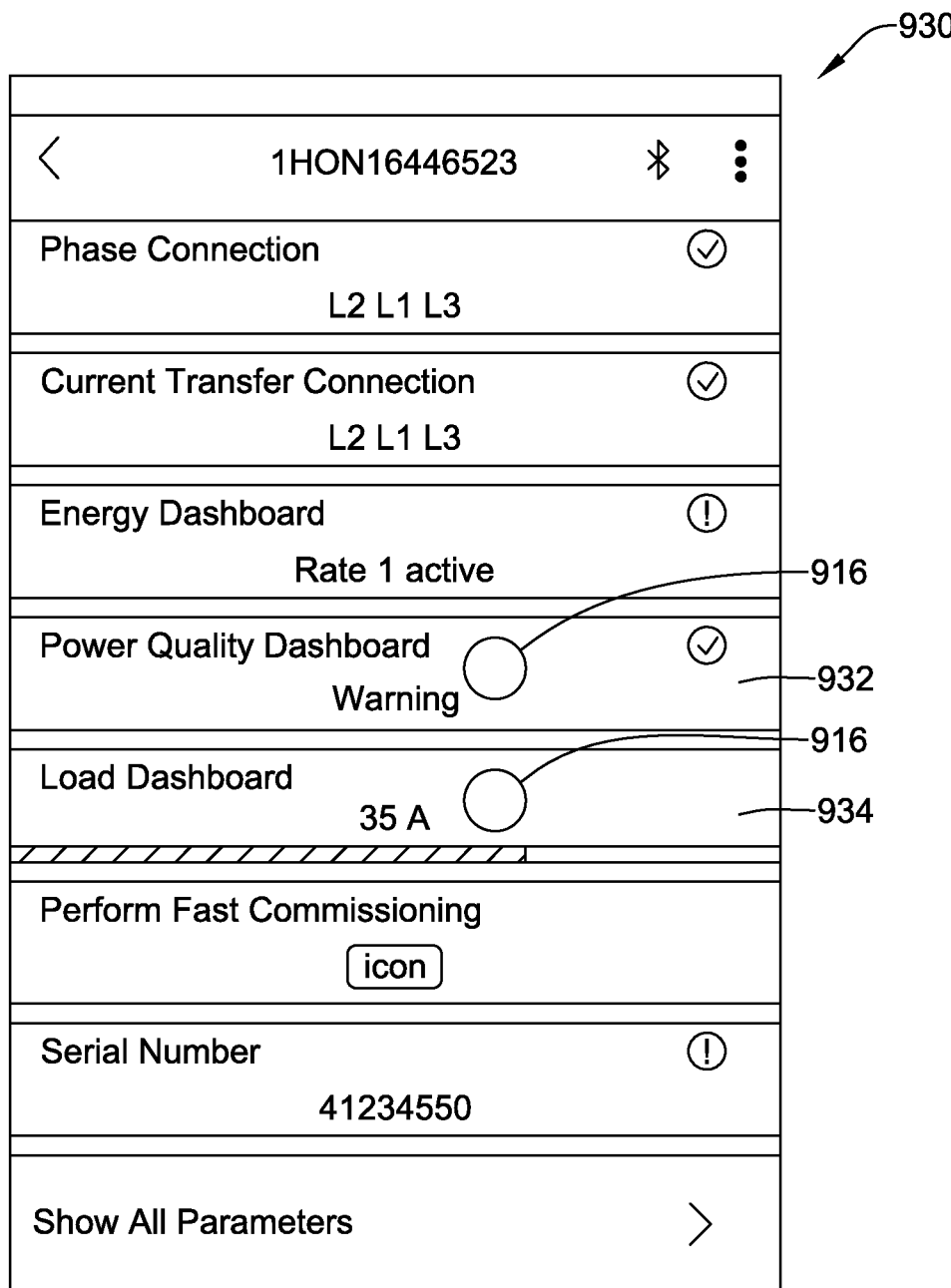
Figure 45:
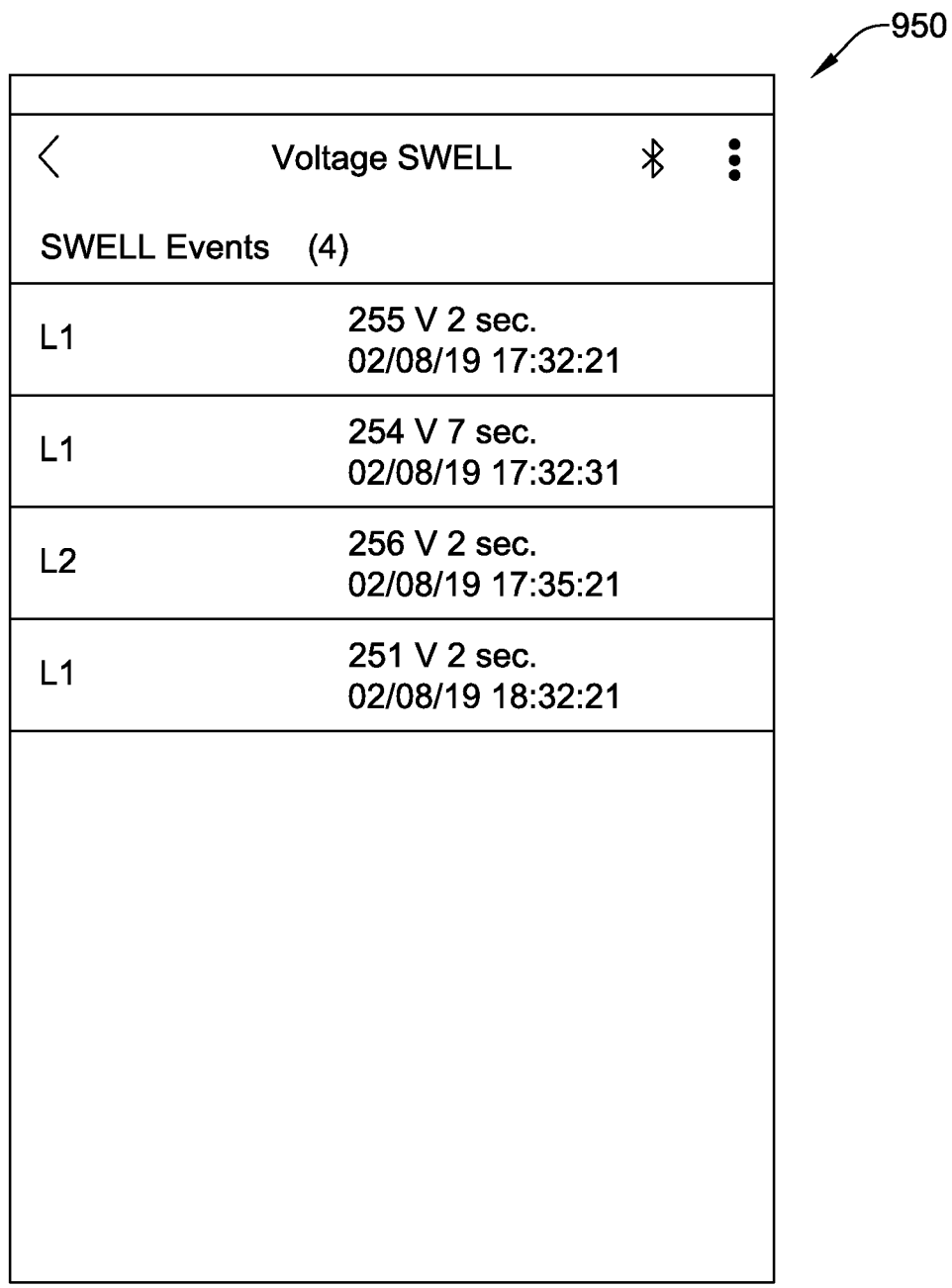

If the user selects the colored dot 916, or otherwise indicates they desire more information, the mobile device may display a screen 920 as seen in FIG. 42. The screen 920 includes an Issues menu 922 that is superimposed onto a previous screen. The Issues Menu 922 includes a listing 924 outlining each of the detected issues as well as a Got It button 926 that the user can use to acknowledge the Issues menu 922. FIG. 43 shows a screen 930 that may be displayed by the mobile device in response to the user requesting further information regarding a particular power meter. The screen 930 includes a variety of categories, including a Power Quality Dashboard 932 and a Load Dashboard 934, both of which display colored dots 916 to indicate potential problems. Selecting the Power Quality Dashboard 932 may cause the mobile device to display a screen 940 that provides more information regarding power quality. A colored dot 916 next to Voltage Swell 942 causes the mobile device to display a screen 950, shown in FIG. 45, that provides more information pertaining to voltage swell.

Figure 46:
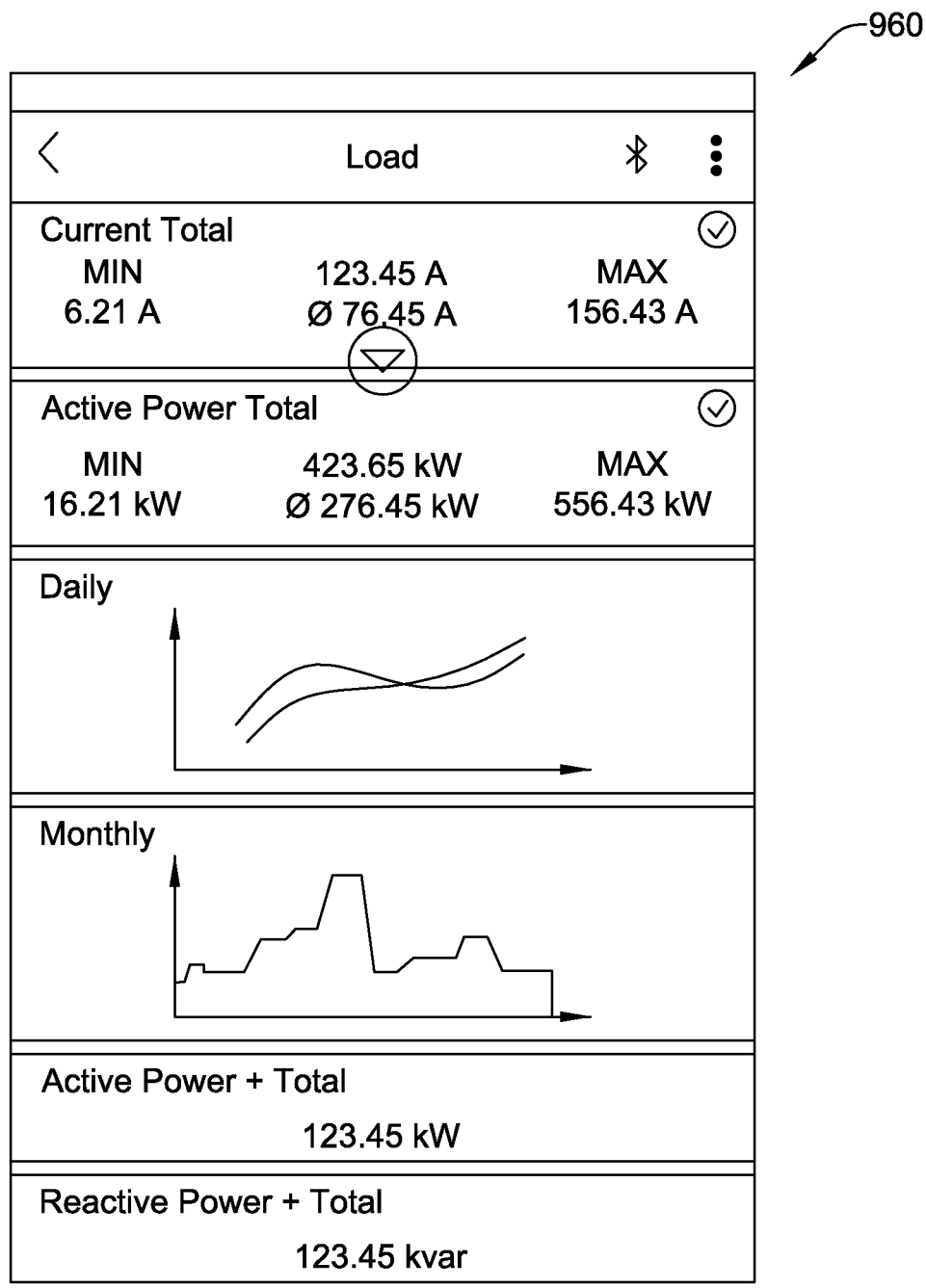
Figure 47:
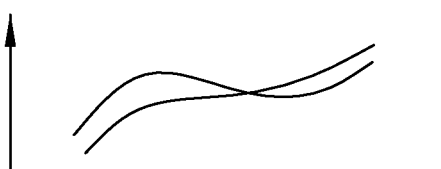

Reverting briefly to FIG. 43, if the user selects the Load Dashboard 934, the mobile device may display a screen 960 as shown in FIG. 46. The screen 960 provides additional information regarding the load that is consuming power being measured by a particular power meter. FIG. 47 shows a screen 970 that may be displayed if a user desires additional information.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. A power meter, comprising:
    a plurality of first terminals for receiving a measure of current of each of one or more phases of power that is delivered to a load;
    a plurality of second terminals for receiving a measure of voltage of each of one or more phases of power that is delivered to the load;
    a user interface that includes:
        a first region of a display including three or more lines of alphanumeric information, where each of the three or more lines of alphanumeric information of the first region include two or more alphanumeric characters with "M" elongated fixed segment display segments allocated to each of the two or more alphanumeric characters;
        a second region of the display including three or more lines of alphanumeric information, where each of the three or more lines of alphanumeric information of the second region include two or more alphanumeric characters with "N" elongated fixed segment display segments allocated to each of the two or more alphanumeric characters, and wherein M is greater than N;
        two or more buttons;
    a controller operatively coupled to the plurality of first terminals, the plurality of second terminals, and the user interface, the controller configured to determine a number of power monitor parameters based on the measure of current of each of one or more phases of power that is delivered to the load and/or the measure of voltage of each of one or more phases of power that is delivered to the load; and
    the controller further configured to provide an interactive menu including two or more menu screens displayed on the fixed segment display of the user interface, wherein one or more of the buttons is used to navigate between the two or more menu screens of the interactive menu.

2. The power meter of claim 1, wherein at least one of the buttons is used to select between two or more selections displayed on one or more of the menu screens.

3. The power meter of claim 1, wherein at least one of the buttons is used to change a value of a setting displayed on one or more of the menu screens.

4. The power meter of claim 1, wherein M is 14 and N is 7.

5. The power meter of claim 1, wherein each of the three or more lines of alphanumeric information of the first region includes less alphanumeric characters than each of the three or more lines of the second region.

6. The power meter of claim 1, wherein each of the three or more lines of alphanumeric information of the first region includes seven or less alphanumeric characters and each of the three or more lines of alphanumeric information of the second region includes eight or more alphanumeric characters.

7. The power meter of claim 1, wherein each alphanumeric character of the three or more lines of alphanumeric information of the first region is allocated "M" elongated fixed segment display segments plus a decimal point segment on the display.

8. The power meter of claim 1, wherein each alphanumeric character of the three or more lines of alphanumeric information of the second region is allocated "N" elongated fixed segment display segments plus a decimal point segment on the display.

9. The power meter of claim 1, wherein the two or more buttons are touch regions on the display.

10. The power meter of claim 1, wherein the two or more buttons are adjacent to the display.

11. The power meter of claim 1, wherein the two or more buttons comprises an up button, a down button and a set button.

12. The power meter of claim 1, wherein the user interface further includes one or more fixed segment icons at a predefined location on the display.

13. The power meter of claim 12, wherein the one or more fixed segment icons comprise one or more of:
    two or more menu selection icons spaced horizontally from one another;
    two or more measurement unit icons adjacent to each of the three or more lines of the second region;
    a selection icon adjacent to each of two or more lines of the first region; and
    an L1 icon adjacent a first one of the three or more lines of the first region, an L2 icon adjacent a second one of the three or more lines of the first region, and an L3 icon adjacent a third one of the three or more lines of the first region.

14. A power meter, comprising:
    a plurality of terminals for receiving a measure of power consumption of each of one or more phases of power that is delivered to a load;
    a controller operatively coupled to the plurality of terminals, the controller configured to determine a number of power monitor parameters based on the measure of power consumption of each of one or more phases of power that is delivered to the load;
    the controller further configured to operate an interactive menu; and
    a user interface including a fixed segment display that is configured to display the number of power monitor parameters based on the measure of power consumption of each of one or more phases of power that is delivered to the load and to enable a user to navigate the interactive menu via one or more screens displayed on the fixed segment display.

15. The power meter of claim 14, wherein the fixed segment display comprises:
    a first region that is configured for displaying two or more lines of alphanumeric information, where each of the two or more lines of alphanumeric information include two or more character positions with each character position including a plurality of elongated display segments arranged substantially horizontally and vertically, and a plurality of elongated display segments arranged at angles other than substantially horizontally and vertically; and
    a second region that is configured for displaying two or more lines of alphanumeric information, where each of the two or more lines of alphanumeric information include two or more character positions where each character position includes a plurality of elongated display segments arranged substantially horizontally and vertically but free from elongated display segments arranged at angles other than substantially horizontally and vertically.

16. The power meter of claim 14, wherein the plurality of terminals for receiving a measure of power consumption of each of one or more phases of power that is delivered to the load comprise:
    a plurality of first terminals configured to receive a line input for each of the one or more phases of power; and a plurality of second terminals configured to receive a line output for each of the one or more phases of power.

17. The power meter of claim 14, wherein the plurality of terminals for receiving a measure of power consumption of each of one or more phases of power that is delivered to the load comprise:
- a plurality of first terminals for receiving a measure of current from a current transformer operably coupled with each of one or more phases of power that is delivered to the load; and
- a plurality of second terminals for receiving a measure of voltage of each of one or more phases of power that is delivered to the load.

18. The power meter of claim 14, wherein the fixed segment display is configured to display screens dictated by the interactive menu and the user interface further includes
an UP button, a DOWN button and a SET button that a user uses to navigate the interactive menu.

19. The power meter of claim 14, wherein the fixed segment display is configured to display at least three lines of alphanumeric information, wherein each of the at least three lines of alphanumeric information include a first portion that is configured for displaying letters and numbers and a second portion that is configured for displaying numbers.

20. A non-transient computer readable medium that stores instructions that when executed by a processor of a power meter, causes the power meter to:
display an interactive menu on a fixed segment display of the power meter, wherein the interactive menu includes two or more menu screens, wherein one of the two or more menu screens provides information on energy usage sensed by the power meter, and another of the two or more menu screens is used to change settings of the power meter; and
accept input from a user via two or more buttons of the power meter to navigate the two or more menu screens of the interactive menu.

* * * * *